US008420520B2

(12) United States Patent
Lin et al.

(10) Patent No.: US 8,420,520 B2

(45) Date of Patent: Apr. 16, 2013

(54) NON-CYANIDE GOLD ELECTROPLATING FOR FINE-LINE GOLD TRACES AND GOLD PADS

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 129 days.

(21) Appl. No.: 11/750,332

(22) Filed: May 17, 2007

(65) Prior Publication Data

US 2007/0275503 A1 Nov. 29, 2007

Related U.S. Application Data

(60) Provisional application No. 60/801,067, filed on May 18, 2006.

(51) Int. Cl.
*H01L 21/44* (2006.01)
*H01L 21/4763* (2006.01)
*H01L 21/302* (2006.01)
*H01L 21/461* (2006.01)
*H01L 21/027* (2006.01)

(52) U.S. Cl.
USPC ........... 438/597; 438/622; 438/637; 438/706; 257/E21.023

(58) Field of Classification Search .................. 438/106, 438/597–599, 612–616, 618, 622, 625, 637
See application file for complete search history.

(56) References Cited

U.S. PATENT DOCUMENTS 4,435,253 A * 3/1984 Baker et al. ................... 205/248
4,618,541 A * 10/1986 Forouhi et al. ................ 428/688
4,685,998 A 8/1987 Quinn et al.
5,083,187 A 1/1992 Lamson et al.
5,226,232 A 7/1993 Boyd
5,300,735 A * 4/1994 Yokono et al. ................ 174/264
5,384,488 A 1/1995 Golshan et al.
5,468,984 A 11/1995 Efland et al.
5,500,391 A * 3/1996 Bevk et al. .................... 438/442

(Continued)

FOREIGN PATENT DOCUMENTS

TW 392250 6/2000
TW 469515 12/2001

(Continued)

OTHER PUBLICATIONS

Wang, K., Beica, R., & Brown, N. (2004). Soft gold electroplating from a non=canide bath for electronic applications. 2004 Electronics Manufacturing Technology Symposium, IEEE, 242-246.*

(Continued)

*Primary Examiner* — Charles Garber
*Assistant Examiner* — Calvin Choi
(74) *Attorney, Agent, or Firm* — Seyfarth Shaw LLP

(57) ABSTRACT

The present invention provides a method for fabricating chip package comprises the following steps: forming a photoresist layer on a metal layer over a passivation layer, an opening in the photoresist layer exposing the metal layer, wherein said forming the photoresist layer comprises exposing the photoresist layer using 1X stepper with at least two of G-line, H-line and I-line; electroplating a gold layer over the metal layer exposed by the opening with an electroplating solution containing gold and sulfite ion; removing the photoresist layer and the metal layer not under the gold layer.

33 Claims, 35 Drawing Sheets

30c
30
46
28
26
24
24a
24a
8a
12
8a
12
8
22

U.S. PATENT DOCUMENTS

| | | | | |
|---|---|---|---|---|
| 5,532,512 | A | 7/1996 | Fillion et al. | |
| 5,659,201 | A | 8/1997 | Wollesen | |
| 5,691,248 | A | 11/1997 | Cronin et al. | |
| 5,792,594 | A | 8/1998 | Brown et al. | |
| 5,801,088 | A * | 9/1998 | Gardner et al. | 438/585 |
| 5,807,787 | A * | 9/1998 | Fu et al. | 438/623 |
| 5,821,620 | A * | 10/1998 | Hong | 257/751 |
| 5,834,844 | A | 11/1998 | Akagawa et al. | |
| 5,854,513 | A | 12/1998 | Kim | |
| 5,883,435 | A | 3/1999 | Geffken et al. | |
| 5,969,424 | A | 10/1999 | Matsuki et al. | |
| 6,022,792 | A | 2/2000 | Ishii et al. | |
| 6,066,877 | A | 5/2000 | Williams et al. | |
| 6,077,726 | A | 6/2000 | Mistry et al. | |
| 6,144,100 | A | 11/2000 | Shen et al. | |
| 6,184,143 | B1 | 2/2001 | Ohashi et al. | |
| 6,187,680 | B1 | 2/2001 | Costrini et al. | |
| 6,214,641 | B1 * | 4/2001 | Akram | 438/107 |
| 6,229,221 | B1 | 5/2001 | Kloen et al. | |
| 6,300,234 | B1 | 10/2001 | Flynn et al. | |
| 6,359,328 | B1 | 3/2002 | Dubin | |
| 6,362,087 | B1 | 3/2002 | Wang et al. | |
| 6,383,916 | B1 | 5/2002 | Lin | |
| 6,410,435 | B1 | 6/2002 | Ryan | |
| 6,429,120 | B1 | 8/2002 | Ahn et al. | |
| 6,472,745 | B1 | 10/2002 | Iizuka | |
| 6,593,222 | B2 | 7/2003 | Smoak | |
| 6,605,528 | B1 * | 8/2003 | Lin et al. | 438/618 |
| 6,614,091 | B1 | 9/2003 | Downey et al. | |
| 6,639,299 | B2 | 10/2003 | Aoki | |
| 6,646,347 | B2 | 11/2003 | Mercado et al. | |
| 6,683,380 | B2 | 1/2004 | Efland et al. | |
| 6,707,124 | B2 | 3/2004 | Wachtler et al. | |
| 6,756,295 | B2 | 6/2004 | Lin et al. | |
| 6,780,748 | B2 | 8/2004 | Yamaguchi et al. | |
| 6,798,050 | B1 | 9/2004 | Homma et al. | |
| 6,800,555 | B2 | 10/2004 | Test et al. | |
| 6,844,631 | B2 | 1/2005 | Yong et al. | |
| 6,927,156 | B2 | 8/2005 | Mathew | |
| 6,943,440 | B2 | 9/2005 | Kim et al. | |
| 6,963,136 | B2 | 11/2005 | Shinozaki et al. | |
| 6,979,647 | B2 | 12/2005 | Bojkov et al. | |
| 7,239,028 | B2 | 7/2007 | Anzai | |
| 7,271,489 | B2 | 9/2007 | Lin et al. | |
| 7,420,276 | B2 | 9/2008 | Lin et al. | |
| 7,423,346 | B2 | 9/2008 | Lin et al. | |
| 7,468,545 | B2 | 12/2008 | Lin et al. | |
| 7,470,997 | B2 | 12/2008 | Lin et al. | |
| 7,473,999 | B2 | 1/2009 | Lin et al. | |
| 7,960,269 | B2 | 6/2011 | Lo et al. | |
| 8,021,976 | B2 | 9/2011 | Lee et al. | |
| 2001/0035452 | A1 | 11/2001 | Test et al. | |
| 2001/0051426 | A1 | 12/2001 | Pozder et al. | |
| 2002/0000671 | A1 | 1/2002 | Zuniga et al. | |
| 2002/0043723 | A1 | 4/2002 | Shimizu et al. | |
| 2002/0158334 | A1 | 10/2002 | Vu et al. | |
| 2003/0218246 | A1 | 11/2003 | Abe et al. | |
| 2004/0023450 | A1 | 2/2004 | Katagiri et al. | |
| 2004/0183155 | A1 * | 9/2004 | Seto et al. | 257/529 |
| 2004/0245580 | A1 | 12/2004 | Lin | |
| 2005/0017361 | A1 * | 1/2005 | Lin et al. | 257/756 |

FOREIGN PATENT DOCUMENTS

| | | |
|---|---|---|
| TW | 525223 | 3/2003 |
| TW | 578243 | 3/2004 |
| TW | 594391 | 6/2004 |
| TW | I239578 | 9/2005 |
| TW | I250598 | 3/2006 |

OTHER PUBLICATIONS

Wang, K., Beica, R., & Brown, N. (2004). Soft gold electroplating from a non-cyanide bath for electronic applications. 2004 Electronics Manufacturing Technology Symposium, IEEE, 242-246.*

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pps. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technology™—MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
English summary of foreign office action for Taiwan application No. 096117886 dated Dec. 21, 2010.

* cited by examiner 42
38b
26
24a
12
8
32
28
8a
38
26
22
42
38a
32
24a
12
28
8a
24

38b
26
12
8
32
28
8a
38
26
22
38a
32
12
28
8a 72
70
8
26
76a
70a
22
56
74
24a
12
8a
28
76
24

NON-CYANIDE GOLD ELECTROPLATING FOR FINE-LINE GOLD TRACES AND GOLD PADS

This application claims priority to U.S. provisional application No. 60/801,067, filed on May 18, 2006, which is herein incorporated by reference in its entirety.

BACKGROUND OF THE INVENTION

1. Field of the Invention

The present invention relates to a method for fabricating a package. More particularly, the present invention relates to a method for fabricating a chip package.

2. Brief Description of the Related Art

Gold electroplating technology has been widely used in microelectronics and micro systems, such as in the connection between a flat panel display and a driver chip. A driver chip can be connected to a flat panel display with a TCP (tape carrier package) or COG (Chip-On-Glass) method, which is mainly implemented with an electroplating technology for gold bumps. Thereby, the dimension of a driver chip can be greatly reduced, and the space is effectively saved. Besides, the electroplating process has the advantage of low cost. Therefore, the gold-bump electroplating technology has vitally prospered in the related fields.

In the Au-electroplating technology, the electroplating solution usually contains cyamide because of the reliability and technical maturity of cyamide-containing electroplating solutions. However, cyamide is a lethal poison. Therefore, the factory and the wastewater processing facility have to meet the required standards lest the personnel be harmed and the environment be polluted.

Anyhow, with the popularization of eco-awareness, a cyamide-free Au-electroplating solution has become an important topic.

SUMMARY OF THE INVENTION

The primary objective of the present invention is to provide a method for fabricating chip package, wherein a 1X stepper is used to expose a photoresist layer with at least two of G-line, H-line and I-line, and a gold layer is electroplated over a passivation layer with an electroplating solution containing Au and sulfite ion.

In order to reach the above objectives, a method for fabricating chip package comprises the following steps: providing a circuit structure over a semiconductor substrate and a passivation layer over the circuit structure, an opening in the passivation layer exposing a pad of the circuit structure; forming a metal layer on the pad and over the passivation layer; forming a photoresist layer on the metal layer, an opening in the photoresist layer exposing the metal layer, wherein said forming the photoresist layer comprises exposing the photoresist layer using 1X stepper with at least two of G-line, H-line and I-line; electroplating a gold layer over the metal layer exposed by the opening in the photoresist layer with an electroplating solution containing gold and sulfite ion; removing the photoresist layer and the metal layer not under the gold layer; dicing the semiconductor substrate into a plurality of chips; and packaging the chips.

To enable the objectives, technical contents, characteristics and accomplishments of the present invention, the embodiments of the present invention are to be described in detail in cooperation with the attached drawings below.

DETAILED DESCRIPTION OF THE INVENTION

Figure 1A:
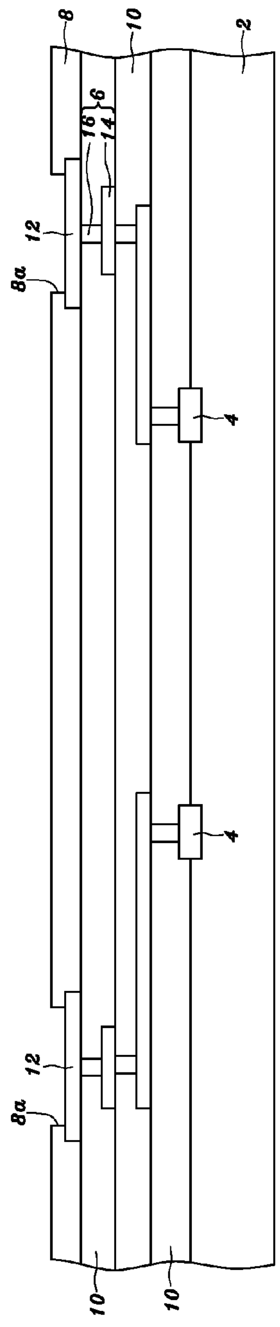
FIGS. 1A through 1G are sectional views schematically showing various semiconductor wafers according to the present invention.

Each of structures disclosed in the present invention is constructed over a semiconductor substrate or over a semiconductor wafer. After the structural construction of the polymer layer 38, 50 or 64 or of the metal bump 78 over the semiconductor substrate or over the semiconductor wafer, described in the following paragraphs, the semiconductor substrate or the semiconductor wafer is diced into a plurality of chips. Next, the chips can be packaged with a wire-bonding technology, a TAB (Tape Automated Bonding) technology or an ACF (Anisotropic Conductive Film) technology.

Referring to FIGS. 1A-1G, a semiconductor substrate or semiconductor wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

Referring to FIGS. 1A-1G, a circuit structure 6 is formed over the semiconductor substrate 2. The circuit structure 6 comprises multiple patterned metal layers 14 having a thickness of less than 3 μm and multiple metal plugs 16. For example, the patterned metal layers 14 and the metal plugs 16 are made of copper. Alternatively, the patterned metal layer 14 is made of aluminum or aluminum-alloy, and the metal plug 16 is made of tungsten. One of the patterned metal layers 14 may be formed by a damascene process including sputtering an adhesion/barrier layer, such tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers outside the opening in the insulating layer using a chemical mechanical polishing (CMP) process. Alternatively, one of the patterned metal layer 14 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Figure 1B:
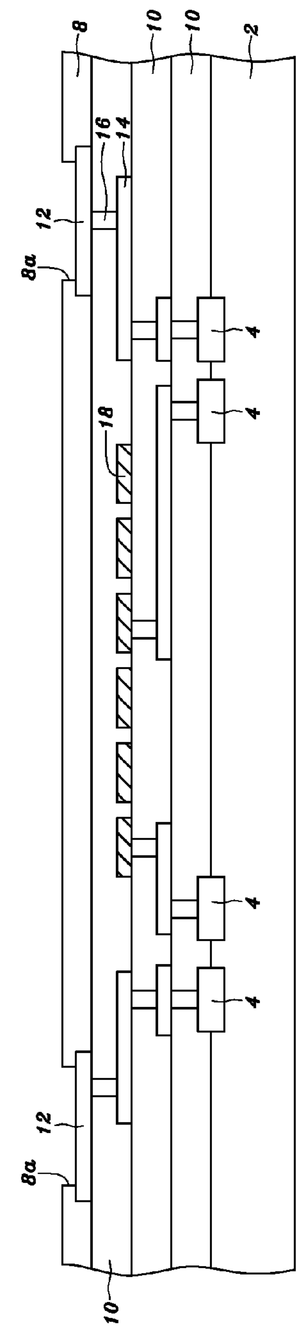
Figure 1C:
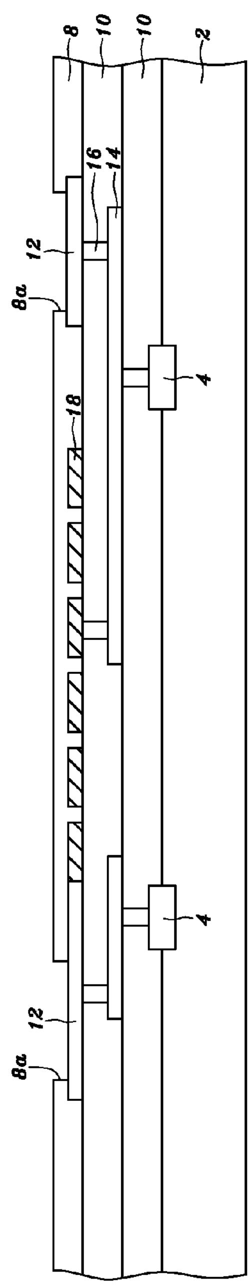
Figure 1D:
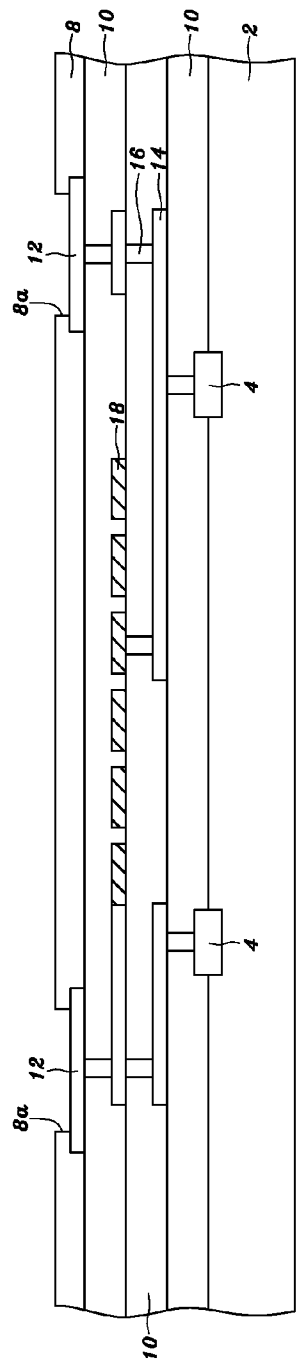

Referring to FIGS. 1B-1G, the circuit structure 6 may also comprise a coil 18. The coil 18 is made of gold, aluminum or copper and is formed with a damascene, electroplating or sputtering process. Besides, the coil 18 can be connected to at least two pads 12 via the patterned metal layers 14 of the circuit structure 6 and the metal plugs 16 of the circuit structure 6, as shown in FIGS. 1C-1D. Alternatively, the coil 18 may be connected to at least two semiconductor devices 4 via the patterned metal layers 14 of the circuit structure 6 and the metal plugs 16 of the circuit structure 6, as shown in FIGS. 1B-1D.

Figure 1E:
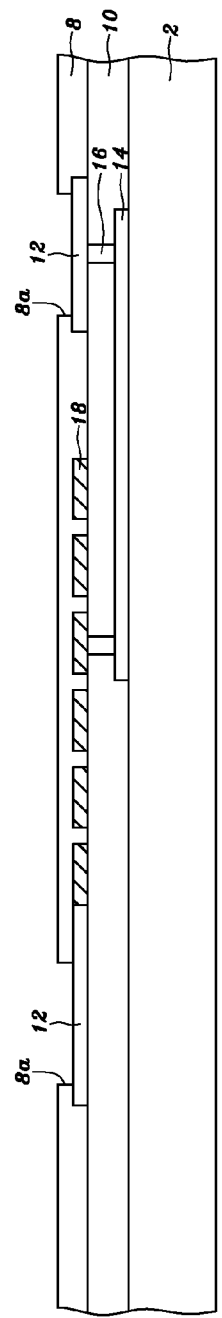
Figure 1F:
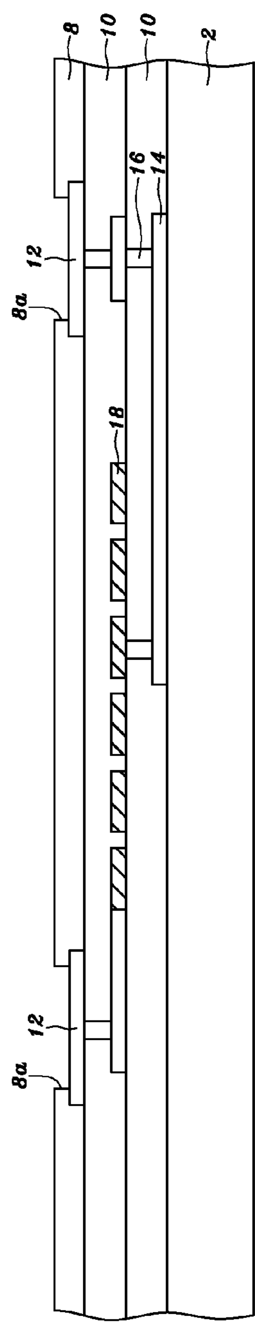

Referring to FIGS. 1E-1F, alternatively, there may be no active device in or over the semiconductor substrate 2 and under the coil 18. For example, there is no MOS device in or over the semiconductor substrate 2 and under the coil 18. The circuit structure 6 comprises the coil 18 and two contacts of the coil 18 connected respectively to two pads 12 exposed by two openings 8*a* in a passivation layer 8, via the patterned metal layers 14 and the metal plugs 16.

Referring to FIGS. 1A-1G, multiple dielectric layers 10 having a thickness of less than 3 micrometers are located over the semiconductor substrate 2 and interposed respectively between the neighboring patterned metal layers 14, and the neighboring patterned metal layers 14 are interconnected through the metal plugs 16 inside the dielectric layer 10. The dielectric layer 10 is commonly formed by a chemical vapor deposition (CVD) process. The material of the dielectric layer 10 may include silicon oxide, TEOS (Tetraethoxysilane), a compound containing silicon, carbon, oxygen and hydrogen (such as SiwCxOyHz), silicon nitride (such as $Si_3N_4$), silicon oxynitride, FSG (Fluorinated Silicate Glass), Black Diamond, SiLK, a porous silicon oxide, a porous compound containing nitrogen, oxygen and silicon, SOG (Spin-On Glass), a polyarylene ether, PBO (Polybenzoxazole), or a material having a low dielectric constant (K) of between 1.5 and 3, for example.

Referring to FIGS. 1A-1G, a passivation layer 8 is formed over the circuit structure 6 and the dielectric layers 10. The passivation layer 8 can protect the semiconductor devices 4 and the circuit structure 6 from being damaged by moisture and foreign ion contamination. In other words, Mobile ions (such as sodium ion), transition metals (such as gold, silver and copper) and impurities can be prevented from penetrating through the passivation layer 8 to the semiconductor devices 4, such as transistors, polysilicon resistor elements and polysilicon-polysilicon capacitor elements, and to the circuit structure 6.

The passivation layer 8 is commonly made of silicon oxide (such as $SiO_2$), PSG (phosphosilicate glass), silicon nitride (such as $Si_3N_4$), or silicon oxynitride. The passivation layer 8 commonly has a thickness of more than 0.35 μm. In a preferred case, the silicon nitride layer in the passivation layer 8 has a thickness of more than 0.3 μm. Ten methods for depositing the passivation layer 8 are described as below.

In a first method, the passivation layer 8 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 8 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 8 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 8 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 8 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 8 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 8 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 8 is formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 8 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 8 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

Referring to FIGS. 1A-1F, the opening 8*a* in the passivation layer 8 exposes the pad 12 of the circuit structure 6 used to input or output signals or to be connected to a power source or a ground reference. The pad 12 may be composed of sputtered aluminum or sputtered aluminum-copper alloy, or of electroplated copper having a bottom surface and side walls covered with a barrier layer, such as tantalum or tantalum nitride.

The opening 8*a* have a maximum transverse dimension of between 2 and 30 μm or between 30 and 300 μm. The shape of the opening 8*a* may be a circle, and the diameter of the circle-shaped opening 8*a* may be between 2 and 30 μm or between 30 and 300 μm. Alternatively, the shape of the opening 8*a* may be a square, and the greatest diagonal length of the square-shaped opening 8*a* may be between 2 and 30 μm or between 30 and 300 μm. Alternatively, the shape of the opening 8*a* may be a polygon, and the polygon-shaped opening 8*a* may have a greatest diagonal length of between 3 and 30 μm or between 30 and 300 μm. Alternatively, the shape of the opening 8*a* may also be a rectangle, and the rectangle-shaped opening 8*a* may have a width of between 2 and 40 μm. Further, there may be the semiconductor device 4 under the pad 12 exposed by the opening 8*a*. Alternatively, there may be none of the semiconductor device 4 under the pad 12 exposed by the opening 8*a*.

Figure 1G:
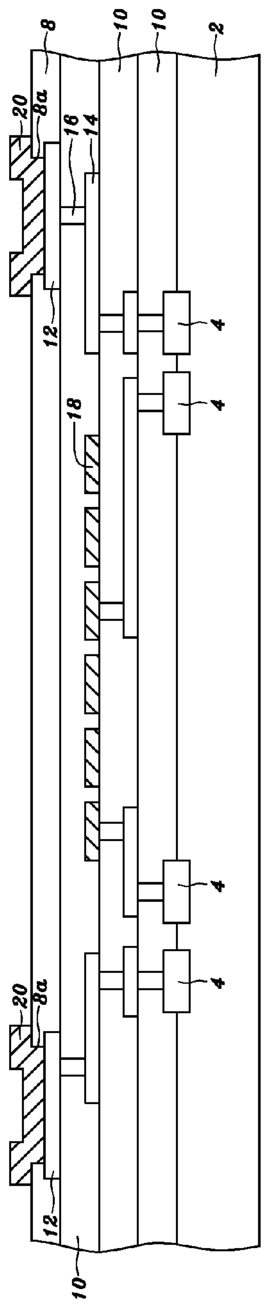

Referring to FIG. 1G, a metal cap 20 is optionally formed on the pad 12 exposed by the opening 8*a* in the passivation layer 8 to prevent the pad 12 from being oxidized or contaminated. The metal cap 20 may be an aluminum layer, an aluminum-alloy layer, a gold layer, a titanium layer, a titanium-tungsten alloy layer, a tantalum layer, a tantalum nitride layer or a nickel layer. For example, when the pad 12 is a copper pad, the metal cap 20 (such as aluminum-alloy layer) is used to protect the copper pad 12 from being oxidized. Alternatively, when the metal cap 20 may be an aluminum-alloy layer and a barrier layer between the aluminum-alloy layer and the pad 12 made of copper. The barrier layer may be made of titanium, titanium nitride, titanium-tungsten alloy, tantalum, tantalum nitride, chromium or nickel. Such a structure with the metal cap 20 may be applied to the following embodiments. Below, only the cases without the metal cap 20 are discussed.

The semiconductor substrate 2, the circuit structure 6, the dielectric layer 10, the passivation layer 8 and the pad 12 are described in the above paragraphs. Below, the element of integrated circuit 22 under the passivation layer 8 may be any of the structures shown in FIGS. 1A-1F under the passivation layer 8; the integrated circuit 22 represents the combination of the semiconductor substrate 2, the semiconductor devices 4, the circuit structure 6 (including the metal layers 14 and the metal plugs 16) and the dielectric layers 10 in FIG. 1A, or the combination of the semiconductor substrate 2, the semiconductor devices 4, the circuit structure 6 (including the metal layers 14, the metal plugs 16, and the coil 18) and the dielectric layers 10 in from FIG. 1B to FIG. 1D, or the combination of the semiconductor substrate 2, the circuit structure 6 (including the metal layer 14, the metal plug 16, and the coil 18) and the dielectric layers 10 in FIG. 1E and FIG. 1F.

Embodiment 1

Figure 2A:
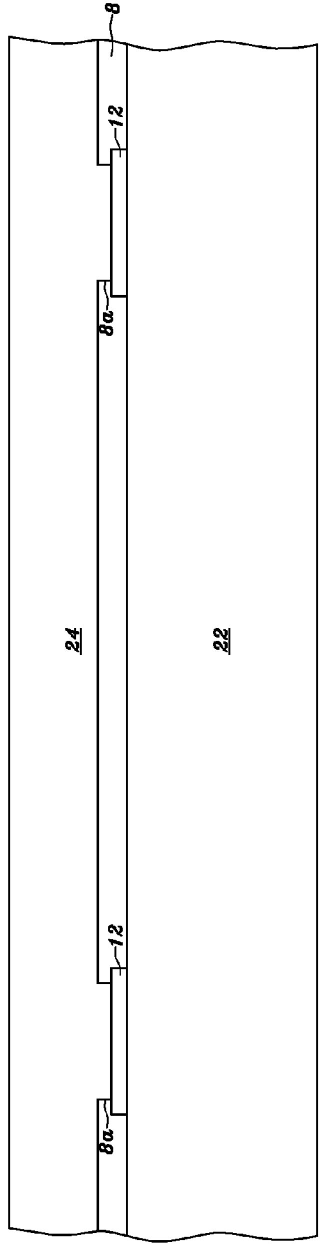
FIGS. 2A through 2M are sectional views showing a process according to one embodiment of the present invention.
Figure 2B:
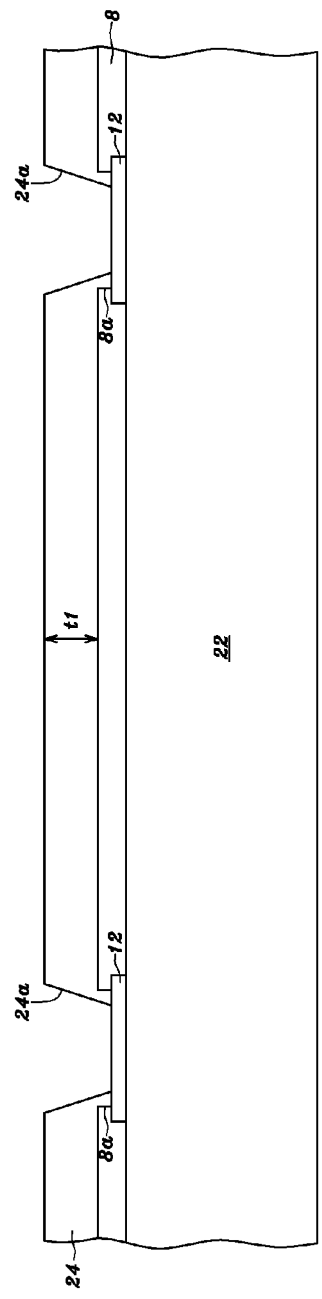
Figure 2C:
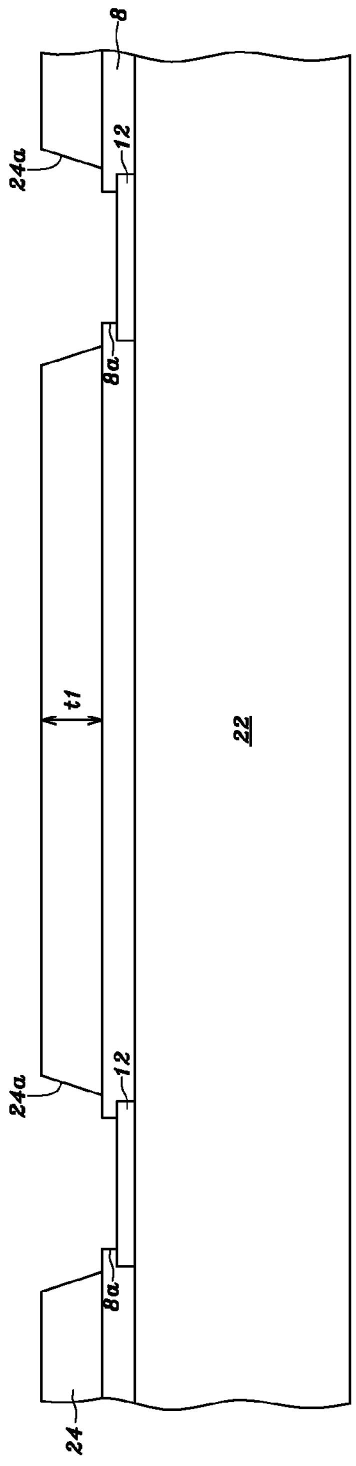

Referring to FIG. 2A, a polymer layer 24 is formed on the passivation layer 8 and two openings 24*a* are formed in the polymer layer 24 by patterning the polymer layer 24 to respectively expose two pads 12, as shown in FIG. 2B and FIG. 2C. The opening 24*a* may expose a portion of the pad 12, and another portion of the pad 12 is covered with the polymer layer 24, as shown in FIG. 2B. Alternatively, the opening 24*a* may expose the entire upper surface of the pad 12 exposed by the opening 8*a* in the passivation layer 8 and further may expose the upper surface of the passivation layer 8 near the pad 12, as shown in FIG. 2C. The descriptions of this embodiment in FIGS. 2D-2K are based on the structure with the opening 24*a* exposes a portion of the pad 12 and with another portion of the pad 12 covered by the polymer layer 24, as shown in FIG. 2B. Alternatively, the embodiments in FIGS. 2D-2K can be applied to the structure with the opening 24*a* exposes the entire upper surface of the pad 12 exposed by the opening 8*a* in the passivation layer 8 and further exposes the top surface of the passivation layer 8 in the perimeter of the pad 12, as shown in FIG. 2C.

The material of the polymer layer 24 may include polyimide (PI), benzocyclobutane (BCB), polyurethane, epoxy resin, a parylene-based polymer, a solder-mask material, an elastomer, or a porous dielectric material. The polymer layer 24 has a thickness t1 of between 2 and 30 μm. In a preferred case, the polymer layer 24 has a thickness t1 of between 3 and 12 μm.

The polymer layer 24 can be formed by a spin-on coating process, a process for thermally pressing a dry film on the passivation layer 8, or a screen-printing process. Below, the process of forming a patterned polymer layer 24 is exemplified with the case of spin-on coating a polyimide layer on the passivation layer 8 and then patterning the polyimide layer. Alternatively, the polymer layer 24 can be formed by spin-on coating a layer of benzocyclobutane, polyurethane, epoxy resin, a parylene-based polymer, a solder-mask material, an elastomer or a porous dielectric material on the passivation layer 8, and then patterning the layer.

In a first method, the polymer layer 24 can be formed by spin-on coating a positive-type photosensitive polyimide layer having a thickness of between 4 and 60 μm, and preferably of between 6 and 24 μm, on the passivation layer 8, then baking the spin-on coated polyimide layer, then exposing the baked polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the pads 12 with an $O_2$ plasma or a plasma containing fluorine of below 200 PPM and oxygen, such that the polyimide layer can be patterned with at least two openings in the polyimide layer exposing two pads 12, respectively.

In a second method, the polymer layer 24 can be formed by spin-on coating a first positive-type polyimide layer with photosensitivity having a thickness of between 4 and 60 μm, and preferably of between 6 and 24 μm, on the passivation layer 8, then baking the spin-on coated first polyimide layer, then exposing the baked first polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the pads 12 with an $O_2$ plasma or a plasma containing fluorine of below 200 PPM and oxygen, such that the first polyimide layer can be patterned with at least two first openings in the first polyimide layer exposing two pads 12, respectively, then spin-on coating a second positive-type polyimide layer with photosensitivity having a thickness of between 4 and 60 μm, and preferably of between 6 and 24 μm, on the first polyimide layer and on the pads 12, then baking the spin-on coated second polyimide layer, then exposing the baked second polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked second polyimide layer, that is, G-line and H-line, G-line and I-line, H-line and I-line, or G-line, H-line and I-line illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the pads 12 with an $O_2$ plasma or a plasma containing fluorine of below 200 PPM and oxygen, such that the second polyimide layer can be patterned with at least two second openings in the second polyimide layer exposing two pads 12, respectively. Alternatively, to lead the polymer layer 24 with a relatively great thickness, forming the polymer layer 24 may further comprise forming one or more other polyimide layers on the second polyimide layer, following the steps of forming the first or second polyimide layer. The step of removing the residual polymeric material or other contaminants on the upper surface of the pads 12 with an $O_2$ plasma or a plasma containing fluorine of below 200 PPM and oxygen can be only performed after the topmost polyimide layer of the polymer layer 24 has been cured.

Figure 2D:
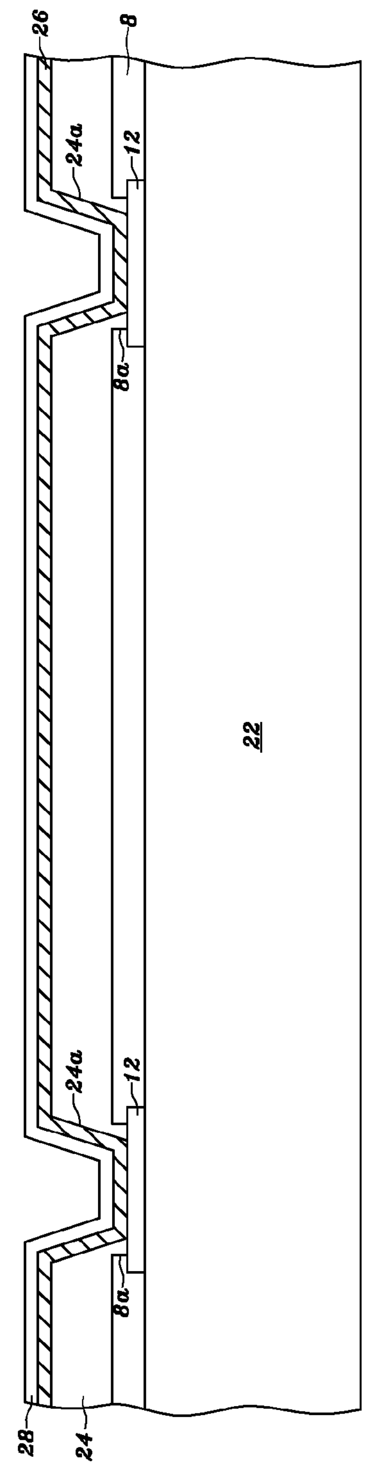

Referring to FIG. 2D, an adhesion/barrier layer 26 having a thickness of between 2,000 and 5,000 angstroms, and preferably between 2,500 and 3,500 angstroms, is formed on the polymer layer 24 and on the pads 12 exposed by the openings 24*a*. The material of the adhesion/barrier layer 26 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the abovementioned materials. The adhesion/barrier layer 26 may be formed by a sputtering method or a vapor deposition method.

Next, a seed layer 28 having a thickness of 500 and 2,000 angstroms, and preferably between 750 and 1,500 angstroms, is formed on the adhesion/barrier layer 26. The seed layer 28 may be formed by a sputtering method, a vapor deposition method, an electroless plating method or a PVD (Physical Vapor Deposition) method. The seed layer 28 is beneficial to electroplating a metal layer thereon. Thus, the material of the seed layer 28 varies with the material of the electroplated metal layer formed on the seed layer 28. When a gold layer is to be electroplated on the seed layer 28, gold is a preferable material to the seed layer 28.

For example, when the adhesion/barrier layer 26 is formed by sputtering a titanium-containing layer with a thickness of between 2,000 and 5,000 angstroms, and preferably between 2,500 and 3,500 angstroms, the seed layer 28 can be formed by sputtering a gold layer with a thickness of between 500 and 2,000 angstroms, and preferably between 750 and 1,500 angstroms, on the titanium-containing layer. When the adhesion/barrier layer 26 is formed by sputtering a titanium layer with a thickness of between 2,000 and 5,000 angstroms, and preferably between 2,500 and 3,500 angstroms, the seed layer 28 can be formed by sputtering a gold layer with a thickness of between 500 and 2,000 angstroms, and preferably between 750 and 1,500 angstroms, on the titanium layer. When the adhesion/barrier layer 26 is formed by sputtering a layer of titanium-tungsten alloy with a thickness of between 2,000 and 5,000 angstroms, and preferably between 2,500 and 3,500 angstroms, the seed layer 28 can be formed by sputtering a gold layer with a thickness of between 500 and 2,000 angstroms, and preferably between 750 and 1,500 angstroms, on the layer of titanium-tungsten alloy.

Figure 2E:
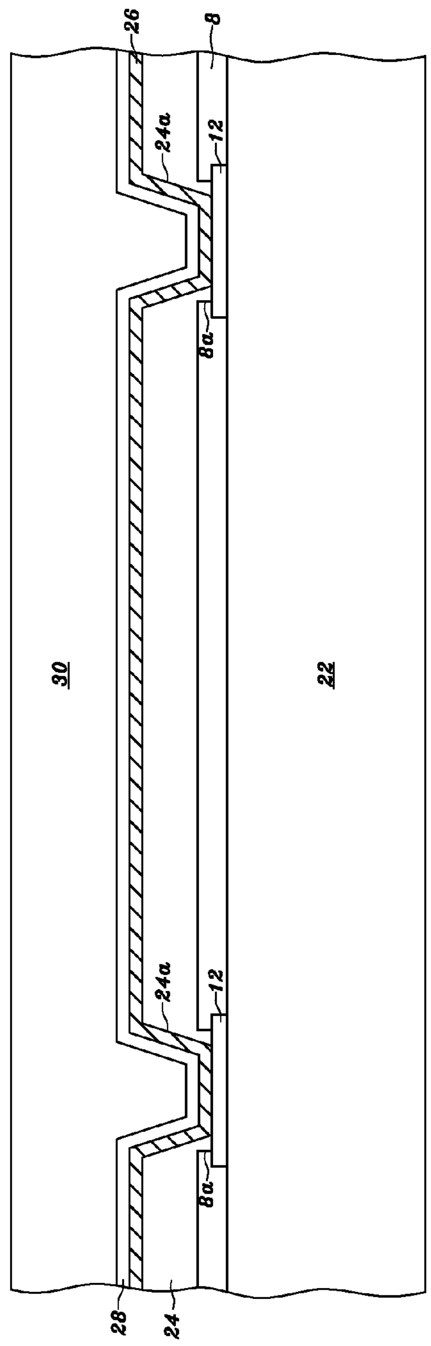
Figure 2F:
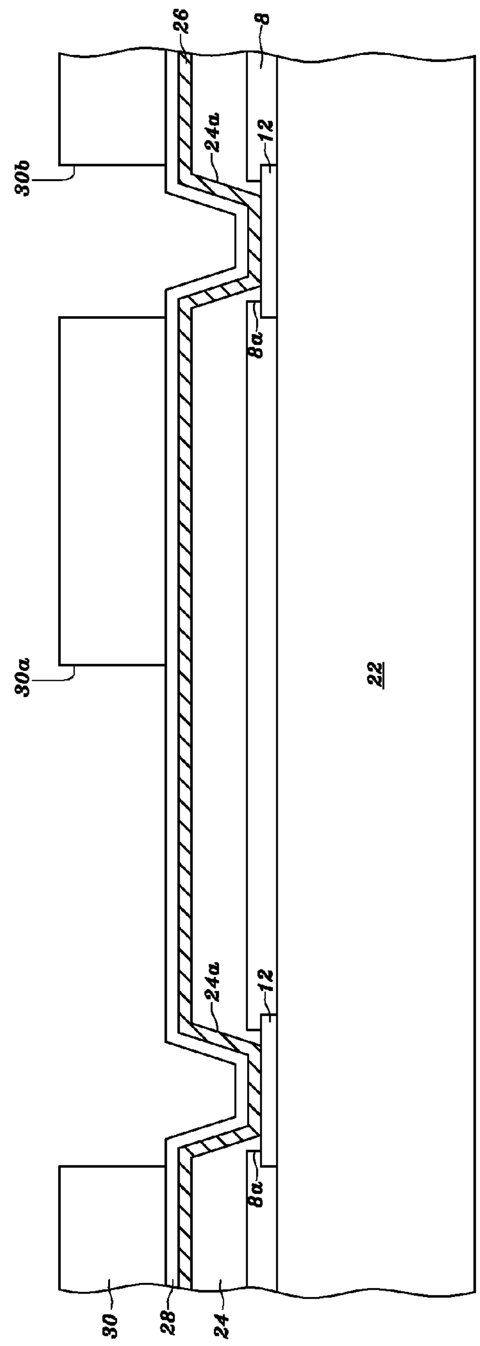

Referring to FIG. 2E, a photoresist layer 30 having a thickness of between 5 and 30 μm, and preferably between 7 and 15 μm, is formed on the seed layer 28. Referring to FIG. 2F, the photoresist layer 30 is patterned with the processes of exposure, development, etc., to form multiple openings 30*a* and 30*b* in the photoresist layer 30 exposing the seed layer 28 over the pads 12 and over the passivation layer 8. Alternatively, an opening having a coil shape may be formed in the photoresist layer 30 to expose the seed layer 28 to form a coil in the opening in the following steps.

The photoresist layer 30 can be formed by spin-on coating a positive-type photosensitive polymer layer having a thickness of between 5 and 30 μm, and preferably of between 7 and 15 μm, on the seed layer 28, then exposing the photosensitive polymer layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 28 with an $O_2$ plasma or a plasma containing fluorine of below 200 PPM and oxygen, such that the photoresist layer 30 can be patterned with at least two openings 30*a* and 30*b* in the photoresist layer 30 exposing the seed layer 28.

Figure 2G:
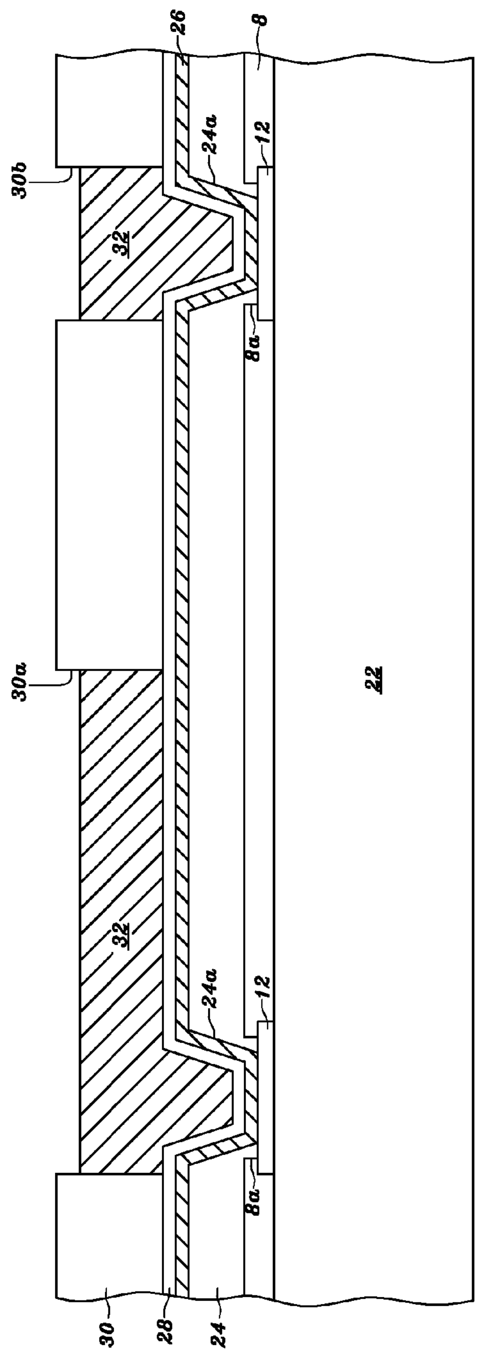

Referring to FIG. 2G, a gold layer 32 having a thickness of between 3 and 18 μm, and preferably between 3 and 8 μm, is electroplated on the seed layer 28 (such as a gold layer) exposed by the openings 30*a* and 30*b* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold layer 32 are described below:

1. The above-mentioned electroplating solution can be at a temperature of between 30 and 70° C., and preferably between 45 and 65° C., to electroplate the gold layer 32 on the seed layer 28 exposed by the openings 30*a* and 30*b*.
2. The above-mentioned electroplating solution can be used to electroplate the gold layer 32 on the seed layer 28 exposed by the openings 30*a* and 30*b* through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold layer 32 on the seed layer 28 exposed by the openings 30*a* and 30*b*.

Thereby, the gold layer 32 can be electroplated in a short time with an enough thickness of between 3 and 18 μm, and preferably between 3 and 8 μm, for example, on the seed layer 28 made of gold that has been formed on the adhesion/barrier layer 26 made of titanium or titanium-tungsten alloy.

Figure 2H:
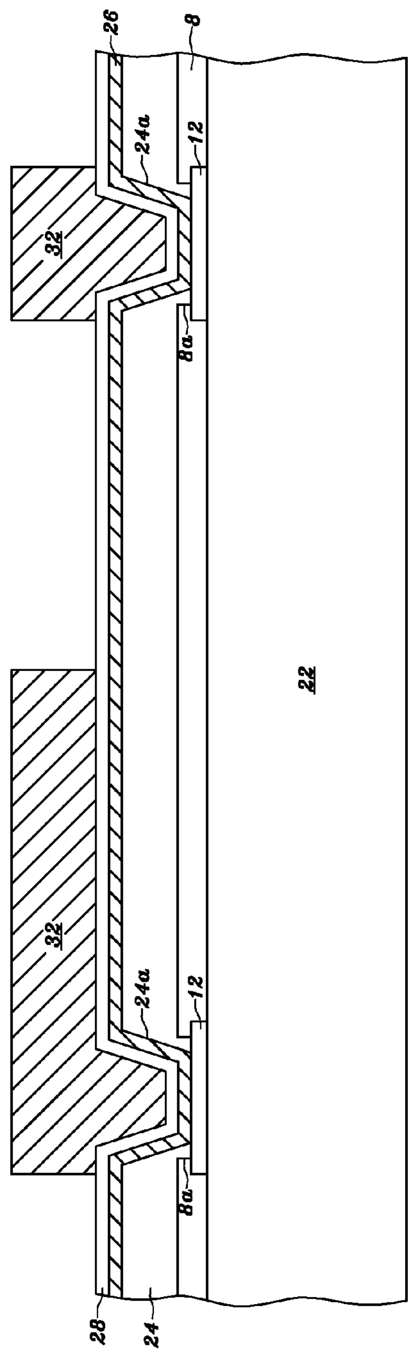

Referring to FIG. 2H, after the gold layer 32 is formed, most of the photoresist layer 30 can be removed using an organic solution with amide. However, some residuals from the photoresist layer 30 could remain on the gold layer 32 and on the seed layer 28. Thereafter, the residuals can be removed from the gold layer 32 and the seed layer 28 with a plasma, such as an $O_2$ plasma or a plasma containing fluorine of below 200 PPM and oxygen.

Figure 2I:
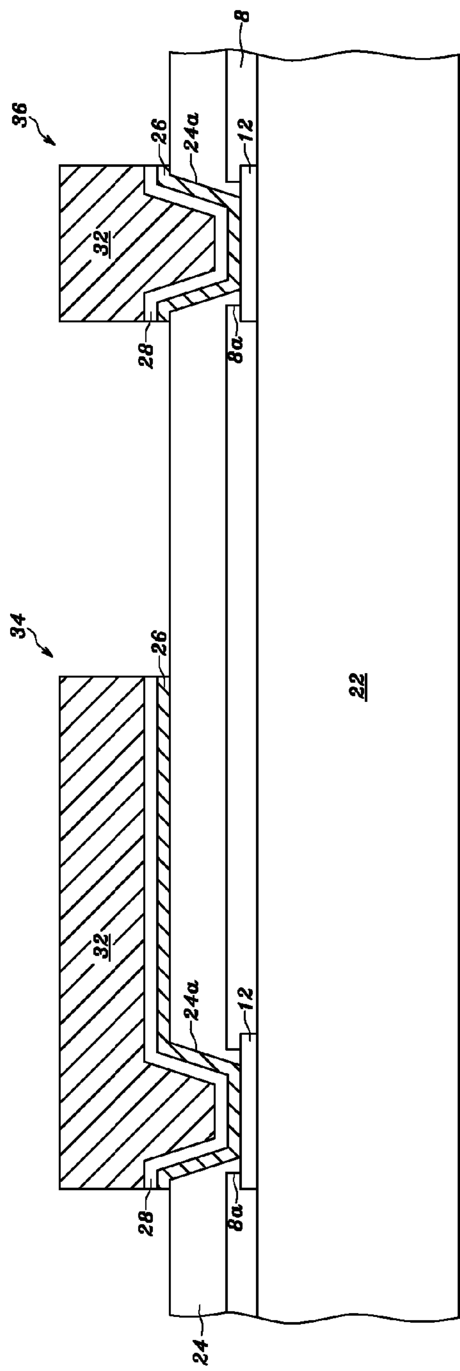

Thereafter, referring to FIG. 2I, the seed layer 28 and the adhesion/barrier layer 26 not under the gold layer 32 are removed. For example, the seed layer 28 and the adhesion/barrier layer 26 not under the gold layer 32 are removed with a dry etching method or a wet etching method. As to the wet etching methods, when the adhesion/barrier layer 26 is a titanium-tungsten alloy layer, it can be etched with a solution containing hydrogen peroxide; when the adhesion/barrier layer 26 is a titanium layer, it can be etched with a solution containing hydrogen fluoride; when the seed layer 28 is a gold layer, it can be etched with an iodine-containing solution, such as a solution containing potassium iodide. As to the dry etching methods, when the adhesion/barrier layer 26 is a titanium layer or a titanium-tungsten alloy layer, it can be etched with a chlorine-containing plasma etching process; when the seed layer is a gold layer, it can be removed with an argon sputter process. Generally, the dry etching method to etch the seed layer 28 and the adhesion/barrier layer 26 not under the gold layer 32 may include a chemical plasma etching process, a sputtering etching process, such as an argon sputter process, or a chemical vapor etching process.

Thereby, in the present invention, at least one metal trace 34 can be formed on the polymer layer 24 and on the pad 12. Alternatively, at least one metal pad 36 can be formed on the pad 12. Either of the metal trace 34 and the metal pad 36 can be formed of the adhesion/barrier layer 26, the seed layer 28 on the adhesion/barrier layer 26 and the electroplated gold layer 32 on the seed layer 28. Besides, the metal trace 34 may be a RDL (Re-Distribution Layer). Alternatively, the metal trace 34 may comprises a coil serving as an inductor.

Besides, the pitch between the neighboring metal traces 34 may be greater than 3 microns or may range from 3 microns to 500 microns, from 3 microns to 200 microns, from 3 microns to 100 microns, from 3 microns to 50 microns, from 3 microns to 20 microns or from 3 microns to 10 microns. The metal trace 34 may have a width of between 1 micron and 500 microns, of between 1 micron and 200 microns, of between 1 micron and 100 microns, of between 1 micron and 50 microns, of between 1 micron and 20 microns or of between 1 micron and 10 microns, and preferably of between 2 microns and 20 microns. The spacing between the neighboring metal traces 34 may be greater than 1 micron or may range from 1 micron to 500 microns, from 1 micron to 200 microns, from 1 micron to 100 microns, from 1 micron to 50 microns, from 1 micron to 20 microns or from 1 micron to 10 microns, and preferably from between 2 microns to 20 microns.

Figure 2J:
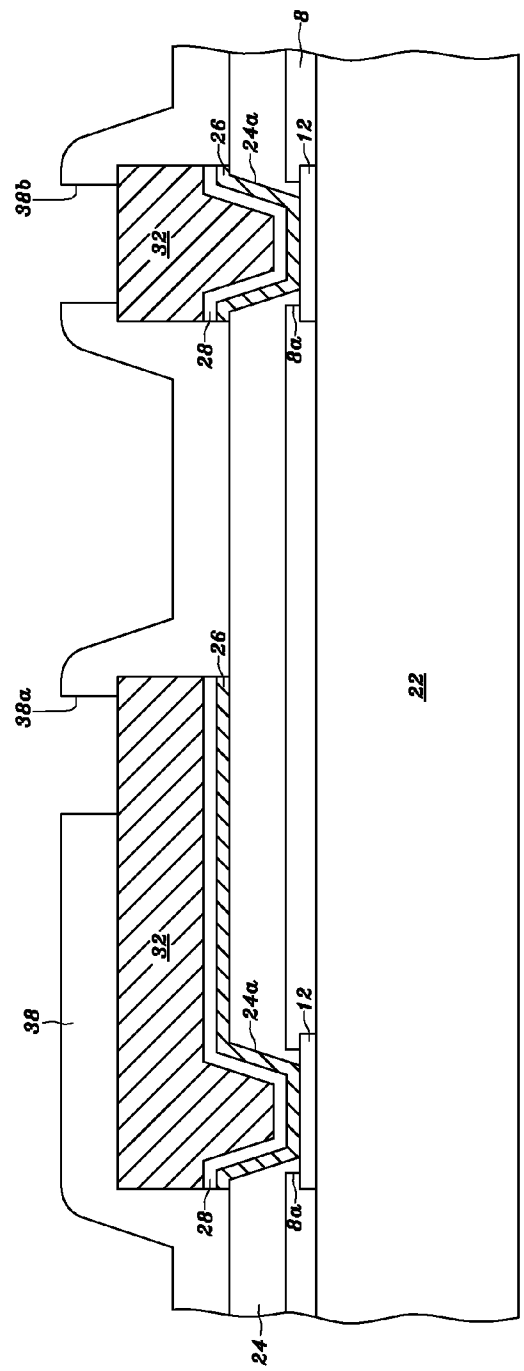

Referring to FIG. 2J, after the seed layer 28 and the adhesion/barrier layer 26 not under the gold layer 32 is removed, a polymer layer 38 is optionally formed on the gold layer 32 and on the polymer layer 24, and multiple openings 38*a* and 38*b* in the polymer layer 38 expose the gold layer 32 of the metal trace 34 and the gold layer 32 of the metal pad 36, respectively. The material of the polymer layer 38 may include polyimide, benzocyclobutane, polyurethane, epoxy resin, a parylene-based polymer, a solder-mask material, an elastomer, or a porous dielectric material. The polymer layer 38 has a thickness of between 2 and 30 μm. In a preferred case, the polymer layer 38 has a thickness of between 3 and 12 μm.

The polymer layer 38 can be formed via a spin-on coating process, a process for thermally pressing a dry film, or a screen-printing process. Below, the process of forming a patterned polymer layer 38 is exemplified with the case of spin-on coating a polyimide layer on the polymer layer 24 and on the gold layer 32, and then patterning the polyimide layer. Alternatively, the polymer layer 38 can be formed by spin-on coating a layer of benzocyclobutane, polyurethane, epoxy resin, a parylene-based polymer, a solder-mask material, an elastomer or a porous dielectric material, and then patterning the layer.

In a first method, the polymer layer 38 can be formed by spin-on coating a positive-type photosensitive polyimide layer having a thickness of between 4 and 60 μm, and preferably of between 6 and 24 μm, on the polymer layer 24 and on the gold layer 32, then baking the spin-on coated polyimide layer, then exposing the baked polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the gold layer 32 with an $O_2$ plasma or a plasma containing fluorine of below 200 PPM and oxygen, such that the polyimide layer can be patterned with at least two openings in the polyimide layer exposing the gold layer 32 of metal trace 34 and the gold layer 32 of the metal pad 36, respectively.

In a second method, the polymer layer 38 can be formed by spin-on coating a first positive-type polyimide layer with photosensitivity having a thickness of between 4 and 60 μm, and preferably of between 6 and 24 μm, on the polymer layer 24 and on the gold layer 32, then baking the spin-on coated first polyimide layer, then exposing the baked first polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the gold layer 32 with an $O_2$ plasma or a plasma containing fluorine of below 200 PPM and oxygen, such that the first polyimide layer can be patterned with at least two first openings in the first polyimide layer exposing the gold layer 32 of metal trace 34 and the gold layer 32 of the metal pad 36, respectively, then spin-on coating a second positive-type polyimide layer with photosensitivity having a thickness of between 4 and 60 μm, and preferably of between 6 and 24 μm, on the first polyimide layer and on the gold layer 32 exposed by the first openings in the first polyimide layer, then baking the spin-on coated second polyimide layer, then exposing the baked second polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked second polyimide layer, that is, G-line and H-line, G-line and I-line, H-line and I-line, or G-line, H-line and I-line illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the gold layer 32 with an $O_2$ plasma or a plasma containing fluorine of below 200 PPM and oxygen, such that the second polyimide layer can be patterned with at least two second openings in the second polyimide layer exposing the gold layer 32 of the metal trace 34 and the gold layer 32 of the metal pad 36, respectively. Alternatively, to lead the polymer layer 38 with a relatively great thickness, forming the polymer layer 38 may further comprise forming one or more other polyimide layers on the second polyimide layer, following the steps of forming the first or second polyimide layer. The step of removing the residual polymeric material or other contaminants on the upper surface of the gold layer 32 with an $O_2$ plasma or a plasma containing fluorine of below 200 PPM and oxygen can be only performed after the topmost polyimide layer of the polymer layer 38 has been cured.

Besides, from a top perspective view, the position of the gold layer 32 of the metal trace 34 exposed by the opening 38*a* is different from that of the pad 12 the metal trace 34 is connected to.

Below, the description is based on the case that the polymer layer 38 has been formed on the gold layer 32 and the polymer layer 24. Alternatively, there may be no polymer layer 38 on the gold layer 32 and the polymer layer 24.

Figure 2K:
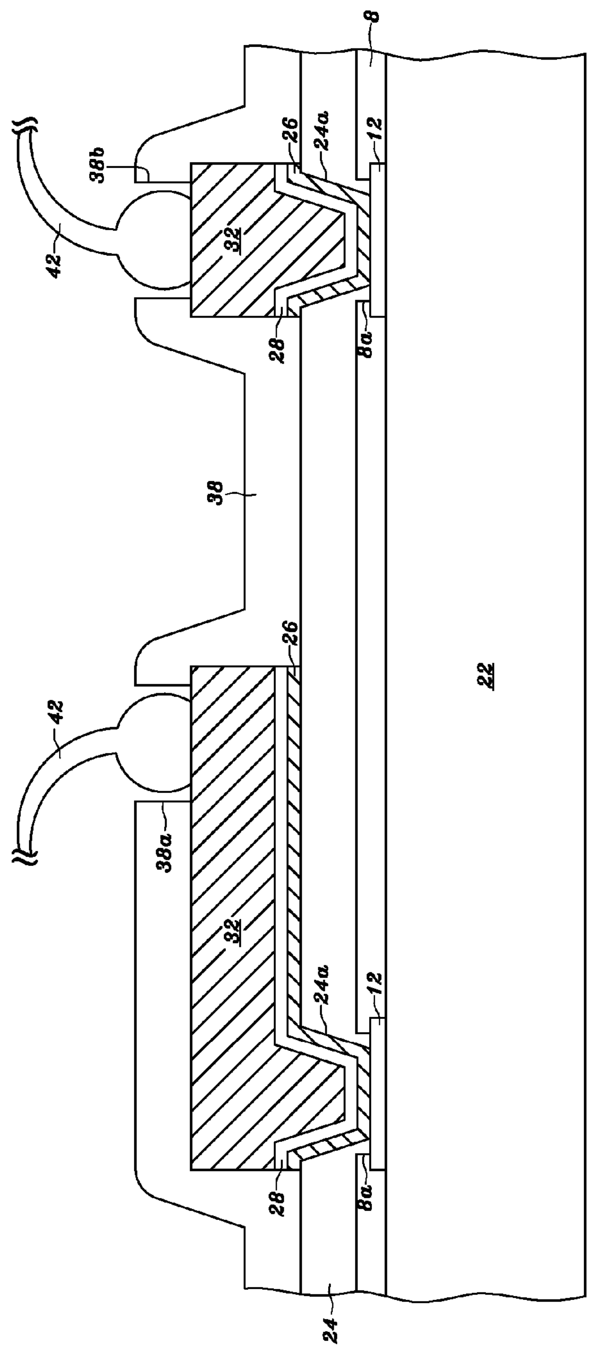

After the above-mentioned processes have been completed, the semiconductor substrate 2 can be diced into a plurality of individual semiconductor chips. Referring to FIG. 2K, in this embodiment, via a wire-bonding process, one end of a wire 42 (made of gold, copper or aluminum) can be ball bonded with the gold layer 32 of the metal trace 34 exposed by the opening 38*a* of a chip or with the gold layer 32 of the metal pad 36 exposed by the opening 38*b* of a chip. The other end of the wire 42 can be wedge bonded with an aluminum layer provided by a pad of another semiconductor chip, a pad over another semiconductor substrate, or a pad over a silicon substrate. Alternatively, the other end of the wire 42 can be wedge bonded with a gold layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 42 can be wedge bonded with a copper layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 42 can be bonded with an inner lead (made of copper) of a lead frame.

In the present invention, the strength of bonding the wire 42 to the gold layer 32 of the metal trace 34 exposed by the opening 38*a* of a chip or to the gold layer 32 of the metal pad 36 exposed by the opening 38*b* of a chip may ranges from 100 to 1000 mN, from 200 to 1000 mN, or from 200 to 500 mN. After the wire-bonding process shown in FIG. 2K is completed, a polymeric material, such as epoxy or polyimide, can be formed to cover the wire 42.

Figure 2L:
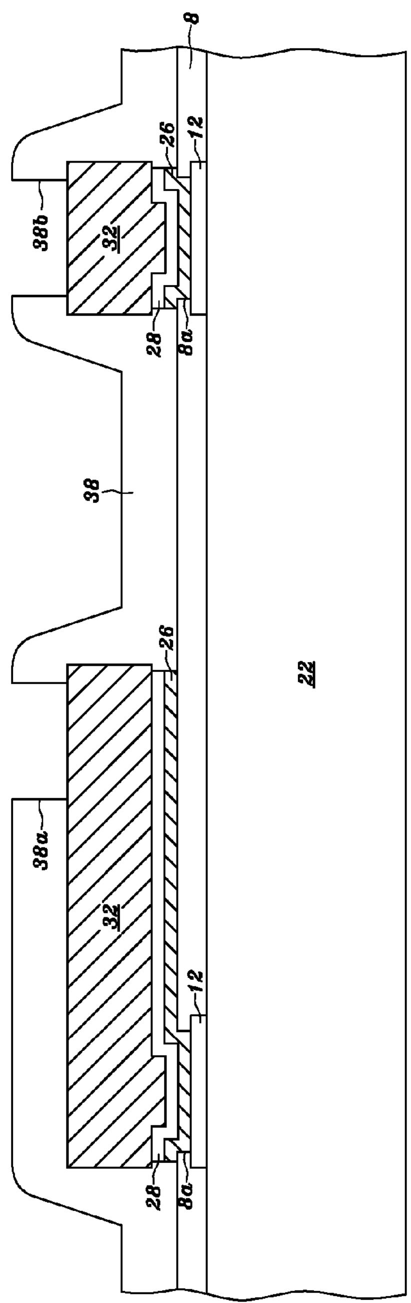
Figure 2M:
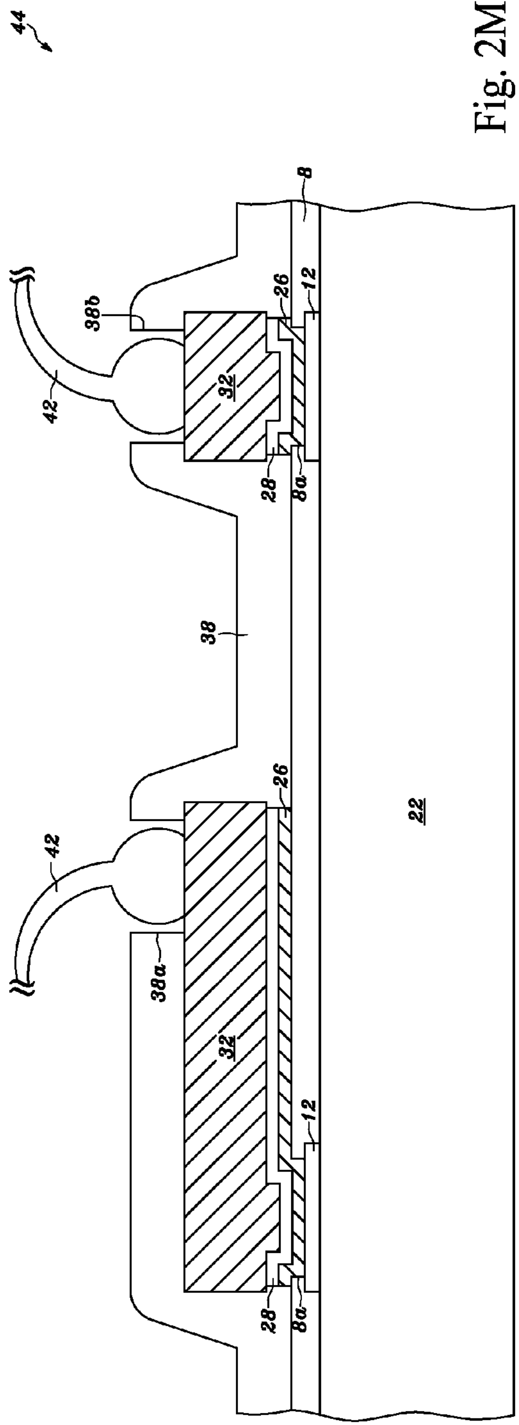

Referring to FIG. 2L, in the present invention, the step of forming the polymer layer 24 on the passivation layer 8, as shown in FIGS. 2A and 2B or in FIGS. 2A and 2C, can be omitted, that is, the adhesion/barrier layer 26 having a thickness of between 2,000 and 5,000 Å, and preferably between 2,500 and 3,500 Å, can be directly formed on the passivation layer 8 and on the pads 12, and then the seed layer 28 can be sputtered on the adhesion layer 26, followed by the above-mentioned steps as shown in FIGS. 2E-2J. The steps of forming the adhesion/barrier layer 26 and the seed layer 28 can be referred to the above description concerning FIG. 2D. Referring to FIG. 2M, the semiconductor substrate 2 can be diced into a plurality of individual semiconductor chips 44. Via a wire-bonding process, one end of the wire 42 (made of gold, copper or aluminum) can be bonded with the gold layer 32 of the metal trace 34 exposed by the opening 38*a* of the chip 44 or the gold layer 32 of the metal pad 36 exposed by the opening 38*b* of the chip 44. The other end of the wire 42 can be bonded with a pad of a printed circuit board, a pad of a ball grid array (BGA) substrate, or with an inner lead of a lead frame, which can be referred as to the foregoing description of FIG. 2K.

Embodiment 2

Figure 3A:
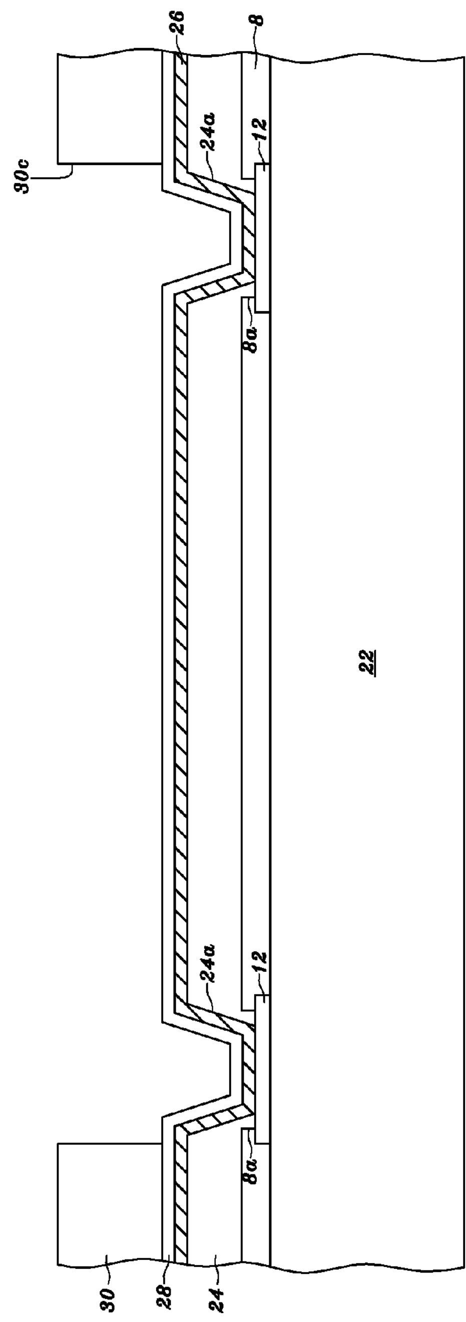
FIGS. 3A through 3I are sectional views showing a process according to one embodiment of the present invention.

Referring to FIG. 3A, after the step shown in FIG. 2E is completed, the photoresist layer 30 is patterned with the processes of exposure, development, etc., to form an opening 30*c* in the photoresist layer 30 exposing the seed layer 28 over the pads 12 and over the passivation layer 8.

The photoresist layer 30 can be formed by spin-on coating a positive-type photosensitive polymer layer having a thickness of between 5 and 30 μm, and preferably of between 7 and 15 μm, on the seed layer 28, then exposing the photosensitive polymer layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 28 with an $O_2$ plasma or a plasma containing fluorine of below 200 PPM and oxygen, such that the photoresist layer 30 can be patterned with the opening 30*c* in the photoresist layer 30 exposing the seed layer 28.

Figure 3B:
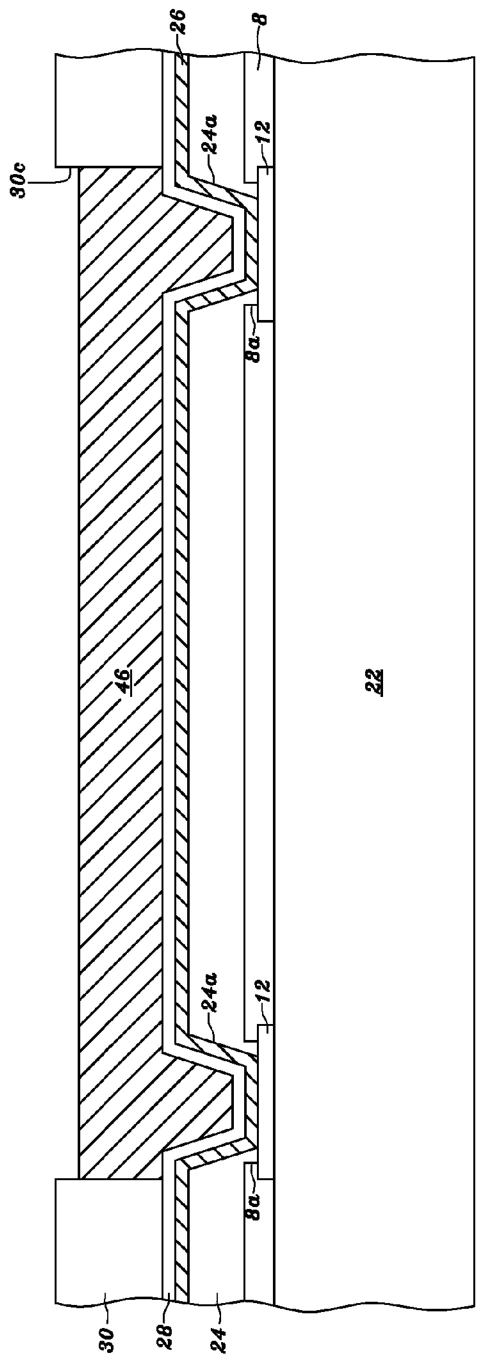

Referring to FIG. 3B, a gold layer 46 having a thickness of between 3 and 18 μm, and preferably between 3 and 8 μm, is electroplated on the seed layer 28 (such as a gold layer) exposed by the opening 30*c* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold layer 46 are described below:

1. The above-mentioned electroplating solution can be at a temperature of between 30 and 70° C., and preferably between 45 and 65° C., to electroplate the gold layer 46 on the seed layer 28 exposed by the opening 30*c*.
2. The above-mentioned electroplating solution can be used to electroplate the gold layer 46 on the seed layer 28 exposed by the opening 30*c* through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold layer 46 on the seed layer 28 exposed by the opening 30*c*.

Thereby, the gold layer 46 can be electroplated in a short time with an enough thickness of between 3 and 18 μm, and preferably between 3 and 8 μm, for example, on the seed layer 28 made of gold that has been formed on the adhesion/barrier layer 26 made of titanium or titanium-tungsten alloy.

Figure 3C:
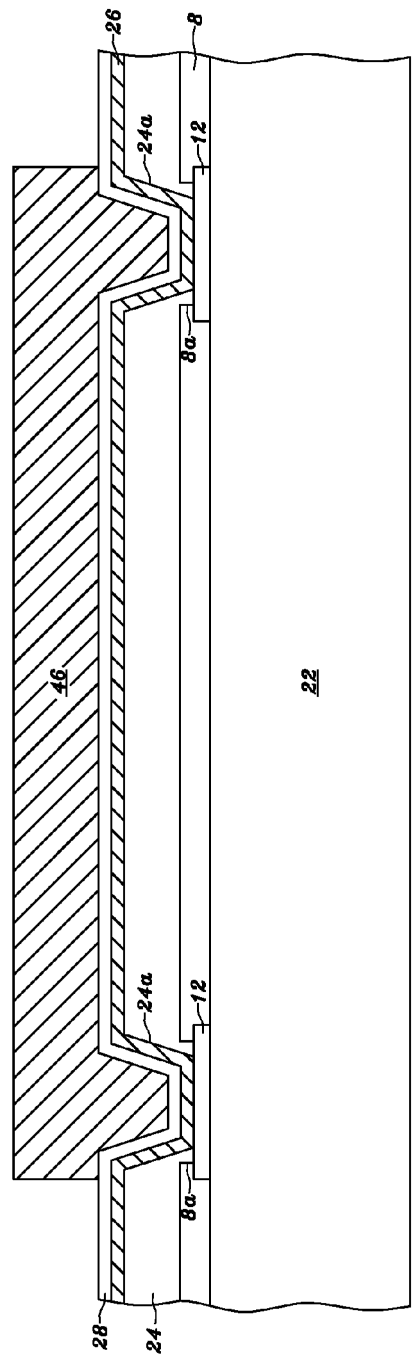

Referring to FIG. 3C, after the gold layer 46 is formed, most of the photoresist layer 30 can be removed using an organic solution with amide. However, some residuals from the photoresist layer 30 could remain on the gold layer 46 and on the seed layer 28. Thereafter, the residuals can be removed from the gold layer 46 and the seed layer 28 with a plasma, such as an $O_2$ plasma or a plasma containing fluorine of below 200 PPM and oxygen.

Figure 3D:
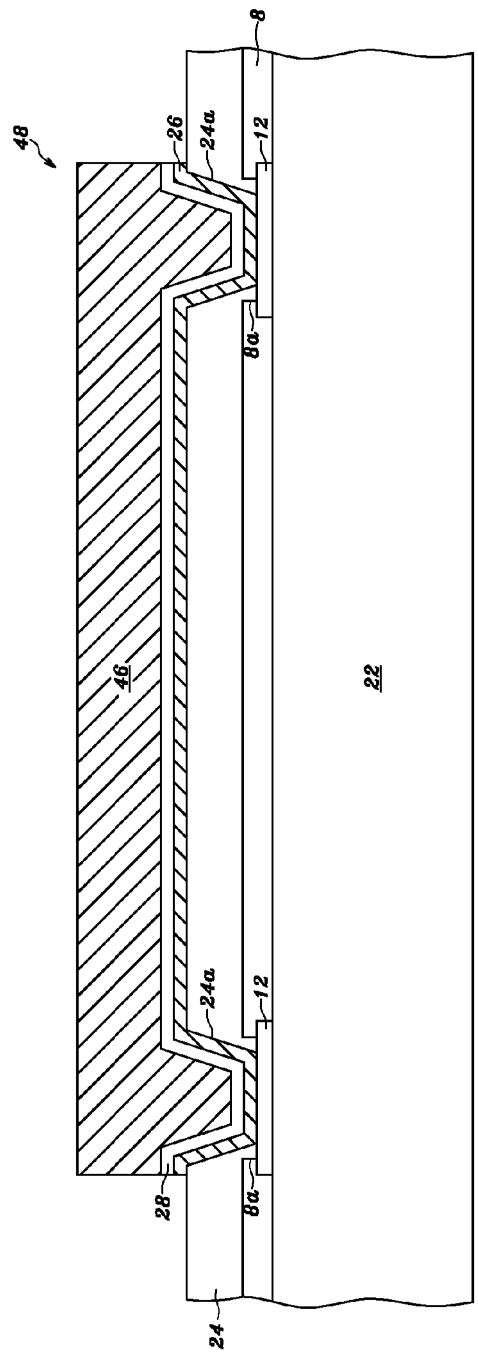

Thereafter, referring to FIG. 3D, the seed layer 28 and the adhesion/barrier layer 26 not under the gold layer 46 are removed. The steps of removing the adhesion/barrier layer 26 and the seed layer 28 not under the gold layer 46 can be referred to the above description concerning FIG. 2I.

Thereby, in the present invention, at least one interconnecting metal trace 48 can be formed on the polymer layer 24 and on the pads 12, connecting the pads 12. The interconnecting metal trace 48 can be formed of the adhesion/barrier layer 26, the seed layer 28 on the adhesion/barrier layer 26 and the electroplated gold layer 46 on the seed layer 28.

Besides, the pitch between the neighboring metal interconnection traces 48 may be greater than 3 microns or may range from 3 microns to 500 microns, from 3 microns to 200 microns, from 3 microns to 100 microns, from 3 microns to 50 microns, from 3 microns to 20 microns or from 3 microns to 10 microns. The interconnecting metal trace 48 may have a width of between 1 micron and 500 microns, of between 1 micron and 200 microns, of between 1 micron and 100 microns, of between 1 micron and 50 microns, of between 1 micron and 20 microns or of between 1 micron and 10 microns, and preferably of between 2 microns and 20 microns. The spacing between the neighboring metal interconnection traces 48 may be greater than 1 micron or may range from 1 micron to 500 microns, from 1 micron to 200 microns, from 1 micron to 100 microns, from 1 micron to 50 microns, from 1 micron to 20 microns or from 1 micron to 10 microns, and preferably from between 2 microns to 20 microns.

Figure 3E:
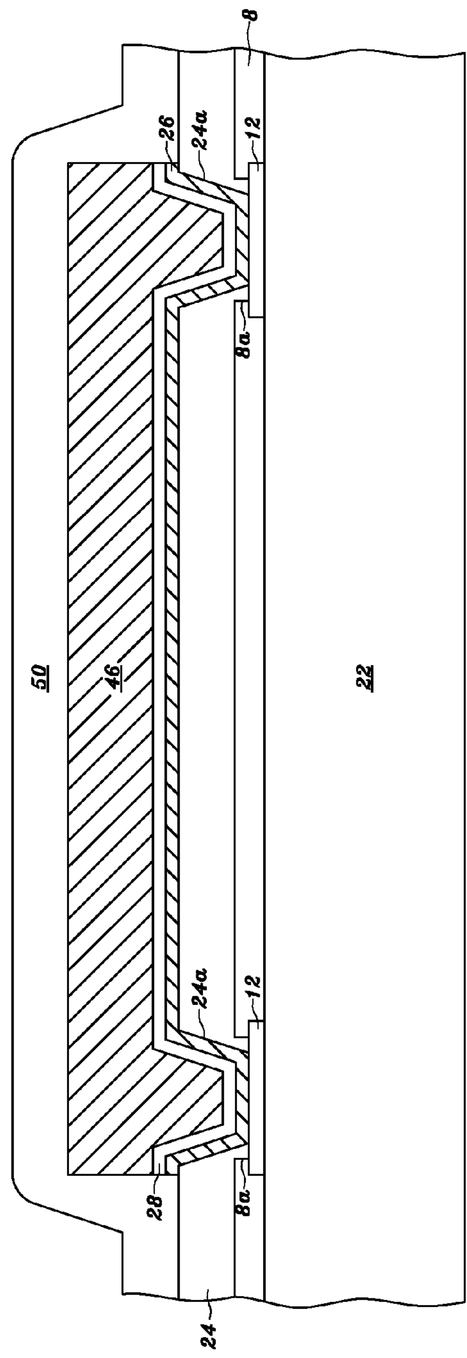
Figure 3F:
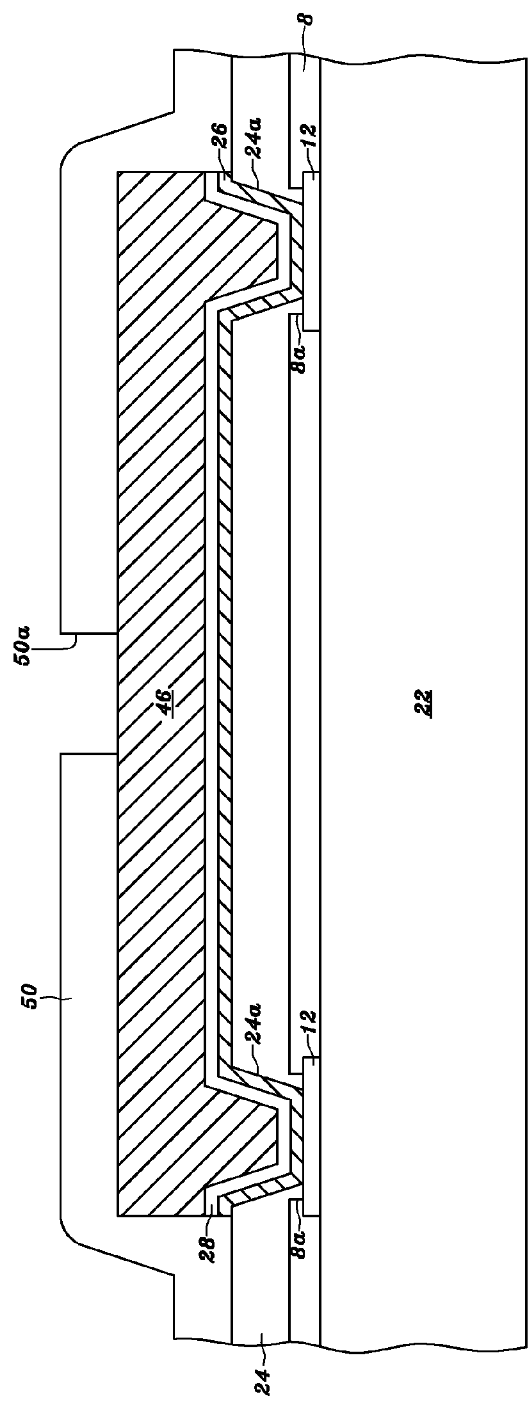
Figure 3G:
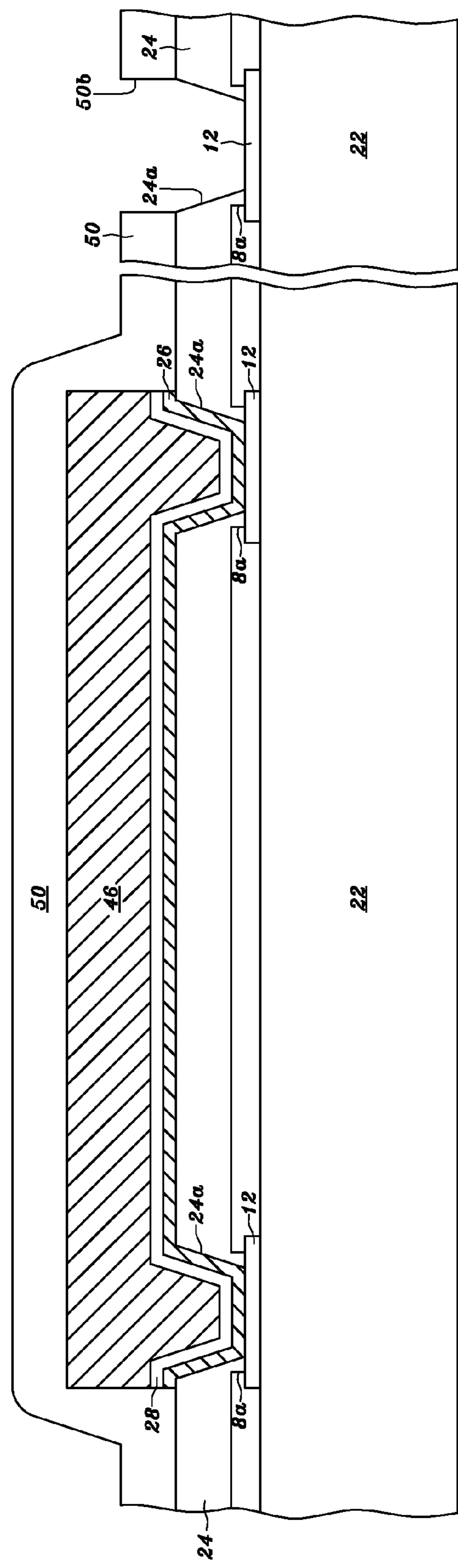
Figure 3H:
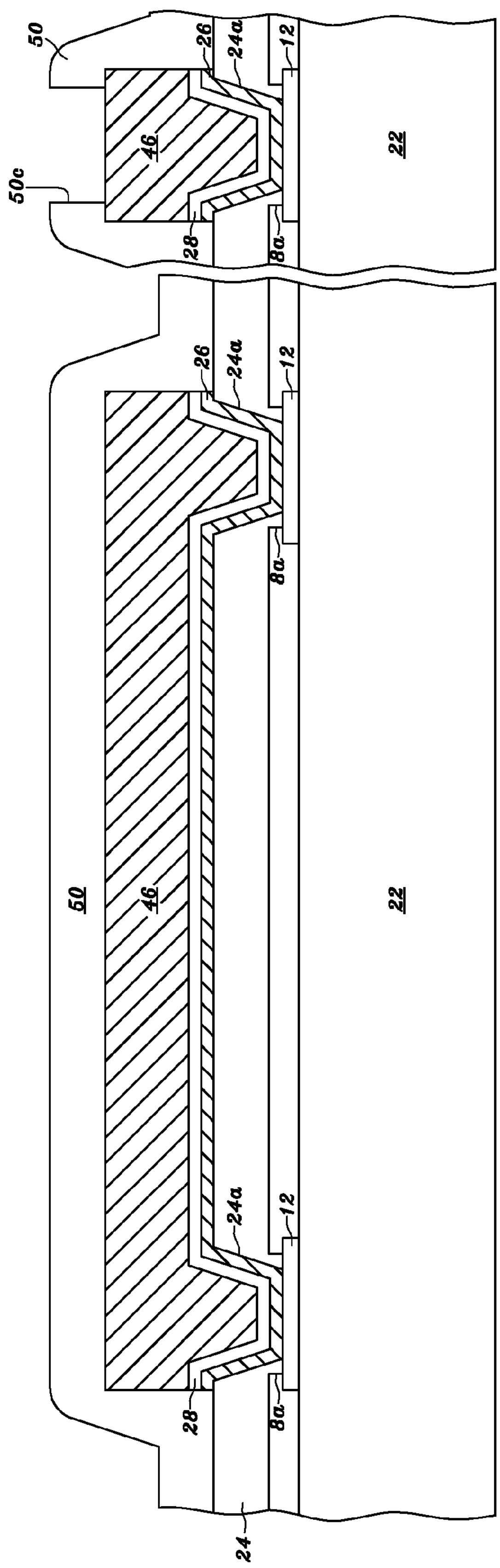

Referring to FIG. 3E, after the seed layer 28 and the adhesion/barrier layer 26 not under the gold layer 46 have been removed, a polymer layer 50 is optionally formed on the gold layer 46 and the polymer layer 24, and no opening may be formed in the polymer layer 50 to expose the gold layer 46 of the interconnecting metal trace 48. Referring to FIG. 3F, alternatively, the polymer layer 50 may be formed on the gold layer 46 and the polymer layer 24 and patterned with an opening 50*a* in the polymer layer 50 exposing the gold layer 46 of the interconnecting metal trace 48. The gold layer 46 exposed by the opening 50*a* may be used to be connected with an external circuit. For example, the gold layer 46 exposed by the opening 50*a* may have a wire (such as a gold wire or a copper wire) bonded thereon by a wire-bonding process, in connection with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter. Referring to FIG. 3G, alternatively, the polymer layer 50 may be formed on the gold layer 46 and the polymer layer 24 and then patterned to form an opening 50*b*, which can expose the pad 12. Referring to FIG. 3H, alternatively, the polymer layer 50 may be formed on the gold layer 46 and the polymer layer 24 and then patterned to form an opening 50*c*, which can expose the gold layer 46 over the pad 12.

The material of the polymer layer 50 may include polyimide, benzocyclobutane, polyurethane, epoxy resin, a parylene-based polymer, a solder-mask material, an elastomer, or a porous dielectric material. The polymer layer 50 has a thickness of between 2 and 30 μm. In a preferred case, the polymer layer 50 has a thickness of between 3 and 12 μm. The polymer layer 50 can be formed via a spin-on coating process, a process for thermally pressing a dry film, or a screen-printing process. Below, the process of forming a patterned polymer layer 50 is exemplified with the case of spin-on coating a polyimide layer on the polymer layer 24 and on the gold layer 46, and then patterning the polyimide layer. Alternatively, the polymer layer 50 can be formed by spin-on coating a layer of benzocyclobutane, polyurethane, epoxy resin, a parylene-based polymer, a solder-mask material, an elastomer or a porous dielectric material, and then patterning the layer.

In a first method, the polymer layer 50 can be formed by spin-on coating a positive-type photosensitive polyimide layer having a thickness of between 4 and 60 μm, and preferably of between 6 and 24 μm, on the polymer layer 24 and on the gold layer 46, then baking the spin-on coated polyimide layer, then exposing the baked polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the gold layer 46 or the pad 12 with an $O_2$ plasma or a plasma containing fluorine of below 200 PPM and oxygen, such that the polyimide layer can be patterned with at least one opening in the polyimide layer exposing the gold layer 46 of interconnecting metal trace 48, the pad 12, or the gold layer 46 over the pad 12.

In a second method, the polymer layer 50 can be formed by spin-on coating a first positive-type polyimide layer with photosensitivity having a thickness of between 4 and 60 μm, and preferably of between 6 and 24 μm, on the polymer layer 24 and on the gold layer 46, then baking the spin-on coated first polyimide layer, then exposing the baked first polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the gold layer 46 or the pad 12 with an $O_2$ plasma or a plasma containing fluorine of below 200 PPM and oxygen, such that the first polyimide layer can be patterned with at least one first opening in the first polyimide layer exposing the gold layer 46 of interconnecting metal trace 48, the pad 12, or the gold layer 46 over the pad 12, then spin-on coating a second positive-type polyimide layer with photosensitivity having a thickness of between 4 and 60 μm, and preferably of between 6 and 24 μm, on the first polyimide layer and on the gold layer 46 and/or the pad 12 exposed by the first opening in the first polyimide layer, then baking the spin-on coated second polyimide layer, then exposing the baked second polyimide layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the baked second polyimide layer, that is, G-line and H-line, G-line and I-line, H-line and I-line, or G-line, H-line and I-line illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the gold layer 46 or the pad 12 with an $O_2$ plasma or a plasma containing fluorine of below 200 PPM and oxygen, such that the second polyimide layer can be patterned with at least one second opening in the second polyimide layer exposing the gold layer 46 of interconnecting metal trace 48, the pad 12, or the gold layer 46 over the pad 12. Alternatively, to lead the polymer layer 50 with a relatively great thickness, forming the polymer layer 50 may further comprise forming one or more other polyimide layers on the second polyimide layer, following the steps of forming the first or second polyimide layer. The step of removing the residual polymeric material or other contaminants on the upper surface of the gold layer 46 or the pad 12 with an $O_2$ plasma or a plasma containing fluorine of below 200 PPM and oxygen can be only performed after the topmost polyimide layer of the polymer layer 50 has been cured.

Below, the description is based on the case that the polymer layer 50 has been formed on the gold layer 46 and the polymer layer 24. Alternatively, there may be no polymer layer 50 on the gold layer 46 and the polymer layer 24. After the above-mentioned processes have been completed, the semiconductor substrate 2 can be diced into a plurality of individual semiconductor chips.

Figure 3I:
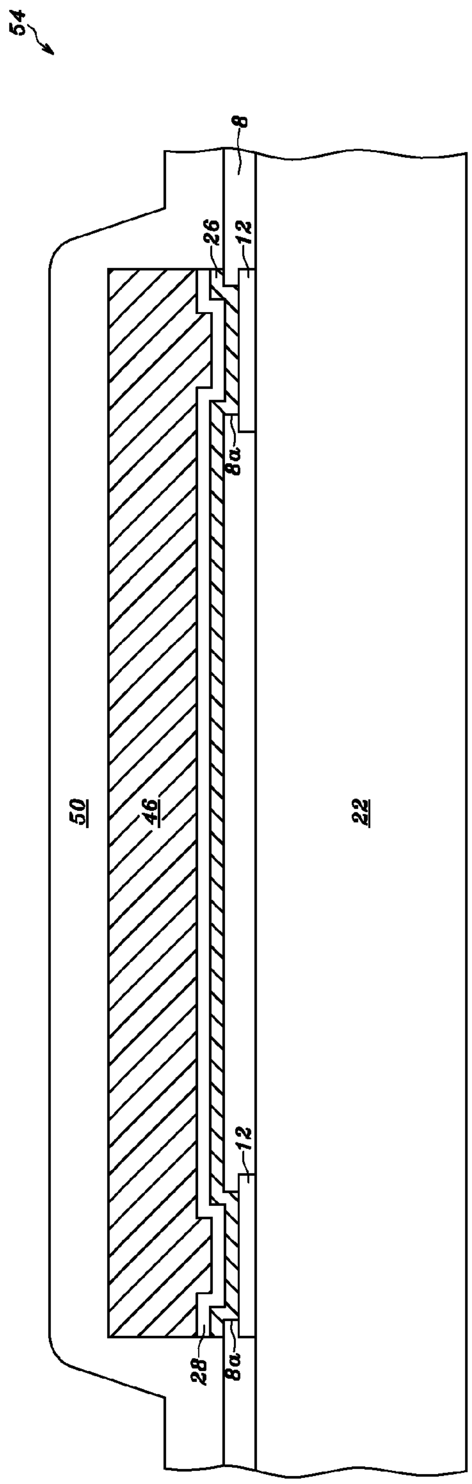

Referring to FIG. 3I, in the present invention, the step of forming the polymer layer 24 on the passivation layer 8, as shown in FIGS. 2A and 2B or in FIGS. 2A and 2C, can be omitted, that is, the adhesion/barrier layer 26 having a thickness of between 2,000 and 5,000 Å, and preferably between 2,500 and 3,500 Å, can be directly formed on the passivation layer 8 and on the pads 12, and then the seed layer 28 can be sputtered on the adhesion layer 26, followed by the above-mentioned steps as shown in FIG. 2E and FIGS. 3A-3H. The steps of forming the adhesion/barrier layer 26 and the seed layer 28 can be referred to the above description concerning FIG. 2D. Next, the semiconductor substrate 2 is diced into a plurality of individual semiconductor chips 54.

Embodiment 3

Figure 4A:
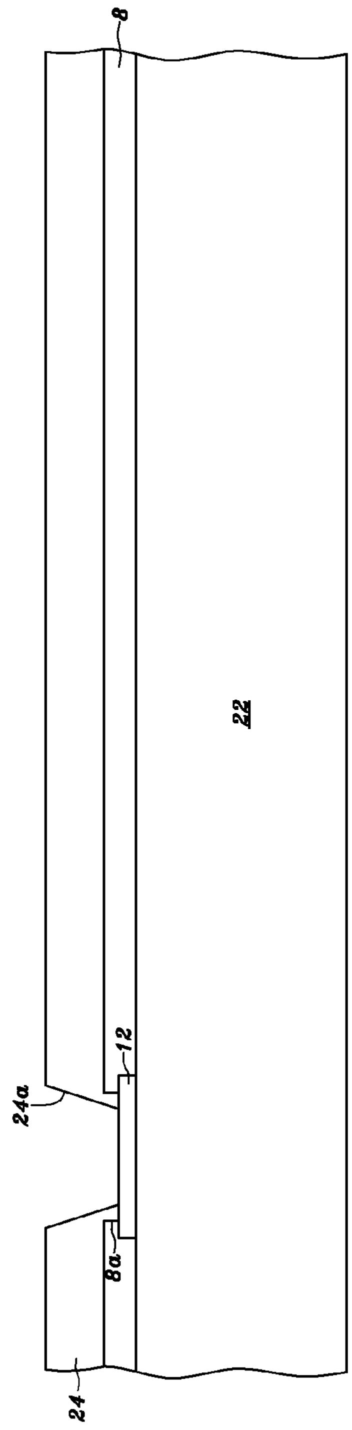
FIGS. 4A through 4M are sectional views showing a process according to one embodiment of the present invention.
Figure 4B:
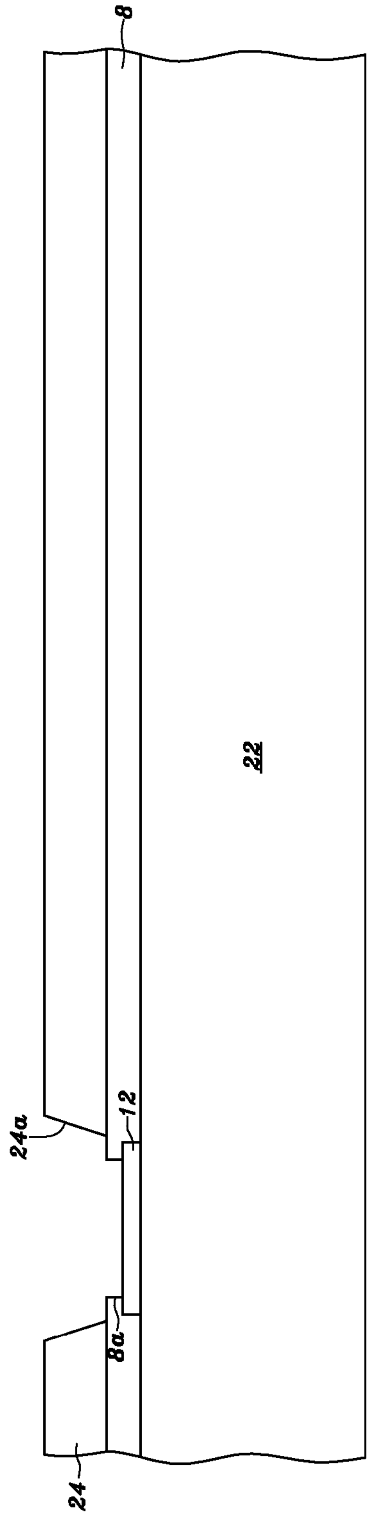

Referring to FIG. 2A, a polymer layer 24 is formed on the passivation layer 8, and then referring to FIGS. 4A-4B, at least one opening **24*a* is formed in the polymer layer 24 by patterning the polymer layer 24 to expose at least one pad 12. The opening 24*a* may expose a portion of the pad 12, and another portion of the pad 12 is covered with the polymer layer 24, as shown in FIG. 4A. Alternatively, the opening 24*a* may expose the entire upper surface of the pad 12 exposed by the opening 8*a* in the passivation layer 8 and further may expose the upper surface of the passivation layer 8 near the pad 12, as shown in FIG. 4B. The descriptions of this embodiment in FIGS. 4C-4L are based on the structure with the opening 24*a* exposes the entire upper surface of the pad 12 exposed by the opening 8*a* in the passivation layer 8 and further exposes the top surface of the passivation layer 8 in the perimeter of the pad 12, as shown in FIG. 4B. Alternatively, the embodiments in FIGS. 4C-4L can be applied to the structure with the opening 24*a* exposes a portion of the pad 12, and another portion of the pad 12 covered by the polymer layer 24, as shown in FIG. 4A. The characteristics of the polymer layer 24 and the method of forming the same can be referred to the above description concerning FIGS. 2A-2**C.

Figure 4C:
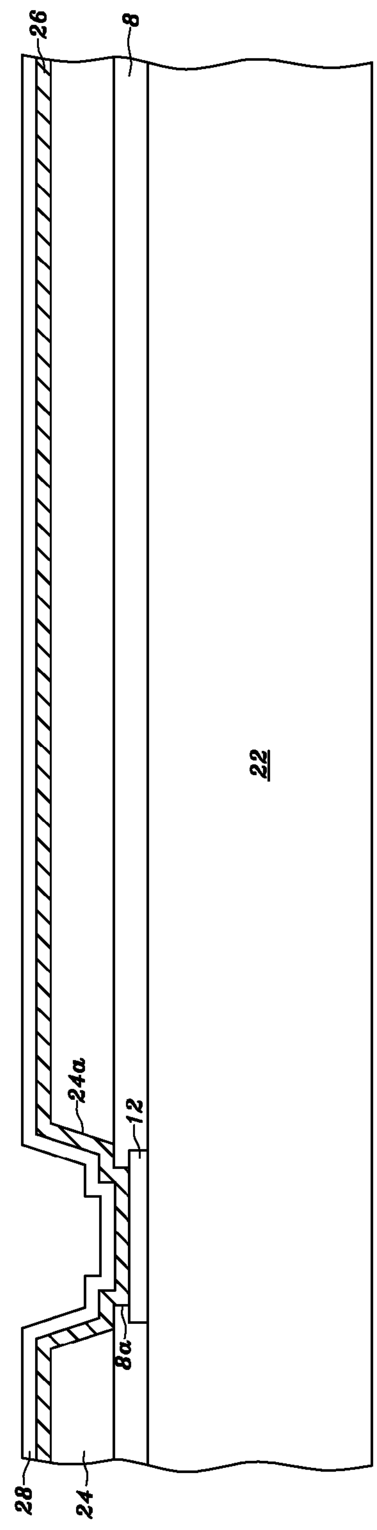

Referring to FIG. 4C, after forming the polymer layer 24, an adhesion/barrier layer 26 having a thickness of between 2,000 and 5,000 angstroms, and preferably between 2,500 and 3,500 angstroms, is formed on the polymer layer 24, on the pad 12 exposed by the opening **24*a*, and on the passivation layer 8 in the perimeter of the pad 12 exposed by the opening 24*a*. Next, a seed layer 28 having a thickness of 500 and 2,000 angstroms, and preferably between 750 and 1,500 angstroms, is formed on the adhesion/barrier layer 26. The characteristics of the adhesion/barrier layer 26 and the seed layer 28 and the method of forming the same can be referred to the above description concerning FIG. 2**D.

Figure 4D:
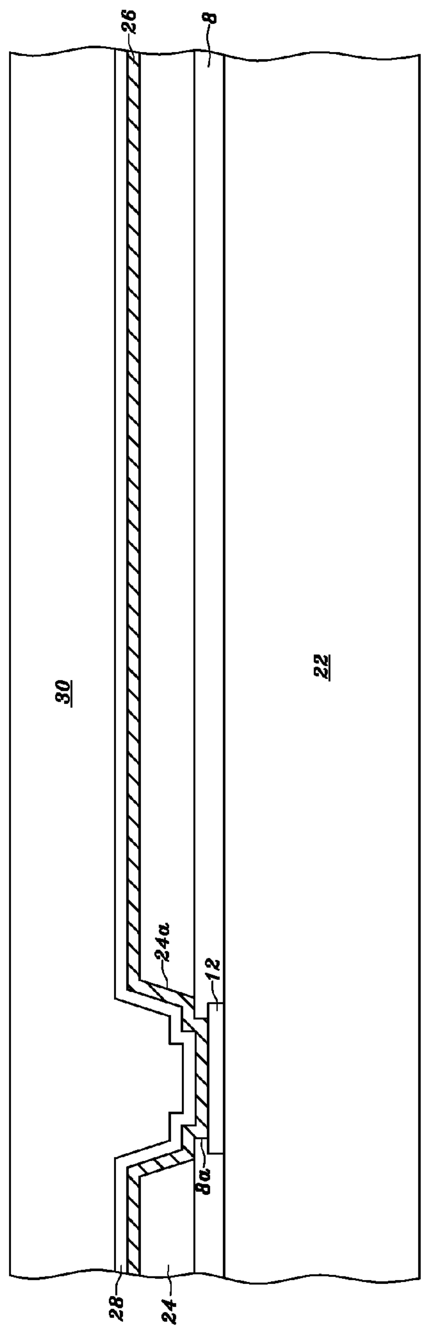
Figure 4E:
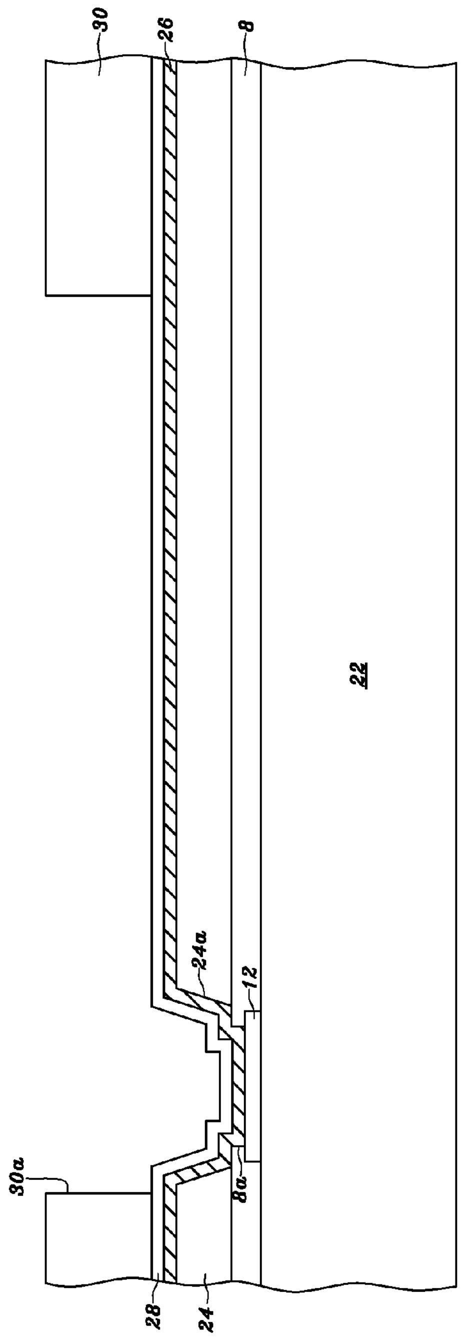

Referring to FIG. 4D, a photoresist layer 30 having a thickness of between 5 and 30 μm, and preferably between 7 and 15 μm, is formed on the seed layer 28. Referring to FIG. 4E, the photoresist layer 30 is patterned with the processes of exposure, development, etc., to form an opening 30*a* in the photoresist layer 30 exposing the seed layer 28 over the pad 12 and over the passivation layer 8.

The photoresist layer 30 can be formed by spin-on coating a positive-type photosensitive polymer layer having a thickness of between 5 and 30 μm, and preferably of between 7 and 15 μm, on the seed layer 28, then exposing the photosensitive polymer layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 28 with an $O_2$ plasma or a plasma containing fluorine of below 200 PPM and oxygen, such that the photoresist layer 30 can be patterned with at least one opening 30*a* in the photoresist layer 30 exposing the seed layer 28.

Figure 4F:
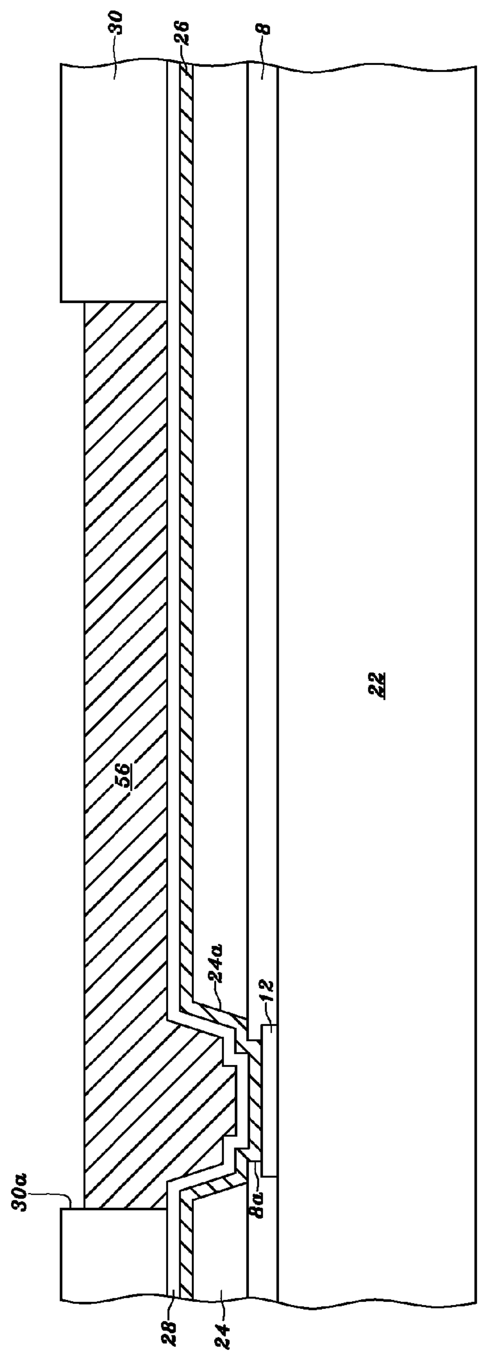

Referring to FIG. 4F, a gold layer 56 having a thickness of between 3 and 18 μm, and preferably between 3 and 8 μm, is electroplated on the seed layer 28 (such as a gold layer) exposed by the opening 30*a* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold layer 56 are described below:

1. The above-mentioned electroplating solution can be at a temperature of between 30 and 70° C., and preferably between 45 and 65° C., to electroplate the gold layer 56 on the seed layer 28 exposed by the opening 30*a*.
2. The above-mentioned electroplating solution can be used to electroplate the gold layer 56 on the seed layer 28 exposed by the opening 30*a* through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold layer 56 on the seed layer 28 exposed by the opening 30*a*.

Thereby, the gold layer 56 can be electroplated in a short time with an enough thickness of between 3 and 18 μm, and preferably between 3 and 8 μm, for example, on the seed layer 28 made of gold that has been formed on the adhesion/barrier layer 26 made of titanium or titanium-tungsten alloy.

Figure 4G:
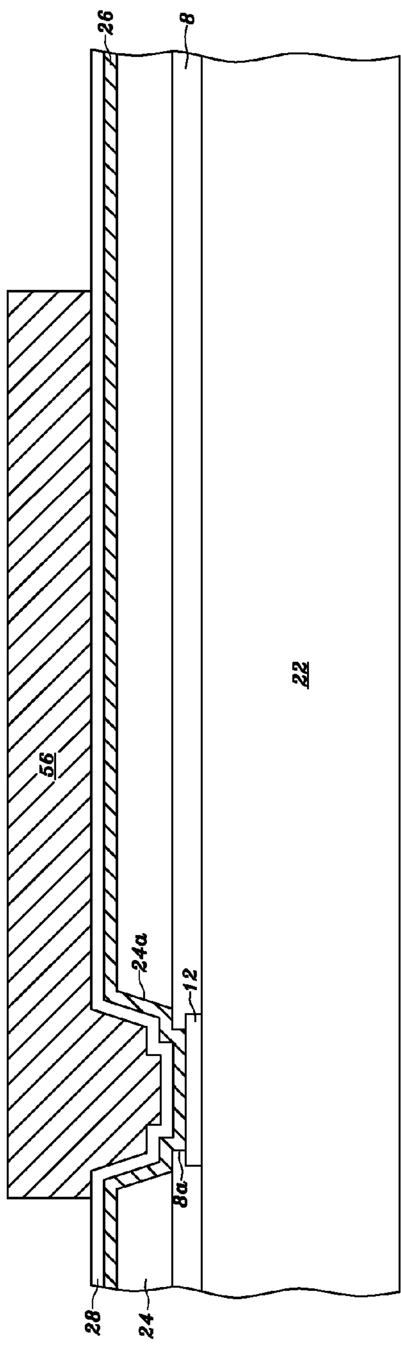

Referring to FIG. 4G, after the gold layer 56 is formed, most of the photoresist layer 30 can be removed using an organic solution with amide. However, some residuals from the photoresist layer 30 could remain on the gold layer 56 and on the seed layer 28. Thereafter, the residuals can be removed from the gold layer 56 and the seed layer 28 with a plasma, such as an $O_2$ plasma or a plasma containing fluorine of below 200 PPM and oxygen.

Figure 4H:
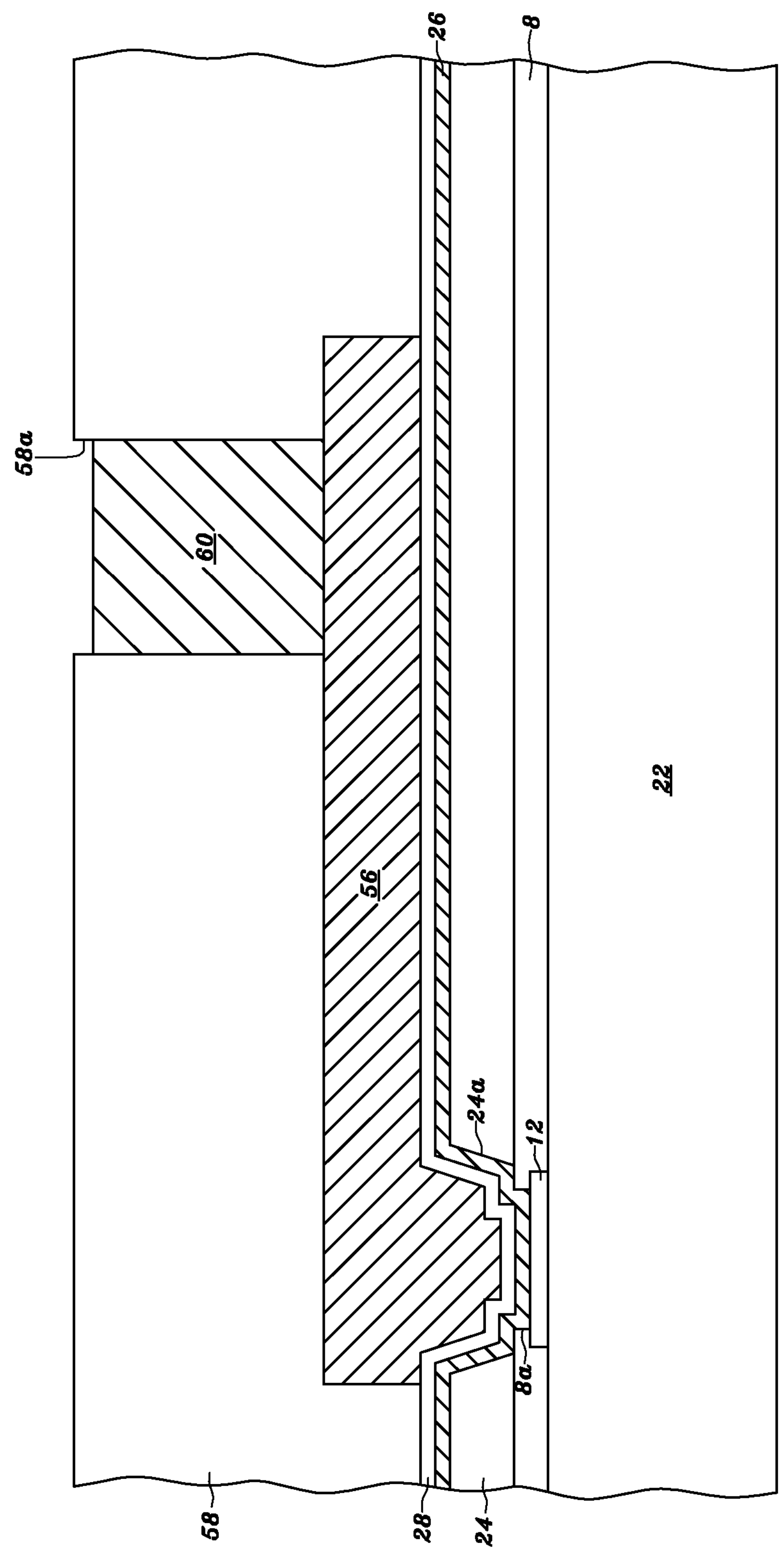

Referring to FIG. 4H, following the method of forming the photoresist layer 30, a photoresist layer 58 can be formed on the seed layer 28 and on the gold layer 56, and an opening 58*a* in the photoresist layer 58 exposes the gold layer 56. Besides, from a top perspective view, the position of the gold layer 56 exposed by the opening 58*a* is different from that of the pad 12 the gold layer 56 is connected to.

Next, a gold bump 60 having a thickness of between 2 and 15 μm or between 8 and 30 μm, can be electroplated on the gold layer 56 exposed by the opening 58*a* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold bump 60 are described below:

1. The above-mentioned electroplating solution can be at a temperature of between 30 and 70° C., and preferably between 45 and 65° C., to electroplate the gold bump 60 on the gold layer 56 exposed by the opening 58*a*.
2. The above-mentioned electroplating solution can be used to electroplate the gold bump 60 on the gold layer 56 exposed by the opening 58*a* through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold bump 60 on the gold layer 56 exposed by the opening 58*a*.

Figure 4I:
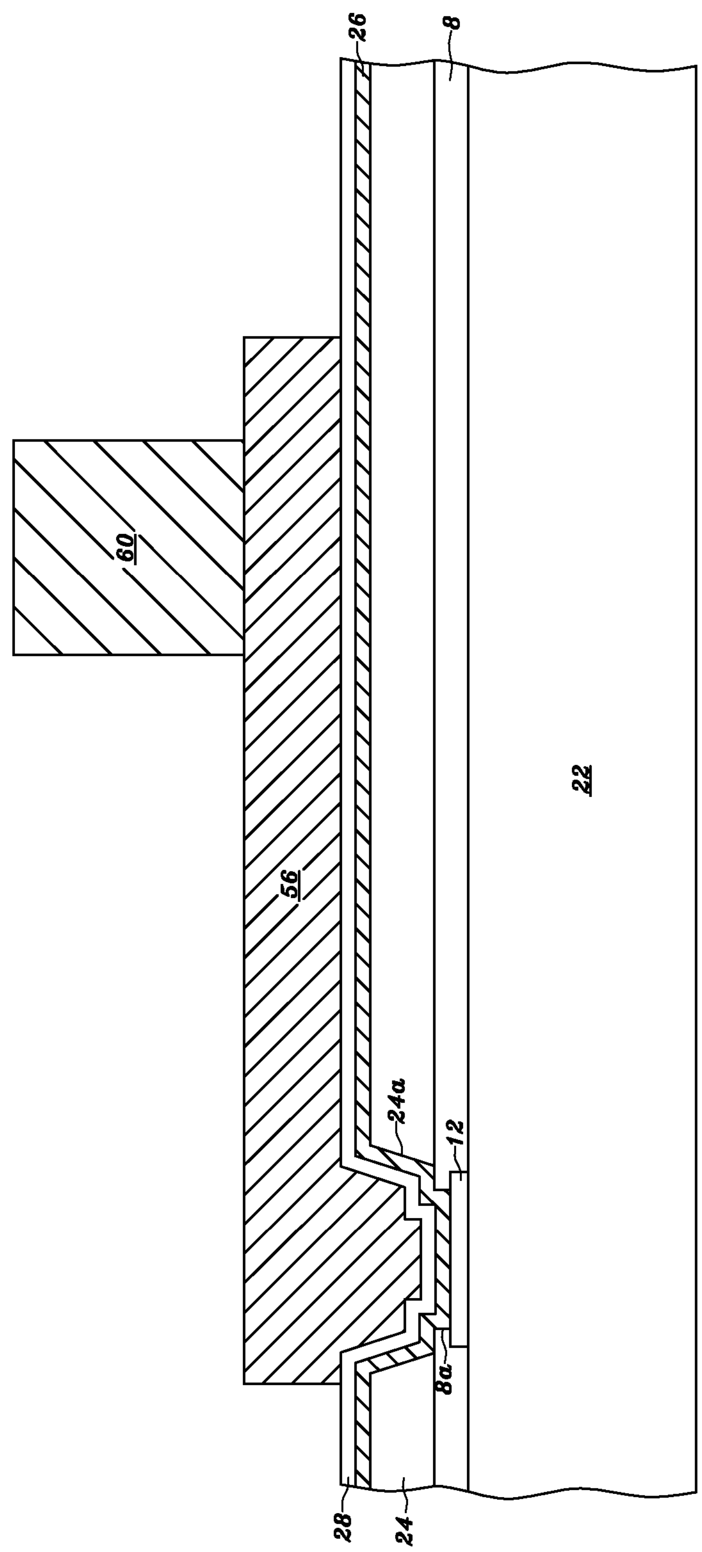

Referring to FIG. 4I, after the gold bump 60 is formed, most of the photoresist layer 58 can be removed using an organic solution with amide. However, some residuals from the photoresist layer 58 could remain on the seed layer 28, on the gold layer 56 and on the gold bump 60. Thereafter, the residuals can be removed from the seed layer 28, the gold layer 56 and the gold bump 60 with a plasma, such as an $O_2$ plasma or a plasma containing fluorine of below 200 PPM and oxygen.

Figure 4J:
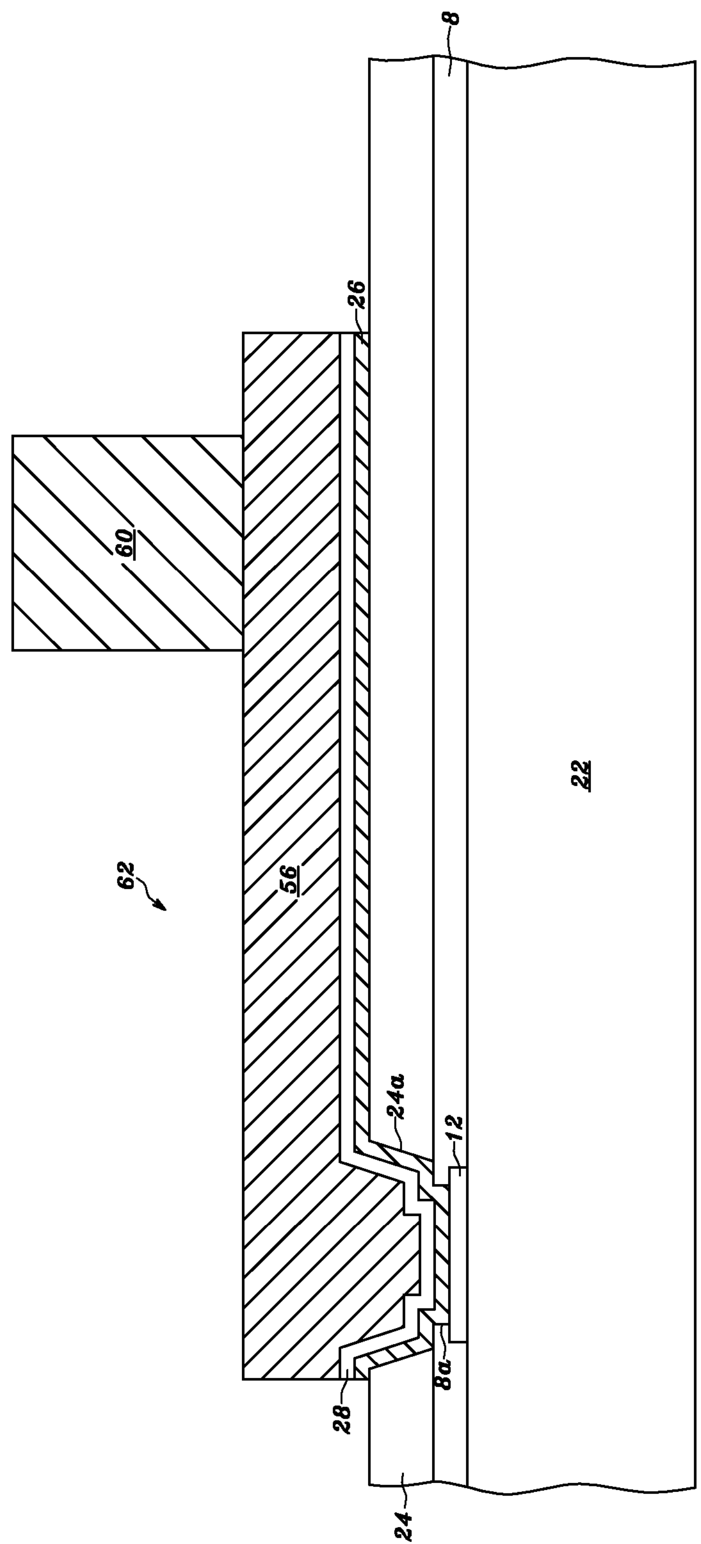

Thereafter, referring to FIG. 4J, the seed layer 28 and the adhesion/barrier layer 26 not under the gold layer 56 are removed. For example, the seed layer 28 and the adhesion/barrier layer 26 not under the gold layer 56 are removed with a dry etching method or a wet etching method. As to the wet etching methods, when the adhesion/barrier layer 26 is a titanium-tungsten alloy layer, it can be etched with a solution containing hydrogen peroxide; when the adhesion/barrier layer 26 is a titanium layer, it can be etched with a solution containing hydrogen fluoride; when the seed layer 28 is a gold layer, it can be etched with an iodine-containing solution, such as a solution containing potassium iodide. As to the dry etching methods, when the adhesion/barrier layer 26 is a titanium layer or a titanium-tungsten alloy layer, it can be etched with a chlorine-containing plasma etching process; when the seed layer 28 is a gold layer, it can be removed with an argon sputter process. Generally, the dry etching method to etch the seed layer 28 and the adhesion/barrier layer 26 not under the gold layer 56 may include a chemical plasma etching process, a sputtering etching process, such as an argon sputter process, or a chemical vapor etching process.

Figure 4K:
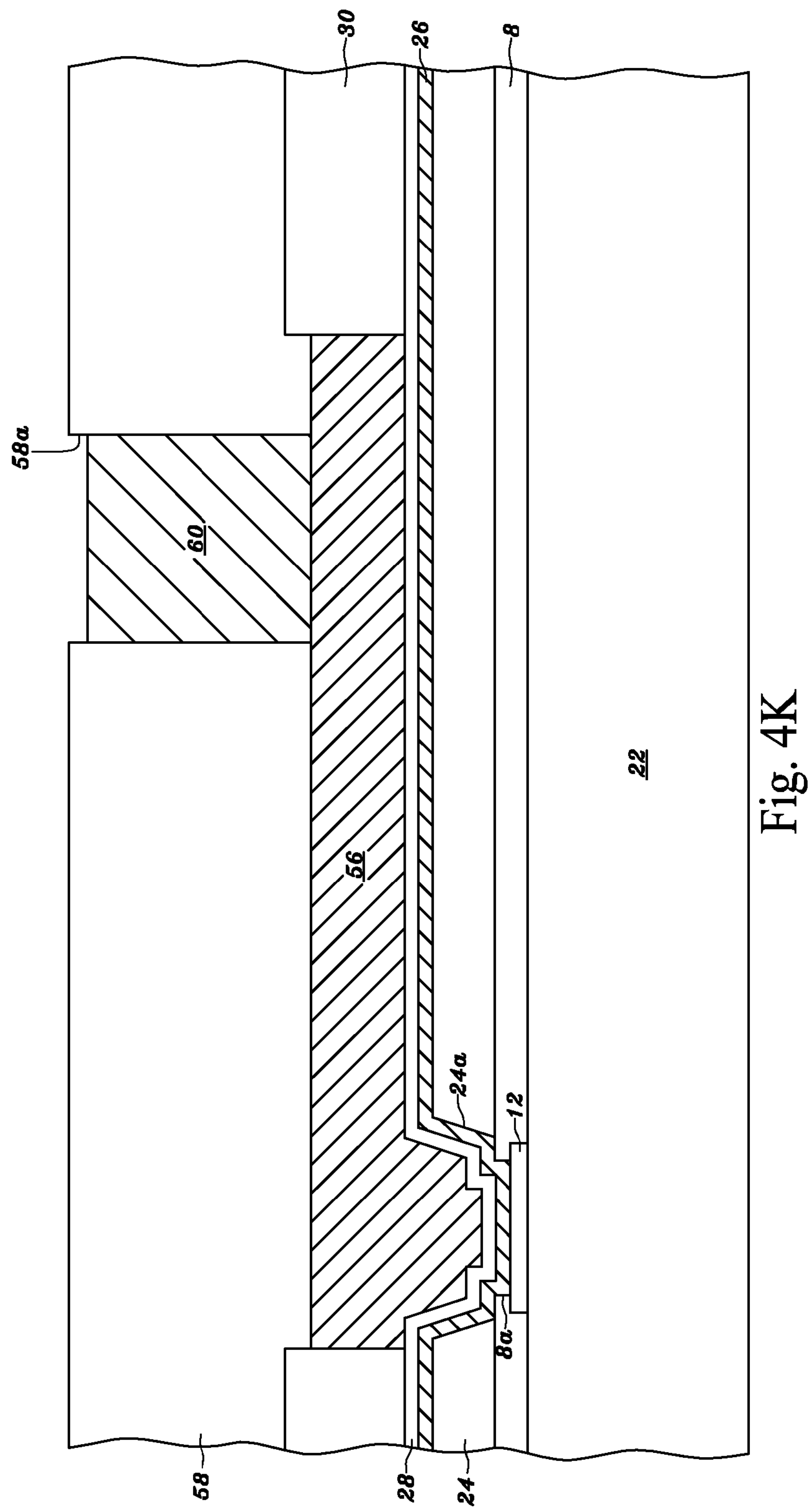

Referring to FIG. 4K, alternatively, after the step shown in FIG. 4F is completed, the photoresist layer 58, in accordance with the method of forming and patterning the photoresist layer 30, can be formed on the photoresist layer 30 and the gold layer 56 and patterned with the opening 58*a* exposing the gold layer 56, without removing the photoresist layer 30. Besides, from a top perspective view, the position of the gold layer 56 exposed by the opening 58*a* is different from that of the pad 12 the gold layer 56 is connected to. Next, the gold bump 60 can be electroplated on the gold layer 56 exposed by the opening 58*a*. The step of forming the gold bump 60 can be referred to the above description concerning FIG. 4H. After the gold bump 60 is formed, most of the photoresist layer 30 and the photoresist layer 58 can be removed using an organic solution with amide. However, some residuals from the photoresist layer 30 and the photoresist layer 58 could remain on the seed layer 28, on the gold layer 56 and on the gold bump 60. Thereafter, the residuals can be removed from the seed layer 28, the gold layer 56 and the gold bump 60 with a plasma, such as an $O_2$ plasma or a plasma containing fluorine of below 200 PPM and oxygen. Thereafter, the seed layer 28 and the adhesion/barrier layer 26 not under the gold layer 56 are removed as show in FIG. 4J. The steps of removing the seed layer 28 and the adhesion/barrier layer 26 not under the gold layer 56 can be referred to the above description concerning FIG. 4J.

Referring to FIG. 4J, in the present invention, at least one metal trace 62 can be formed on the polymer layer 24 and on the pad 12, and the gold bump 60 having a thickness of between 2 and 15 μm or between 8 and 30 μm can be formed over the metal trace 62. The metal trace 62 can be formed of the adhesion/barrier layer 26, the seed layer 28 on the adhesion/barrier layer 26 and the electroplated gold layer 56 on the seed layer 28. Besides, the metal trace 62 may be a RDL (Re-Distribution Layer). The gold bump 60 may have a wire (such as a gold wire) bonded thereon by a wire-bonding process, may have a tape bonded thereon using a tape automated bonding (TAB) technology, may be bonded with a flexible film, or may be bonded with a wire (such as an ITO (Indium-Tin-Oxide)-containing wire or a gold-containing wire) of a rigid circuit board using an anisotropic conductive film (ACF) or an anisotropic conductive paste (ACP). The rigid circuit board may be a glass substrate, a ceramic substrate, or an organic substrate (such as a printed circuit board).

The pitch between the neighboring metal traces 62 may be greater than 3 microns or may range from 3 microns to 500 microns, from 3 microns to 200 microns, from 3 microns to 100 microns, from 3 microns to 50 microns, from 3 microns to 20 microns or from 3 microns to 10 microns. The metal trace 62 may have a width of between 1 micron and 500 microns, of between 1 micron and 200 microns, of between 1 micron and 100 microns, of between 1 micron and 50 microns, of between 1 micron and 20 microns or of between 1 micron and 10 microns, and preferably of between 2 microns and 20 microns. The spacing between the neighboring metal traces 62 may be greater than 1 micron or may range from 1 micron to 500 microns, from 1 micron to 200 microns, from 1 micron to 100 microns, from 1 micron to 50 microns, from 1 micron to 20 microns or from 1 micron to 10 microns, and preferably from between 2 microns to 20 microns.

Figure 4L:
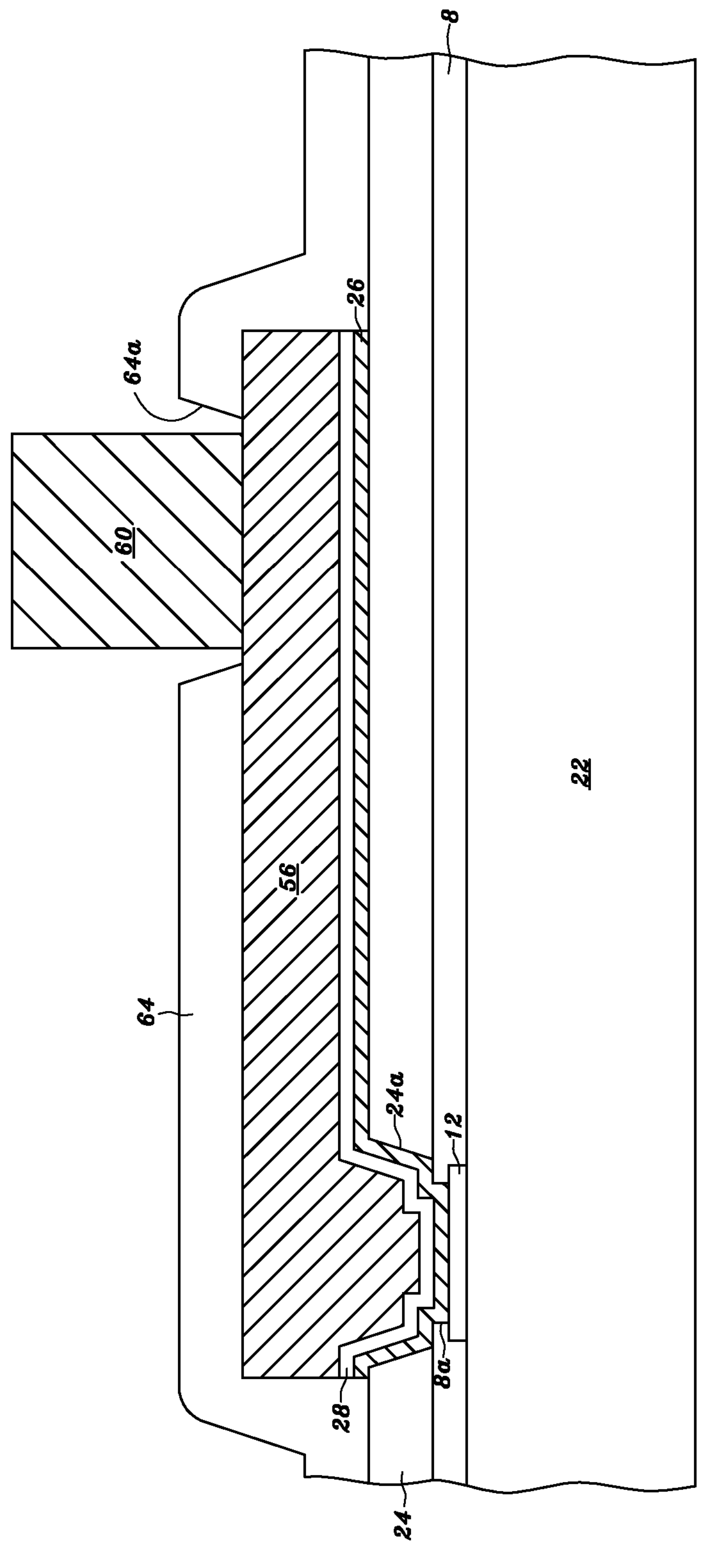

Referring to FIG. 4L, after the seed layer 28 and the adhesion/barrier layer 26 not under the gold layer 56 is removed, a polymer layer 64 is optionally formed on the gold layer 56 and on the polymer layer 24, and an opening 64*a* in the polymer layer 64 exposes the gold bump 60. The material of the polymer layer 64 may include polyimide, benzocyclobutane, polyurethane, epoxy resin, a parylene-based polymer, a solder-mask material, an elastomer, or a porous dielectric material. The polymer layer 64 has a thickness of between 2 and 30 μm. In a preferred case, the polymer layer 64 has a thickness of between 3 and 12 μm.

The polymer layer 64 can be formed via a spin-on coating process, a process for thermally pressing a dry film, or a screen-printing process. Below, the process of forming a patterned polymer layer 64 is exemplified with the case of spin-on coating a polyimide layer on the polymer layer 24, on the gold layer 56 and on the gold bump 60, and then patterning the polyimide layer. Alternatively, the polymer layer 64 can be formed by spin-on coating a layer of benzocyclobutane, polyurethane, epoxy resin, a parylene-based polymer, a solder-mask material, an elastomer or a porous dielectric material, and then patterning the layer.

In a first method, the polymer layer 64 can be formed by spin-on coating a positive-type photosensitive polyimide layer having a thickness of between 4 and 60 μm, and preferably of between 6 and 24 μm, on the polymer layer 24, on the gold layer 56 and on the gold bump 60, then baking the spin-on coated polyimide layer, then exposing the baked polyimide layer using a 1X stepper with at least two of G-line having a wavelength ranging from 434 to 464 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the gold bump 60 with an $O_2$ plasma or a plasma containing fluorine of below 200 PPM and oxygen, such that the polyimide layer can be patterned with at least one opening in the polyimide layer exposing the gold bump 60.

In a second method, the polymer layer 64 can be formed by spin-on coating a first positive-type polyimide layer with photosensitivity having a thickness of between 4 and 60 μm, and preferably of between 6 and 24 μm, on the polymer layer 24, on the gold layer 56 and on the gold bump 60, then baking the spin-on coated first polyimide layer, then exposing the baked first polyimide layer using a 1X stepper with at least two of G-line having a wavelength ranging from 434 to 464 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the gold bump 60 with an $O_2$ plasma or a plasma containing fluorine of below 200 PPM and oxygen, such that the first polyimide layer can be patterned with at least one first opening in the first polyimide layer exposing the gold bump 60, then spin-on coating a second positive-type polyimide layer with photosensitivity having a thickness of between 4 and 60 μm, and preferably of between 6 and 24 μm, on the first polyimide layer and on the gold bump 60 exposed by the first opening in the first polyimide layer, then baking the spin-on coated second polyimide layer, then exposing the baked second polyimide layer using a 1X stepper with at least two of G-line having a wavelength ranging from 434 to 464 nm, H-line having a wavelength ranging from 403 to 407 nm, and I-line having a wavelength ranging from 363 to 367 nm, illuminating the baked second polyimide layer, that is, G-line and H-line, G-line and I-line, H-line and I-line, or G-line, H-line and I-line illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the gold bump 60 with an $O_2$ plasma or a plasma containing fluorine of below 200 PPM and oxygen, such that the second polyimide layer can be patterned with at least one second opening in the second polyimide layer exposing the gold bump 60. Alternatively, to lead the polymer layer 64 with a relatively great thickness, forming the polymer layer 64 may further comprise forming one or more other polyimide layers on the second polyimide layer, following the steps of forming the first or second polyimide layer. The step of removing the residual polymeric material or other contaminants on the upper surface of the gold bump 60 with an $O_2$ plasma or a plasma containing fluorine of below 200 PPM and oxygen can be only performed after the topmost polyimide layer of the polymer layer 64 has been cured.

Below, the description is based on the case that the polymer layer 64 has been formed on the gold layer 56 and the polymer layer 24. Alternatively, there may be no polymer layer 64 on the gold layer 56 and the polymer layer 24. After the above-mentioned processes have been completed, the semiconductor substrate 2 can be diced into a plurality of individual semiconductor chips.

Figure 4M:
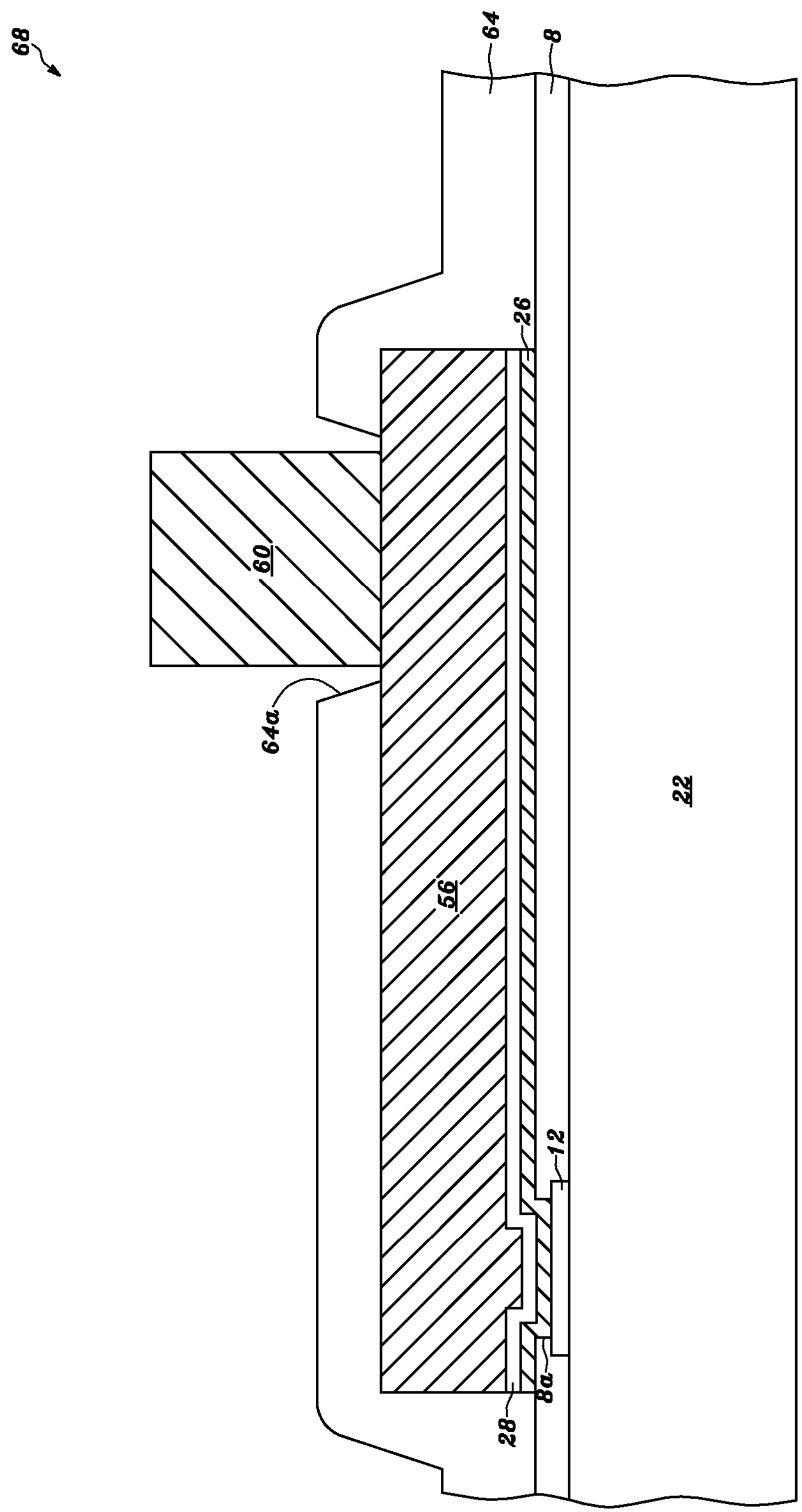

Referring to FIG. 4M, in the present invention, the step of forming the polymer layer 24 on the passivation layer 8, as shown in FIGS. 2A and 4A or in FIGS. 2A and 4B, can be omitted, that is, the adhesion/barrier layer 26 having a thickness of between 2,000 and 5,000 Å, and preferably between 2,500 and 3,500 Å, can be directly formed on the passivation layer 8 and on the pad 12, and then the seed layer 28 can be sputtered on the adhesion layer 26, followed by the above-mentioned steps as shown in FIGS. 4D-4L. The steps of forming the adhesion/barrier layer 26 and the seed layer 28 can be referred to the above description concerning FIG. 4C. After the above-mentioned processes have been completed, the semiconductor substrate 2 can be diced into a plurality of individual semiconductor chips 68.

Embodiment 4

Figure 5A:
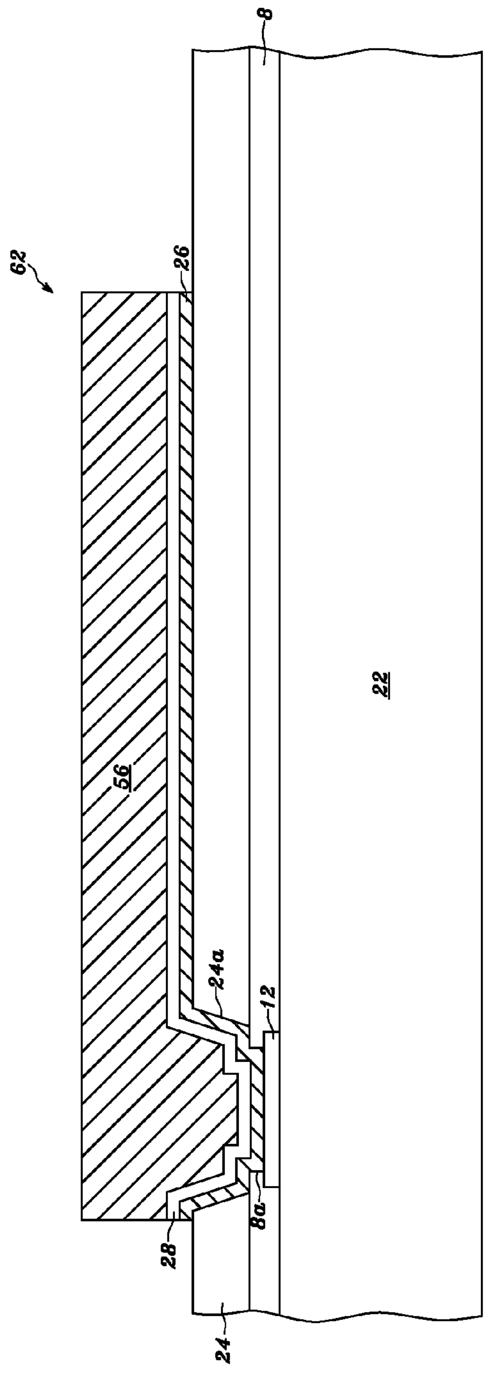
FIGS. 5A through 5H are sectional views showing a process according to one embodiment of the present invention.

Referring to FIG. 5A, after the step shown in FIG. 4G is completed, the seed layer 28 and the adhesion/barrier layer 26 not under the gold layer 56 are removed. The steps of removing the adhesion/barrier layer 26 and the seed layer 28 not under the gold layer 56 can be referred to the above description concerning FIG. 4J. Thereby, at least one metal trace 62 can be formed on the polymer layer 24 and on the pad 12. The metal trace 62 can be formed of the adhesion/barrier layer 26, the seed layer 28 on the adhesion/barrier layer 26 and the electroplated gold layer 56 on the seed layer 28. Besides, the metal trace 62 may be a RDL (Re-Distribution Layer).

Figure 5B:
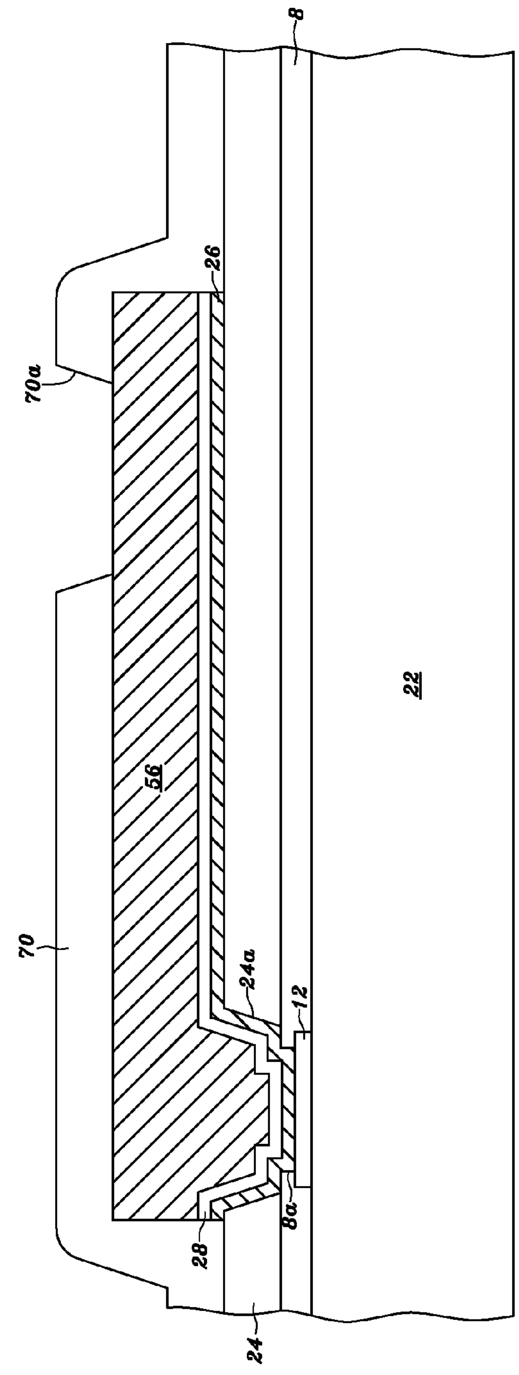

Referring to FIG. 5B, a polymer layer 70 is optionally formed on the gold layer 56 and on the polymer layer 24, and an opening 70*a* in the polymer layer 70 exposes the gold layer 56. The material of the polymer layer 70 may include polyimide, benzocyclobutane, polyurethane, epoxy resin, a parylene-based polymer, a solder-mask material, an elastomer, or a porous dielectric material. The polymer layer 70 has a thickness of between 2 and 30 μm. In a preferred case, the polymer layer 70 has a thickness of between 3 and 12 μm.

The polymer layer 70 can be formed via a spin-on coating process, a process for thermally pressing a dry film, or a screen-printing process. Below, the process of forming a patterned polymer layer 70 is exemplified with the case of spin-on coating a polyimide layer on the polymer layer 24 and on the gold layer 56, and then patterning the polyimide layer. Alternatively, the polymer layer 70 can be formed by spin-on coating a layer of benzocyclobutane, polyurethane, epoxy resin, a parylene-based polymer, a solder-mask material, an elastomer or a porous dielectric material, and then patterning the layer.

In a first method, the polymer layer 70 can be formed by spin-on coating a positive-type photosensitive polyimide layer having a thickness of between 4 and 60 μm, and preferably of between 6 and 24 μm, on the polymer layer 24 and on the gold layer 56, then baking the spin-on coated polyimide layer, then exposing the baked polyimide layer using a 1X stepper with at least two of G-line having a wavelength ranging from 434 to 470 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the gold layer 56 with an $O_2$ plasma or a plasma containing fluorine of below 200 PPM and oxygen, such that the polyimide layer can be patterned with at least one opening in the polyimide layer exposing the gold layer 56.

In a second method, the polymer layer 70 can be formed by spin-on coating a first positive-type polyimide layer with photosensitivity having a thickness of between 4 and 60 μm, and preferably of between 6 and 24 μm, on the polymer layer 24 and on the gold layer 56, then baking the spin-on coated first polyimide layer, then exposing the baked first polyimide layer using a 1X stepper with at least two of G-line having a wavelength ranging from 434 to 470 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the gold layer 56 with an $O_2$ plasma or a plasma containing fluorine of below 200 PPM and oxygen, such that the first polyimide layer can be patterned with at least one first opening in the first polyimide layer exposing the gold layer 56, then spin-on coating a second positive-type polyimide layer with photosensitivity having a thickness of between 4 and 60 μm, and preferably of between 6 and 24 μm, on the first polyimide layer and on the gold layer 56 exposed by the first opening in the first polyimide layer, then baking the spin-on coated second polyimide layer, then exposing the baked second polyimide layer using a 1X stepper with at least two of G-line having a wavelength ranging from 434 to 470 nm, H-line having a wavelength ranging from 403 to 407 nm, and I-line having a wavelength ranging from 363 to 367 nm, illuminating the baked second polyimide layer, that is, G-line and H-line, G-line and I-line, H-line and I-line, or G-line, H-line and I-line illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the gold layer 56 with an $O_2$ plasma or a plasma containing fluorine of below 200 PPM and oxygen, such that the second polyimide layer can be patterned with at least one second opening in the second polyimide layer exposing the gold layer 56. Alternatively, to lead the polymer layer 70 with a relatively great thickness, forming the polymer layer 70 may further comprise forming one or more other polyimide layers on the second polyimide layer, following the steps of forming the first or second polyimide layer. The step of removing the residual polymeric material or other contaminants on the upper surface of the gold layer 56 with an $O_2$ plasma or a plasma containing fluorine of below 200 PPM and oxygen can be only performed after the topmost polyimide layer of the polymer layer 70 has been cured.

Figure 5C:
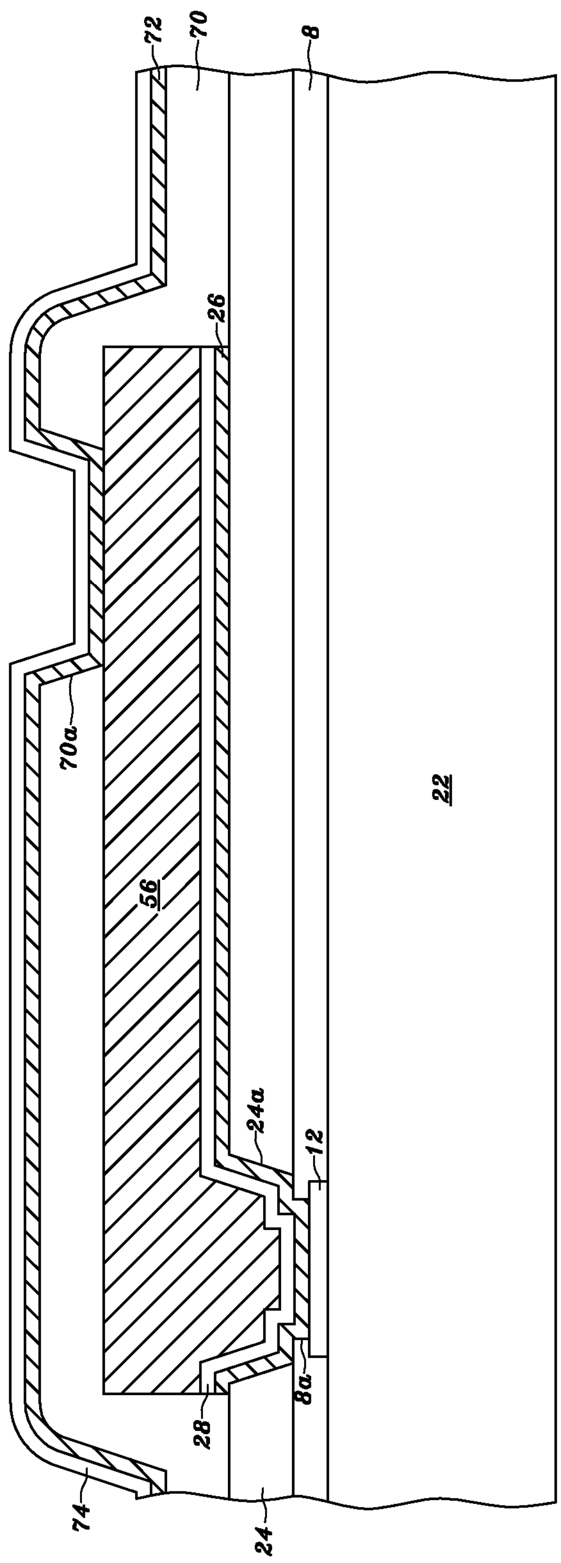

Referring to FIG. 5C, an adhesion/barrier layer 72 having a thickness of between 2,000 and 5,000 angstroms, and preferably between 2,500 and 3,500 angstroms, is formed on the polymer layer 70 and on the gold layer 56 exposed by the opening 70*a*. The material of the adhesion/barrier layer 72 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the abovementioned materials. The adhesion/barrier layer 72 may be formed by a sputtering method or a vapor deposition method.

Next, a seed layer 74 having a thickness of 500 and 2,000 angstroms, and preferably between 750 and 1,500 angstroms, is formed on the adhesion/barrier layer 72. The seed layer 74 may be formed by a sputtering method, a vapor deposition method, an electroless plating method or a PVD (Physical Vapor Deposition) method. The seed layer 74 is beneficial to electroplating a metal layer thereon. Thus, the material of the seed layer 74 varies with the material of the electroplated metal layer formed on the seed layer 74. When a gold layer is to be electroplated on the seed layer 74, gold is a preferable material to the seed layer 74.

For example, when the adhesion/barrier layer 72 is formed by sputtering a titanium-containing layer with a thickness of between 2,000 and 5,000 angstroms, and preferably between 2,500 and 3,500 angstroms, the seed layer 74 can be formed by sputtering a gold layer with a thickness of between 500 and 2,000 angstroms, and preferably between 750 and 1,500 angstroms, on the titanium-containing layer. When the adhesion/barrier layer 72 is formed by sputtering a titanium layer with a thickness of between 2,000 and 5,000 angstroms, and preferably between 2,500 and 3,500 angstroms, the seed layer 74 can be formed by sputtering a gold layer with a thickness of between 500 and 2,000 angstroms, and preferably between 750 and 1,500 angstroms, on the titanium layer. When the adhesion/barrier layer 72 is formed by sputtering a layer of titanium-tungsten alloy with a thickness of between 2,000 and 5,000 angstroms, and preferably between 2,500 and 3,500 angstroms, the seed layer 74 can be formed by sputtering a gold layer with a thickness of between 500 and 2,000 angstroms, and preferably between 750 and 1,500 angstroms, on the layer of titanium-tungsten alloy.

Figure 5D:
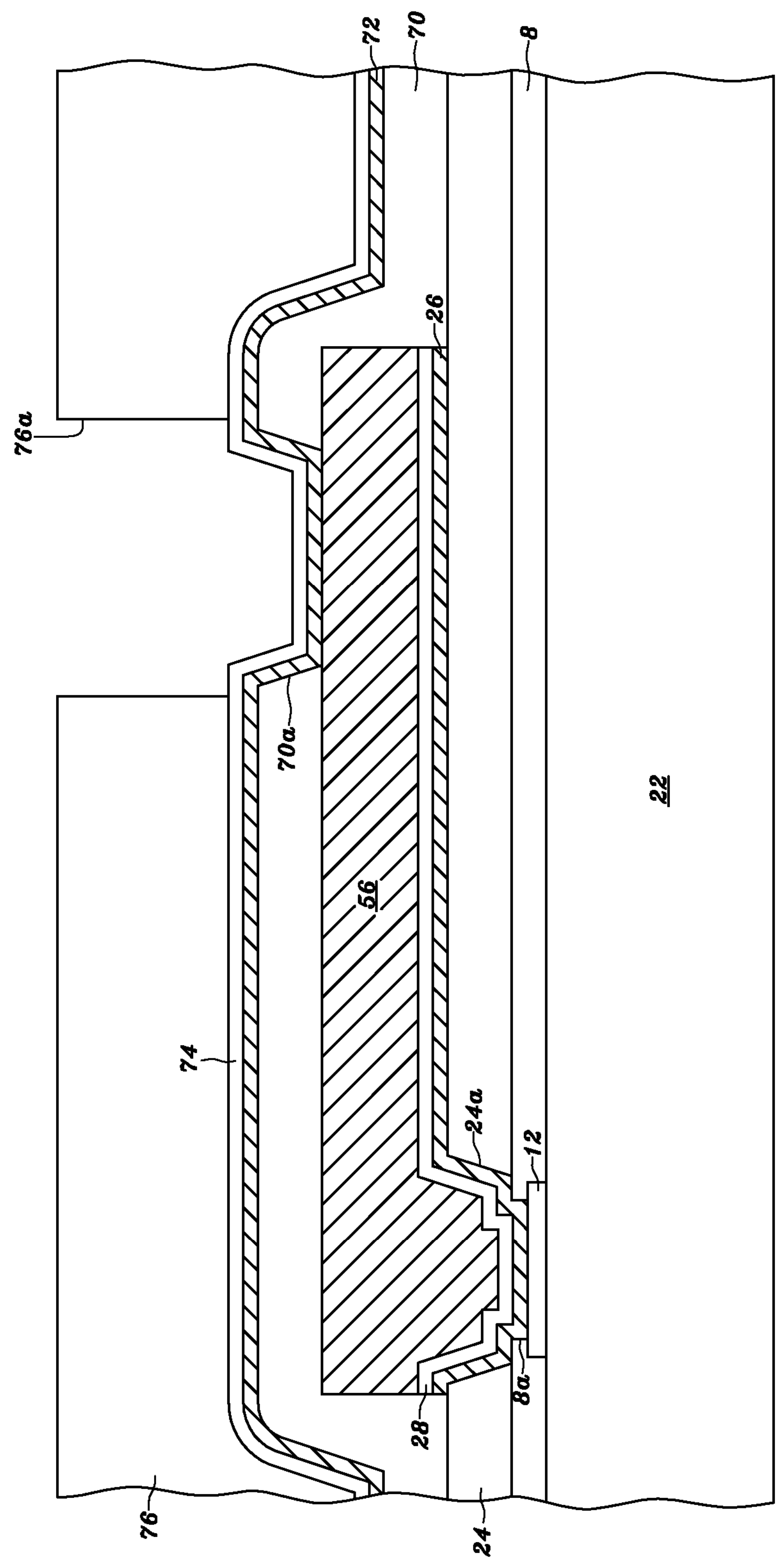

Referring to FIG. 5D, a photoresist layer 76 having a thickness of between 5 and 30 μm, and preferably between 7 and 15 μm, is formed on the seed layer 74. Next, the photoresist layer 76 is patterned with the processes of exposure, development, etc., to form an opening 76*a* in the photoresist layer 76 exposing the seed layer 74. The photoresist layer 76 can be formed by spin-on coating a positive-type photosensitive polymer layer having a thickness of between 5 and 30 μm, and preferably of between 7 and 15 μm, on the seed layer 74, then exposing the photosensitive polymer layer using a 1X stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 74 with an $O_2$ plasma or a plasma containing fluorine of below 200 PPM and oxygen, such that the photoresist layer 76 can be patterned with at least one opening 76*a* in the photoresist layer 76 exposing the seed layer 74.

Figure 5E:
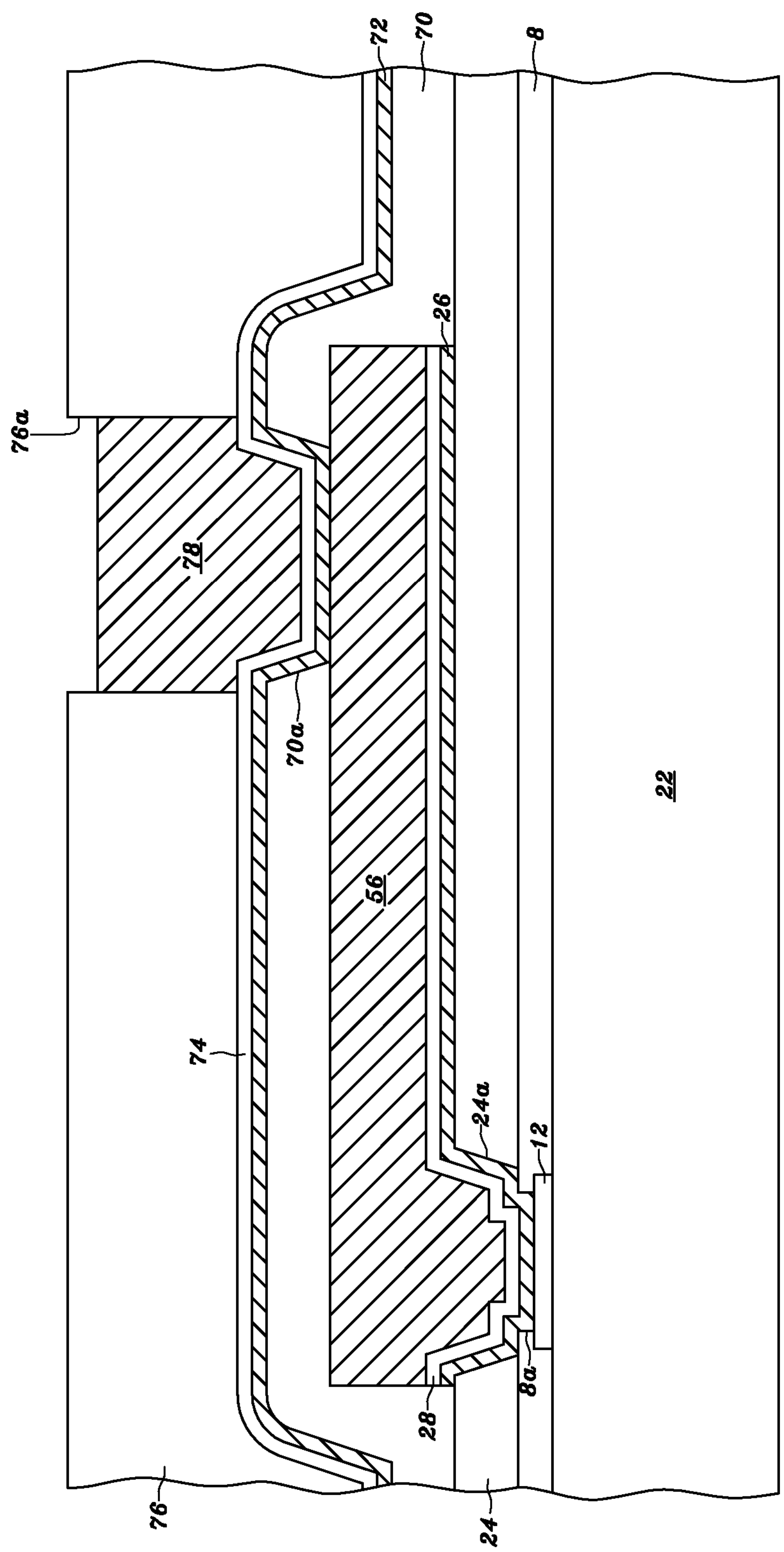

Referring to FIG. 5E, a gold bump 78 having a thickness of between 2 and 15 μm or between 8 and 30 μm, is electroplated on the seed layer 74 (such as a gold layer) exposed by the opening 76*a* with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$). The operational parameters of electroplating the gold bump 78 are described below:

1. The above-mentioned electroplating solution can be at a temperature of between 30 and 70° C., and preferably between 45 and 65° C., to electroplate the gold bump 78 on the seed layer 74 exposed by the opening 76*a*.
2. The above-mentioned electroplating solution can be used to electroplate the gold bump 78 on the seed layer 74 exposed by the opening 76*a* through an electric current with a current density at between 1 and 10 mA/cm$^2$, and preferably between 4 and 6 m/cm$^2$.
3. The above-mentioned electroplating solution may have a pH value of between 6 and 9, and preferably between 7 and 8.5, to electroplate the gold bump 78 on the seed layer 74 exposed by the opening 76*a*.

Thereby, the gold bump 78 can be electroplated in a short time with an enough thickness of between 2 and 15 μm or between 8 and 30 μm, for example, on the seed layer 74 made of gold that has been formed on the adhesion/barrier layer 72 made of titanium or titanium-tungsten alloy.

Figure 5F:
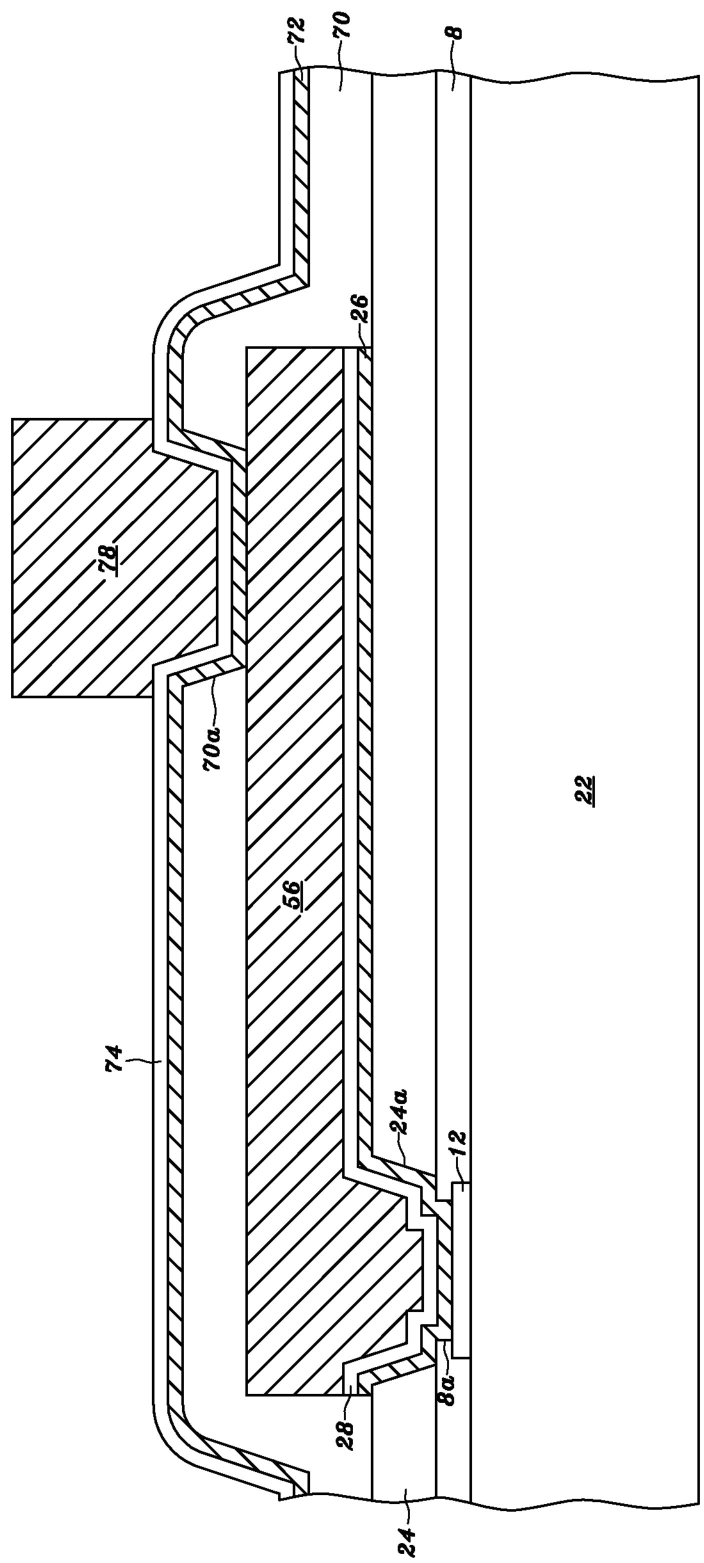

Referring to FIG. 5F, after the gold bump 78 is formed, most of the photoresist layer 76 can be removed using an organic solution with amide. However, some residuals from the photoresist layer 76 could remain on the gold bump 78 and on the seed layer 74. Thereafter, the residuals can be removed from the gold bump 78 and the seed layer 74 with a plasma, such as an $O_2$ plasma or a plasma containing fluorine of below 200 PPM and oxygen.

Figure 5G:
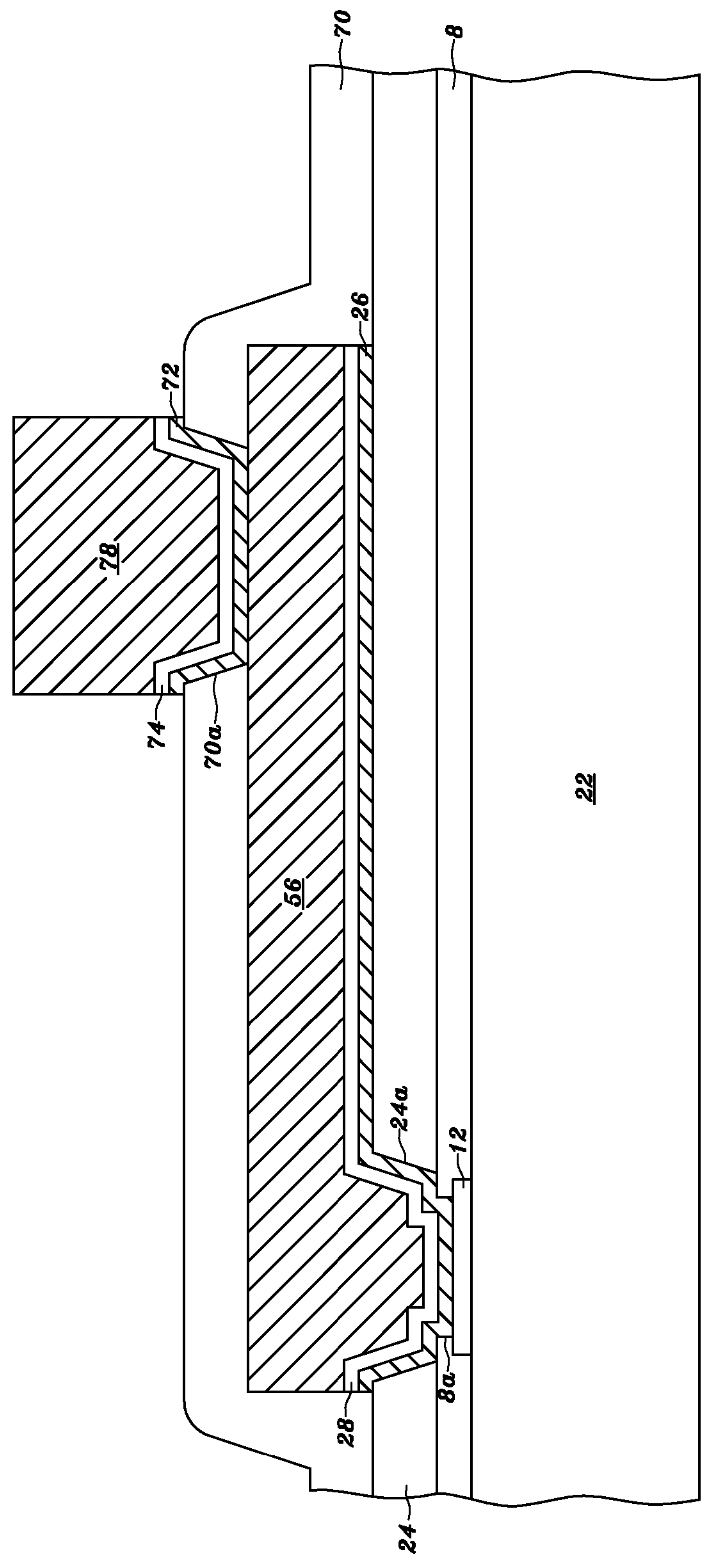

Thereafter, referring to FIG. 5G, the seed layer 74 and the adhesion/barrier layer 72 not under the gold bump 78 are removed. For example, the seed layer 74 and the adhesion/barrier layer 72 not under the gold bump 78 are removed with a dry etching method or a wet etching method. As to the wet etching methods, when the adhesion/barrier layer 72 is a titanium-tungsten alloy layer, it can be etched with a solution containing hydrogen peroxide; when the adhesion/barrier layer 72 is a titanium layer, it can be etched with a solution containing hydrogen fluoride; when the seed layer 74 is a gold layer, it can be etched with an iodine-containing solution, such as a solution containing potassium iodide. As to the dry etching methods, when the adhesion/barrier layer 72 is a titanium layer or a titanium-tungsten alloy layer, it can be etched with a chlorine-containing plasma etching process; when the seed layer 72 is a gold layer, it can be removed with an argon sputter process. Generally, the dry etching method to etch the seed layer 74 and the adhesion/barrier layer 72 not under the gold bump 78 may include a chemical plasma etching process, a sputtering etching process, such as an argon sputter process, or a chemical vapor etching process.

Thereby, in the present invention, the gold bump 78 having a thickness of between 2 and 15 μm or between 8 and 30 μm can be formed over the gold layer 56 of the metal trace 62 exposed by the opening 70*a*. The gold bump 78 may have a wire (such as a gold wire) bonded thereon by a wire-bonding process, may have a tape bonded thereon using a tape automated bonding (TAB) technology, may be bonded with a flexible film, or may be bonded with a wire (such as an ITO (Indium-Tin-Oxide)-containing wire or a gold-containing wire) of a rigid circuit board using an anisotropic conductive film (ACF) or an anisotropic conductive paste (ACP). The rigid circuit board may be a glass substrate, a ceramic substrate, or an organic substrate (such as a printed circuit board).

Figure 5H:
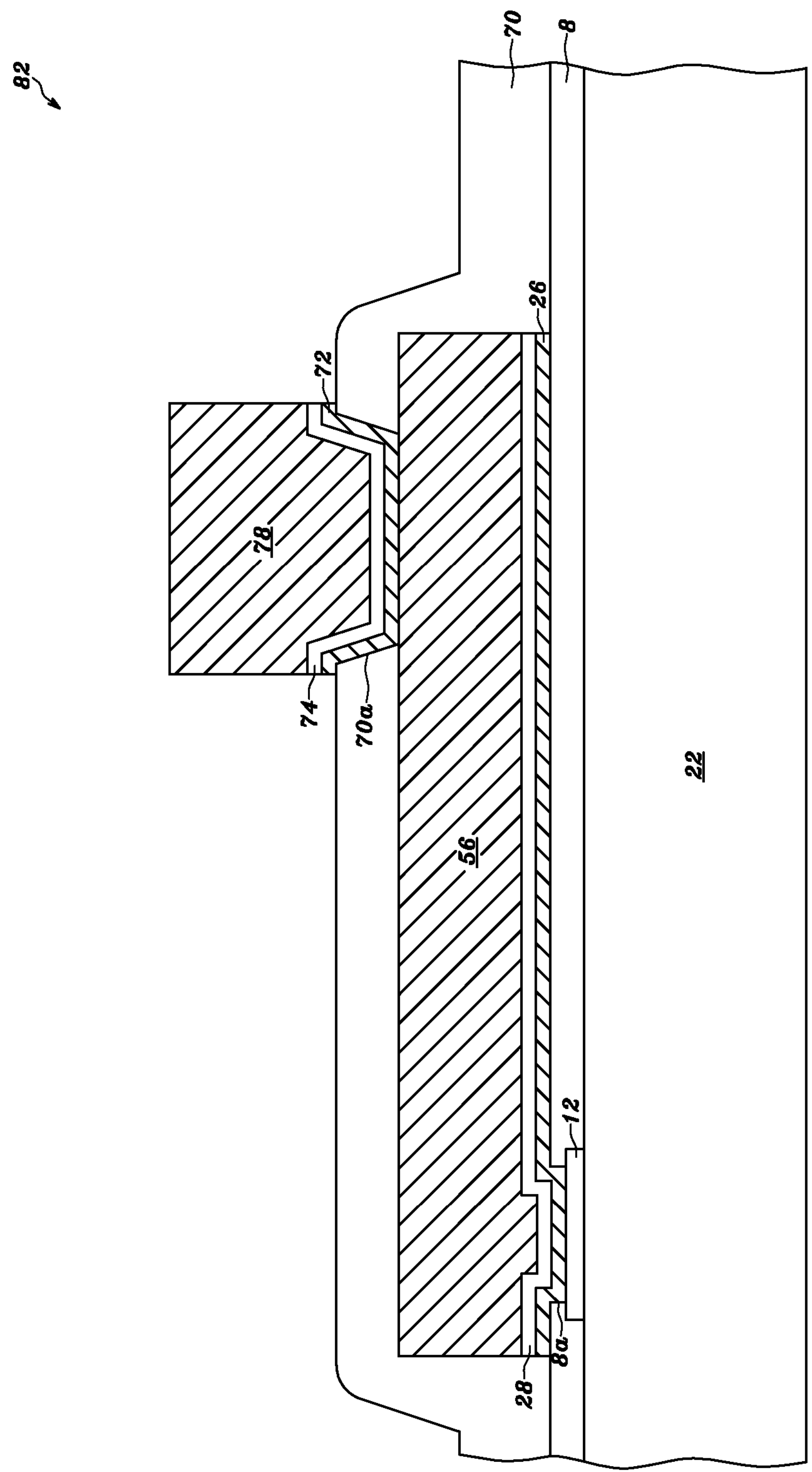

After the above-mentioned processes have been completed, the semiconductor substrate 2 can be diced into a plurality of individual semiconductor chips. Referring to FIG. 5H, in the present invention, the step of forming the polymer layer 24 on the passivation layer 8, as shown in FIGS. 2A and 4A or in FIGS. 2A and 4B, can be omitted, that is, the adhesion/barrier layer 26 having a thickness of between 2,000 and 5,000 Å, and preferably between 2,500 and 3,500 Å, can be directly formed on the passivation layer 8 and on the pad 12, and then the seed layer 28 can be sputtered on the adhesion layer 26, followed by the above-mentioned steps as shown in FIGS. 4D-4G and FIGS. 5A-5G The steps of forming the adhesion/barrier layer 26 and the seed layer 28 can be referred to the above description concerning FIG. 4C. After the above-mentioned processes have been completed, the semiconductor substrate 2 can be diced into a plurality of individual semiconductor chips 82.

The gold bump 60 or 78 as shown in the third or fourth embodiment can be bonded with a wire bond, a tape, a gold layer or tin layer of a ceramic substrate or printed circuit board, a gold layer or indium-tin-oxide layer of a glass substrate, or a tin layer or gold layer of a flexible film. The following description is related to packaging the semiconductor chip shown in FIG. 4L. However, the gold bump 78 illustrated in the fourth embodiment also can be applicable to the following packaging. The packaging elements, as below, the gold bump 60 of the third embodiment can be bonded with also may have the gold bump 78 of the fourth embodiment bonded therewith.

Figure 6A:
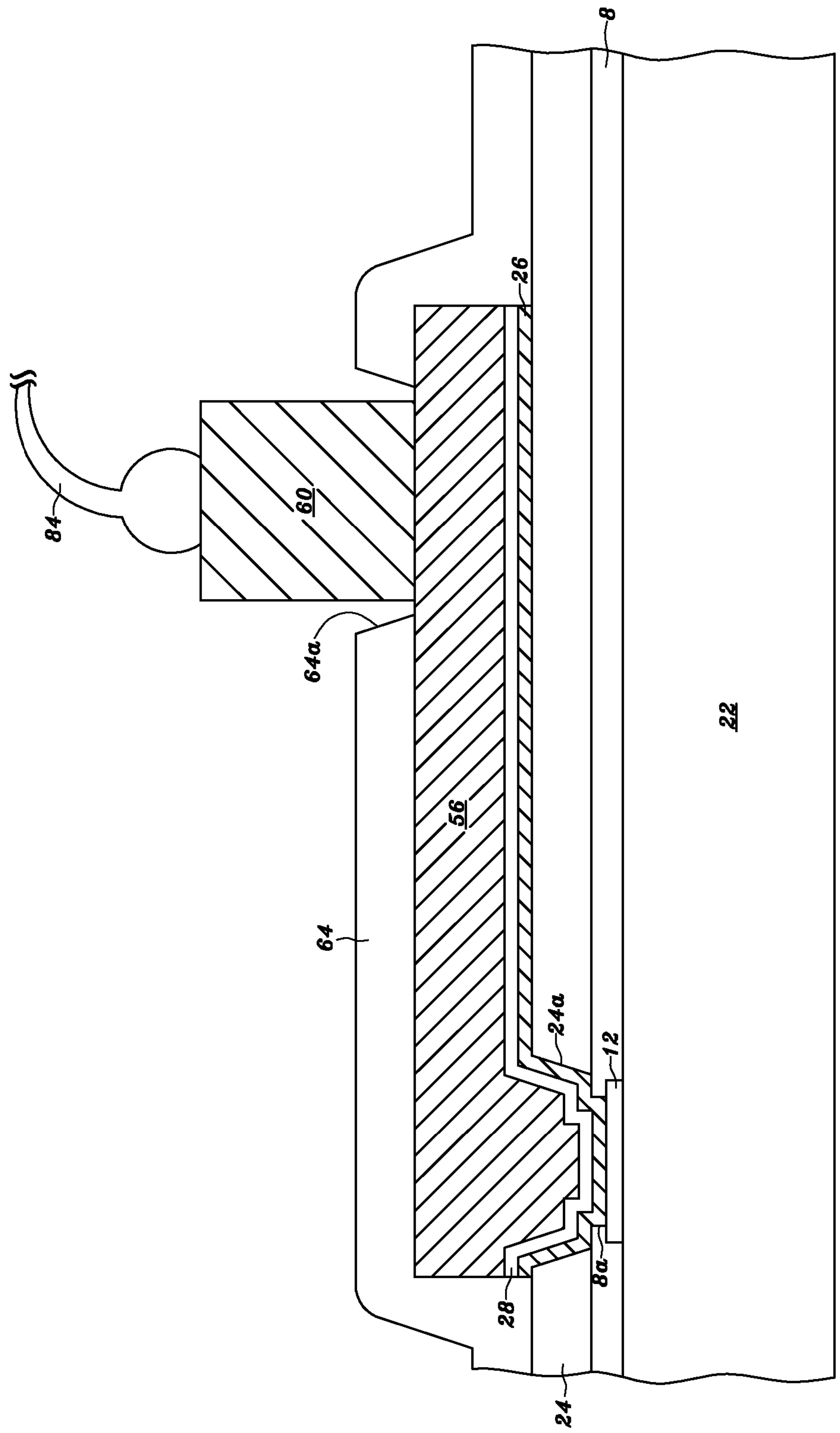
FIGS. 6A through 6E are sectional views showing a process according to one embodiment of the present invention.

Referring to FIG. 6A, a wire 84 is bonded to the gold bump 60 on the gold trace 62 via a wire-bonding process. After the wire-bonding process, the wire 84 is enclosed with a polymeric material, such as epoxy resin, via a molding process.

Figure 6B:
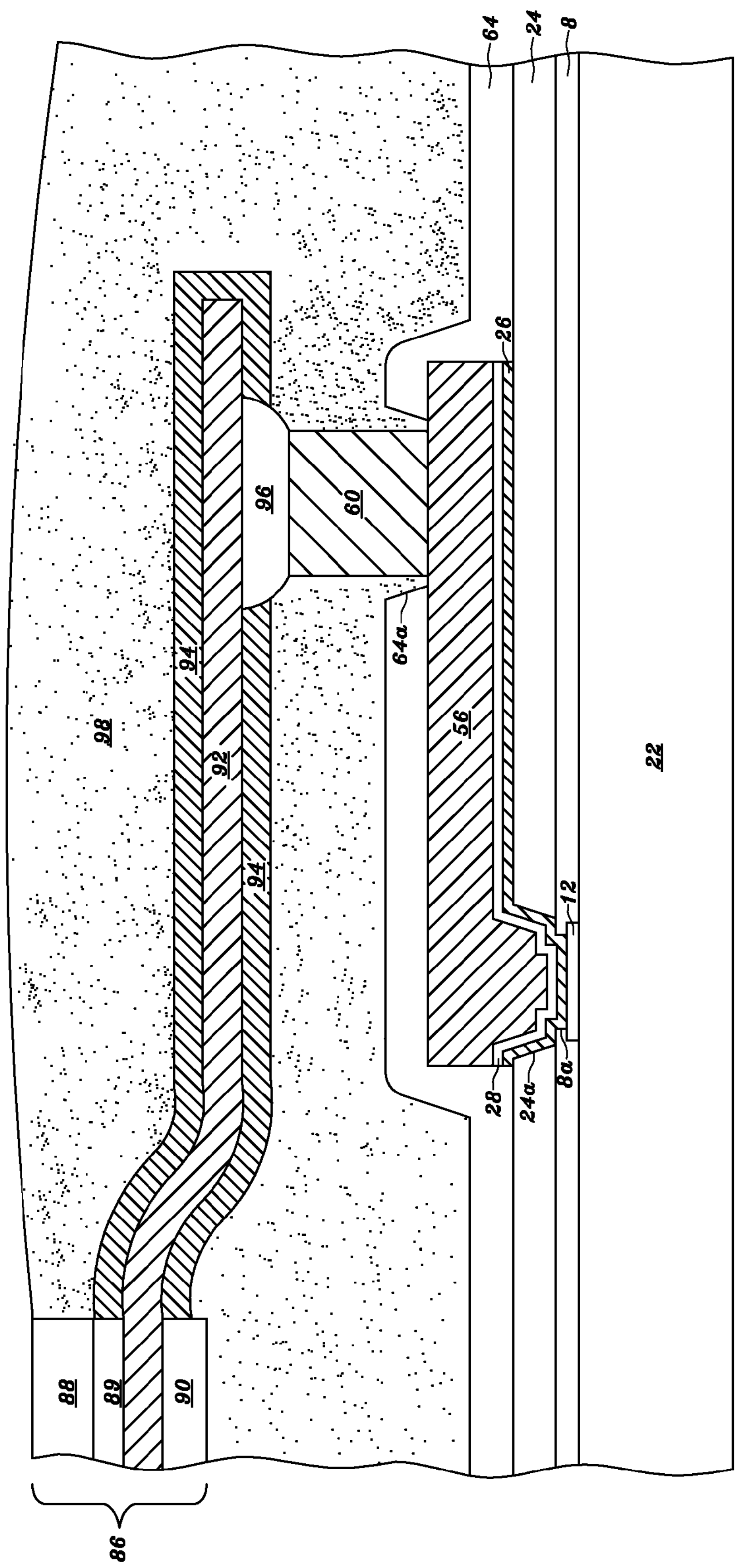

Referring to FIG. 6B, using a TAB (Tape Automated Bonding) technology, a tape 86 may connect the gold bump 60 on the gold trace 62 to an external circuit, such as another semiconductor chip, printed circuit board containing a core with glass fiber and multiple circuit layer over and under the core, glass substrate, flexible film containing a polymer layer, such as polyimide, having a thickness of between 30 and 200 μm and a circuit layer on the polymer layer, or ceramic substrate.

The above-mentioned tape 86 is formed by thermally pressing a copper foil onto an adhesive layer 89 on a first polymer layer 88, such as polyimide, then patterning the copper foil using a photolithography and etching processes to form a patterned copper trace 92, next forming a solder mask 90 on the patterned copper trace 92 by spin-on coating a second polymer layer on the patterned copper trace 92 and on the adhesive layer 89, and then patterning the second polymer layer using a photolithography process to have some portion of the patterned copper trace 92 exposed to be joined with the gold bump 60, or by screen-printing a second polymer layer on part of the patterned copper trace 92 and on the adhesive layer 89, and next electroless plating a tin layer 94 on the exposed patterned copper trace 92 to be joined with the gold bump 60 of the third embodiment or with the gold bump 78 of the fourth embodiment.

Alternatively, the above-mentioned tape 86 is formed by thermally pressing a patterned copper trace 92 on an adhesive layer 89 on a first polymer layer 88, such as polyimide, next screen-printing a solder mask 90 on part of the patterned copper trace 92 and on the adhesive layer 89, having some portion of the patterned copper trace 92 exposed, and next electroless plating a tin layer 94 on the exposed patterned copper trace 92 to be joined with the gold bump 60 of the third embodiment or with the gold bump 78 of the fourth embodiment.

Referring to FIG. 6B, the tape 86 comprises an inner lead containing an inner part of the patterned copper trace 92, and an outer lead containing an outer part of the patterned copper trace 92. The inner lead extends to a central opening in the tape 86, used to be bonded with the gold bump 60 of the third embodiment or to the gold bump 78 of the fourth embodiment. The outer lead extends to a peripheral region of the tape 86, used to be connected to a external element, such as another semiconductor chip, printed circuit board containing a core with glass fiber and multiple circuit layer over and under the core, glass substrate, flexible film containing a polymer layer, such as polyimide, having a thickness of between 30 and 200 μm and a circuit layer on the polymer layer, or ceramic substrate. The inner lead is connected to the outer lead.

Alternatively, instead of the tin layer 94, the inner lead may include a gold layer electroless plated on the inner part of the patterned copper trace 92 to connect the inner lead of the tape 86 to the gold bump 60 or 78 of the third or fourth embodiment.

When the tin layer 94 is formed on the inner part of the copper trace 92, the inner lead of the tape 86 may be bonded to the gold bump 60 or 78 of the third or fourth embodiment using a thermal pressing process. In the thermal pressing process, a tin-gold alloy 96 is formed between the gold bump 60 or 78 of the third or fourth embodiment and the inner part of the copper trace 92.

When, instead of the tin layer 94, a gold layer is formed on the inner part of the copper trace 92, the inner lead of the tape 86 may be bonded to the gold bump 60 or 78 of the third or fourth embodiment using a thermal pressing process. In the thermal pressing process, the gold layer on the inner part of the copper trace 92 is bonded to the gold bump 60 or 78 of the third or fourth embodiment via a gold-to-gold eutectic bonding.

Further, after the process of bonding the tape 86 to the gold bump 60 or 78 of the third or fourth embodiment, a polymeric material 98, such as polyimide, is formed to enclose the inner leads of the tape 86 and the gold bump 60 or 78 of the third or fourth embodiment.

In one embodiment, a side of the outer leads of the tape 86 may be connected to a glass substrate via ACF (Anisotropic Conductive Film) or ACP (Anisotropic Conductive Paste). The other side of the outer leads of the tape 86 may be connected to a printed circuit board via the tin-to-gold bonding, tin-to-tin bonding or gold-to-gold bonding using a thermal press process. Alternatively, a side of the outer leads of the tape 86 is connected to a glass substrate via ACF or ACP, and the other part of the outer leads of the tape 86 is also connected to a printed circuit board via ACF or ACP.

Figure 6C:
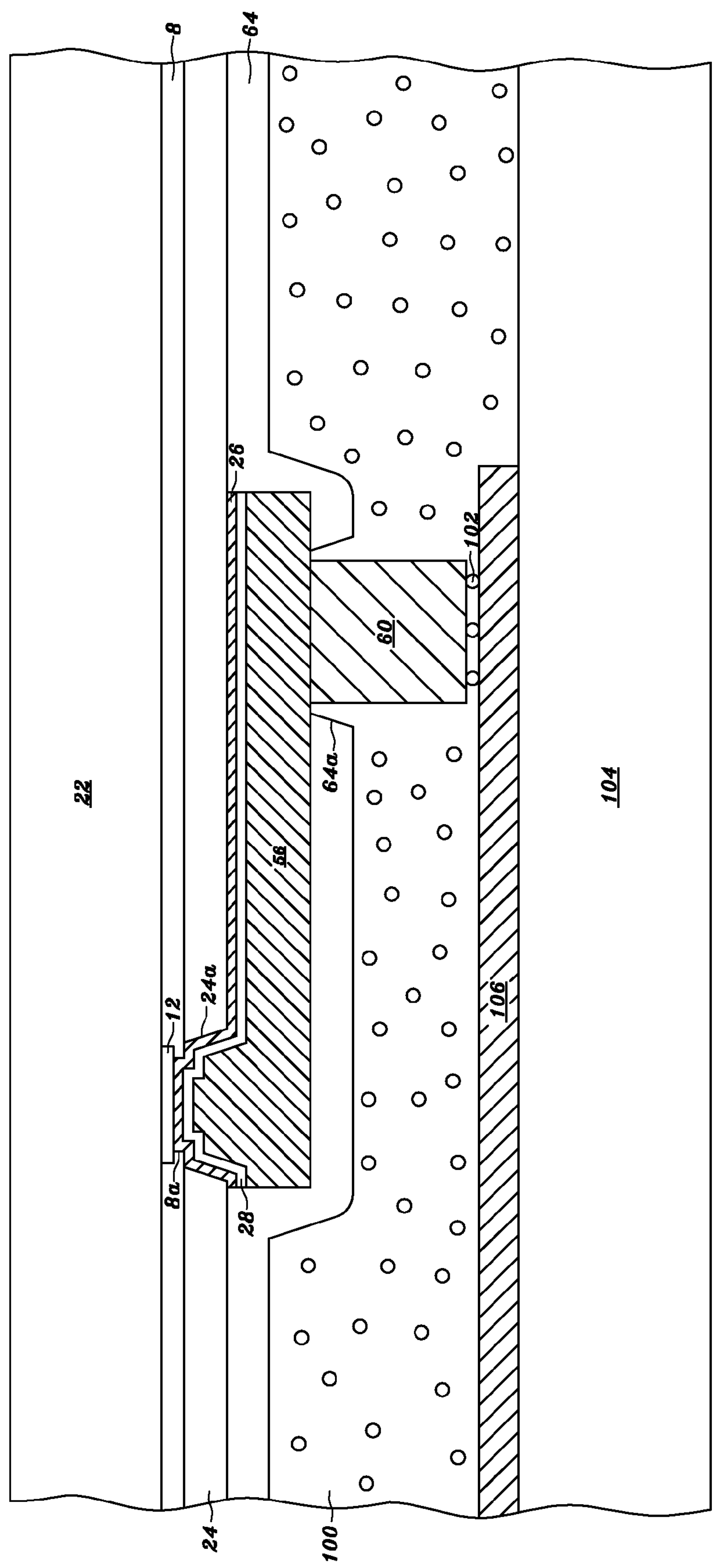

Alternatively, referring to FIG. 6C, via a thermal pressing process, the gold bump 60 or 78 of the third or fourth embodiment is pressed into ACF/ACP 100. Thus, metal particles 102 inside ACF/ACP 100 clusters between the gold bump 60 or 78 of the third or fourth embodiment and a wire 106, including indium tin oxide (ITO), of a glass substrate 104, leading the gold bump 60 or 78 of the third or fourth embodiment to be electrically coupled to the wire 106 of the glass substrate 104. Alternatively, the gold bump 60 or 78 of the third or fourth embodiment may be electrically connected to a ceramic board or an organic substrate using ACF/ACP, as mentioned above.

Figure 6D:
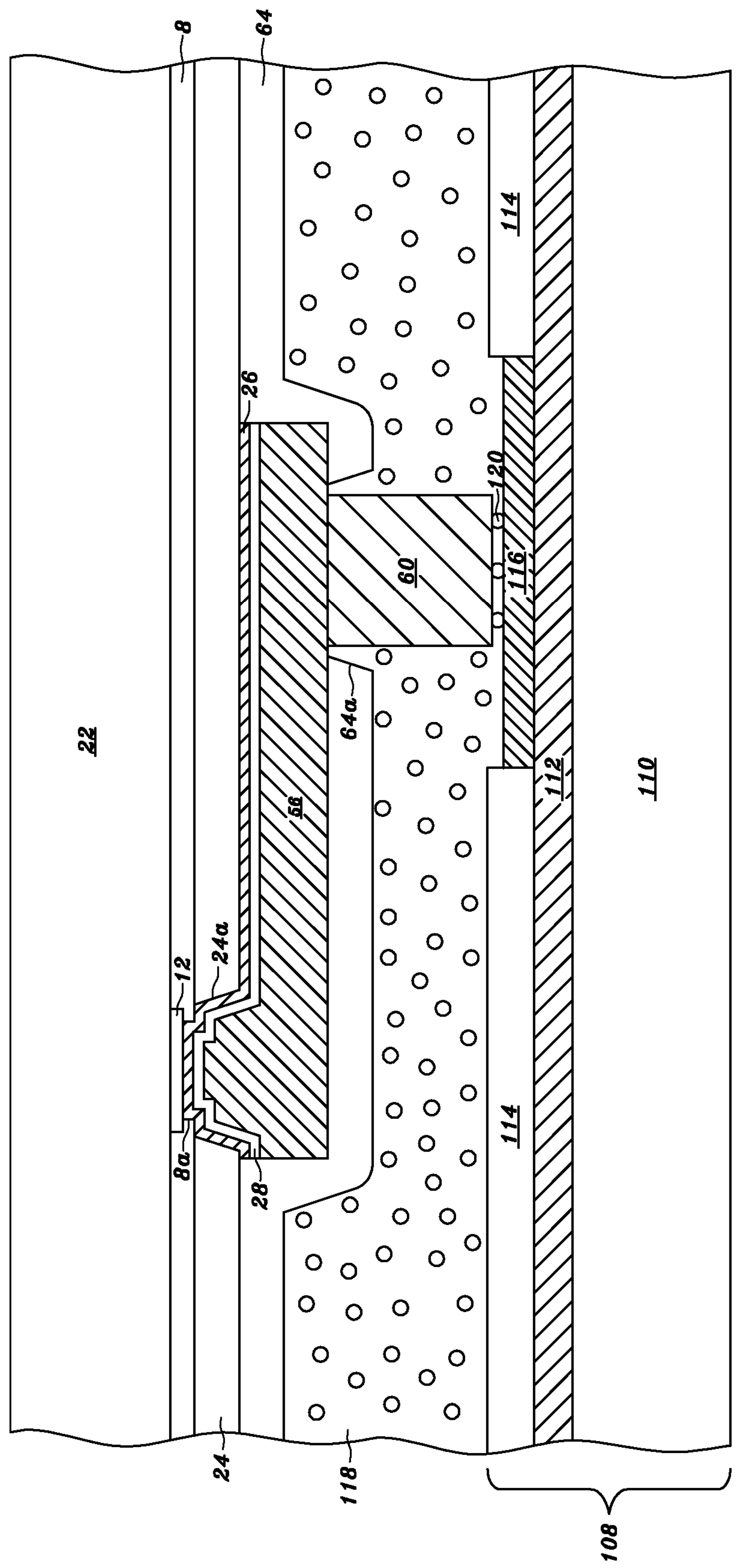

Alternatively, referring to FIG. 6D, using a thermal-press process, the gold bump 60 or 78 of the third or fourth embodiment is bonded to a flexible film 108. The flexible film 108 comprises a polymer layer 110, a copper trace 112 on the polymer layer 110, a solder mask 114 on the copper trace 112 and on the polymer layer 110, and a gold layer 116 on the copper trace 112 exposed by an opening in the solder mask 114. In a thermal pressing process, the gold bump 60 or 78 of the third or fourth embodiment is pressed into ACF/ACP 118 preformed on the flexible film 108. Thus, metallic particles 120 inside ACF/ACP 118 cluster between the gold bump 60 of the third or fourth embodiment and the gold layer 116 on the copper trace 112, leading the gold bump 60 or 78 of the third or fourth embodiment to be electrically coupled to the gold layer 116 of the flexible film 108.

Figure 6E:
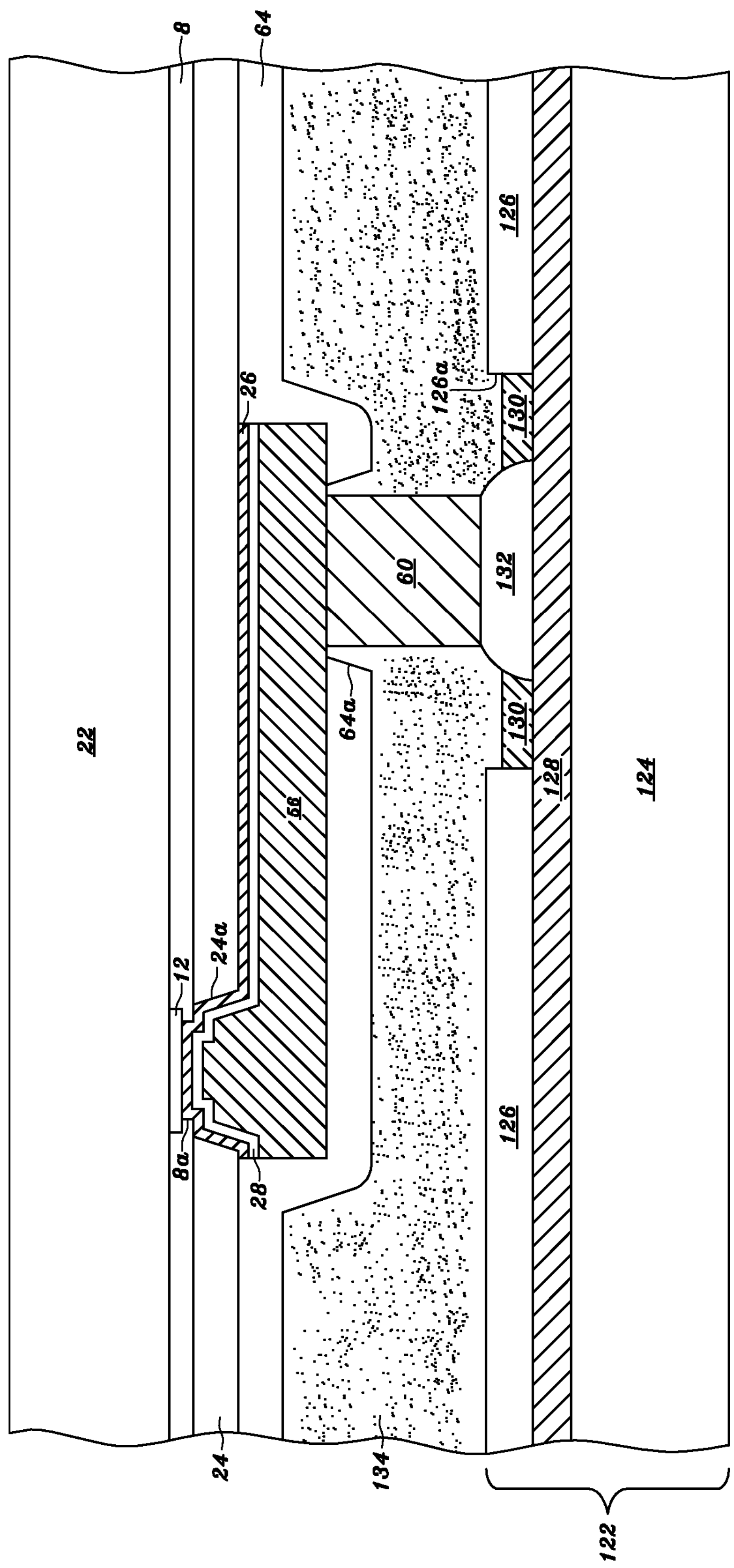

Alternatively, referring to FIG. 6E, via the TAB technology, the gold bump 60 or 78 of the third or fourth embodiment is bonded to a flexible film 122, and the flexible film 112 is further connected to an external circuit, such as another semiconductor chip, printed circuit board, glass substrate, another flexible film, or ceramic substrate, wherein the printed circuit board containing a core with glass fiber and multiple circuit layer over and under the core, and the flexible film containing a polymer layer, such as polyimide, having a thickness of between 30 and 200 μm and a circuit layer on the polymer layer.

In the process of fabricating a metal trace 128 of the flexible film 122, a metal layer, such as a layer of nickel, titanium, chromium or a titanium-tungsten alloy, is sputtered on a polymer layer 124. Next, a seed layer, such as a copper layer, is sputtered on the metal layer. Next, a photoresist layer is formed on the seed layer and an opening in the photoresist layer exposes the seed layer. Next, a copper layer is electroplated on the seed layer exposed by the opening in the photoresist layer. Next, the photoresist layer is removed, and then the seed layer and the metal layer not under the electroplated copper layer are also removed.

After the metal trace 128 is formed on the polymer layer 124, a solder mask 126 is formed on the copper layer of the metal trace 128 and on the polymer layer 124 by screen printing or laminating. An opening 126*a* in the solder mask 126 exposes the copper layer of the metal trace 128. For example, the solder mask 126 may be formed by laminating a polyimide layer having a thickness of between 4 and 60 μm, and preferably of between 6 and 24 μm, on the metal trace 128 and on the polymer layer 124, then removing part of the laminated polyimide layer using laser for forming the opening 126*a* in the laminated polyimide layer exposing the copper layer of the metal trace 128. Alternatively, the laminated polyimide layer may be photosensitive, and the opening 126*a* in the laminated polyimide layer may be formed by a photolithography process.

Next, via an electroless plating method, a tin layer 130 is formed on the copper layer of the metal trace 128 exposed by the opening 126*a*. Therefore, the flexible film 122 comprises an inner lead containing an inner part of the electroplated copper layer of the metal trace 128 and the tin layer 130 or gold layer on the inner part of the electroplated copper layer of the metal trace 128, and an outer lead containing an outer part of the electroplated copper layer of the metal trace 128. The inner lead extends to a central region of the flexible film 122, used to be bonded with the gold bump 60 of the third embodiment or to the gold bump 78 of the fourth embodiment. The outer lead extends to a peripheral region of the flexible film 122, used to be connected to a external element, such as another semiconductor chip, printed circuit board containing a core with glass fiber and multiple circuit layer over and under the core, glass substrate, flexible film containing a polymer layer, such as polyimide, having a thickness of between 30 and 200 μm and a circuit layer on the polymer layer, or ceramic substrate. The inner lead is connected to the outer lead.

Alternatively, instead of the tin layer 130, the inner lead may include a gold layer electroless plated on the inner part of the electroplated copper layer of the metal trace 128 to connect the inner lead of the flexible film 122 to the gold bump 60 or 78 of the third or fourth embodiment.

When the tin layer 130 is formed on the inner part of the electroplated copper layer of the metal trace 128, the inner lead of the metal trace 128 may be bonded to the gold bump 60 or 78 of the third or fourth embodiment using a thermal pressing process. In the thermal pressing process, a tin-gold alloy 132 is formed between the gold bump 60 or 78 of the third or fourth embodiment and the inner part of the electroplated copper layer of the metal trace 128.

When, instead of the tin layer 130, a gold layer is formed on the inner part of the copper layer of the metal trace 128, the inner lead of the flexible film 122 may be bonded to the gold bump 60 or 78 of the third or fourth embodiment using a thermal pressing process. In the thermal pressing process, the gold layer on the inner part of the copper layer of the metal trace 128 is bonded to the gold bump 60 or 78 of the third or fourth embodiment via a gold-to-gold eutectic bonding.

Further, after the process of bonding the flexible film 122 to the gold bump 60 or 78 of the third or fourth embodiment, a polymeric material 134, such as polyimide, is formed to enclose the gold bump 60 or 78 of the third or fourth embodiment.

In one embodiment, a side of the outer leads of the flexible film 122 may be connected to a glass substrate via ACF (Anisotropic Conductive Film) or ACP (Anisotropic Conductive Paste). The other side of the outer leads of the flexible film 122 may be connected to a printed circuit board via the tin-to-gold bonding, tin-to-tin bonding or gold-to-gold bonding using a thermal press process. Alternatively, a side of the outer leads of the flexible film 122 is connected to a glass substrate via ACF or ACP, and the other part of the outer leads of the flexible film 122 is also connected to a printed circuit board via ACF or ACP.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A method for fabricating a chip package, comprising:

providing a first metal pad over a semiconductor substrate, a second metal pad over said semiconductor substrate and a passivation layer over said semiconductor substrate, wherein said passivation layer comprises a nitride layer, wherein a first opening in said passivation layer is over a first contact point of said first metal pad, and said first contact point is at a bottom of said first opening, and wherein a second opening in said passivation layer is over a second contact point of said second metal pad, and said second contact point is at a bottom of said second opening;

forming a metal layer over said passivation layer and on said first and second contact points;

forming a photoresist layer on said metal layer;

forming a third opening in said photoresist layer and vertically over said first and second contact points and said passivation layer, wherein said third opening exposes a region, vertically over said passivation layer and said first and second contact points, of said metal layer, wherein said forming said third opening comprises exposing said photoresist layer using a 1X stepper with at least two of G-line, H-line and I-line;

after said forming said third opening, electroplating a first gold layer over said region, said first and second contact points and said passivation layer with an electroplating solution comprising gold and sulfite ion;

after said electroplating said first gold layer, removing said photoresist layer; and after said removing said photoresist layer, removing said metal layer not under said first gold layer.

2. The method of claim 1 further comprising bonding a wire to a third contact point of said first gold layer using a wire bonding process, wherein said third contact point is connected to said first contact point through said first opening, and said third contact point is connected to said second contact point through said second opening, wherein said third contact point is not vertically over said first contact point and said second contact point.

3. The method of claim 1 further comprising bonding a wire to a third contact point of said first gold layer using a wire bonding process, wherein said third contact point is connected to said first contact point through said first opening, and said third contact point is connected to said second contact point through said second opening.

4. The method of claim 1 further comprising providing at least one metal oxide semiconductor (MOS) device in or over said semiconductor substrate, wherein said semiconductor substrate comprises silicon.

5. The method of claim 1, wherein said nitride layer has a thickness between 0.2 and 1.2 micrometers.

6. The method of claim 1, wherein said forming said metal layer comprises sputtering a titanium-containing layer with a thickness between 2,000 and 5,000 angstroms over said passivation layer and on said first and second contact points.

7. The method of claim 1, wherein said forming said metal layer comprises sputtering a second gold layer over said passivation layer and said first and second contact points.

8. The method of claim 1 further comprising forming a polymer layer on said passivation layer, wherein a fourth opening in said polymer layer is over said first contact point, and wherein a fifth opening in said polymer layer is over said second contact point, followed by said forming said metal layer further on said polymer layer.

9. The method of claim 8, wherein said forming said polymer layer comprises spin-on coating a polyimide layer with a thickness between 2 and 30 micrometers on said passivation layer, and then curing said polyimide layer at a peak temperature within a range from 200 to 290 degrees C.

10. The method of claim 8, wherein said forming said polymer layer comprises spin-on coating a polyimide layer with a thickness between 2 and 30 micrometers on said passivation layer, and then curing said polyimide layer at a peak temperature within a range from 330 to 400 degrees C.

11. The method of claim 8 further comprising said forming said polymer layer using a 1X stepper with at least two of G-line, H-line and I-line.

12. The method of claim 1 further comprising said electroplating said first gold layer with said electroplating solution comprising Na3Au(SO3)2.

13. The method of claim 1 further comprising said electroplating said first gold layer with said electroplating solution comprising (NH4)3[Au(SO3)2].

14. The method of claim 1 further comprising said electroplating said first gold layer with said electroplating solution comprising said gold of between 1 and 20 g per liter.

15. The method of claim 1 further comprising said electroplating said first gold layer with said electroplating solution comprising said gold of between 5 and 15 g per liter.

16. The method of claim 1 further comprising said electroplating said first gold layer with said electroplating solution comprising said sulfite ion of between 10 and 120 g per liter.

17. The method of claim 1 further comprising said electroplating said first gold layer with said electroplating solution comprising said sulfite ion of between 30 and 90 g per liter.

18. The method of claim 1 further comprising said electroplating said first gold layer with said electroplating solution at a temperature between 30 and 70 degrees C.

19. The method of claim 1 further comprising said electroplating said first gold layer with said electroplating solution at a temperature between 45 and 65 degrees C.

20. The method of claim 1 further comprising said electroplating said first gold layer with said electroplating solution at a pH value between 6 and 9.

21. The method of claim 1 further comprising said electroplating said first gold layer with said electroplating solution at a pH value between 7 and 8.5.

22. The method of claim 1 further comprising said electroplating said first gold layer at a current density between 1 and 10 mA/cm2.

23. The method of claim 1 further comprising said electroplating said first gold layer at a current density between 4 and 6 mA/cm2.

24. The method of claim 1 further comprising said electroplating said first gold layer to a thickness between 3 and 18 micrometers.

25. The method of claim 1 further comprising said electroplating said first gold layer to a thickness between 3 and 8 micrometers.

26. The method of claim 1, wherein said first metal pad comprises aluminum.

27. The method of claim 1, wherein said first metal pad comprises copper.

28. The method of claim 1, wherein said forming said photoresist layer comprises spin-on coating a positive-type photoresist layer with a thickness between 5 and 30 micrometers on said metal layer.

29. The method of claim 1, wherein said forming said photoresist layer comprises spin-on coating a positive-type photoresist layer with a thickness between 7 and 15 micrometers on said metal layer.

30. The method of claim 1, after said removing said metal layer not under said first gold layer, further comprising forming a polymer layer on said first gold layer, wherein a fourth opening in said polymer layer is over a third contact point of said first gold layer, and said third contact point is at a bottom of said third opening, wherein said third contact point is connected to said first contact point through said first opening, and said third contact point is connected to said second contact point through said second opening.

31. The method of claim 30, wherein said forming said polymer layer comprises spin-on coating a polyimide layer with a thickness between 2 and 30 micrometers on said first gold layer, and then curing said polyimide layer at a peak temperature between 200 and 290 degrees C.

32. The method of claim 30, wherein said forming said polymer layer comprises spin-on coating a polyimide layer with a thickness between 2 and 30 micrometers on said first gold layer, and then curing said polyimide layer at a peak temperature between 330 and 400 degrees C.

33. The method of claim 30 further comprising said forming said polymer layer using a 1X stepper with at least two of G-line, H-line and I-line.

* * * * *